(12) United States Patent
Inuzuka et al.

(10) Patent No.: US 10,510,409 B2
(45) Date of Patent: Dec. 17, 2019

(54) SEMICONDUCTOR MEMORY DEVICE

(71) Applicant: TOSHIBA MEMORY CORPORATION, Minato-ku, Tokyo (JP)

(72) Inventors: Yuki Inuzuka, Yokohama Kanagawa (JP); Yoshinori Suzuki, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/128,446

(22) Filed: Sep. 11, 2018

(65) Prior Publication Data

US 2019/0295640 A1    Sep. 26, 2019

(30) Foreign Application Priority Data

Mar. 22, 2018    (JP) .................................. 2018-054722

(51) Int. Cl.
*G11C 13/00*    (2006.01)
(52) U.S. Cl.
CPC .......... *G11C 13/004* (2013.01); *G11C 13/003* (2013.01); *G11C 13/0004* (2013.01); *G11C 13/0026* (2013.01); *G11C 13/0002* (2013.01)

(58) Field of Classification Search
None
See application file for complete search history.

(56) References Cited

U.S. PATENT DOCUMENTS

| 6,885,580 B2 * | 4/2005 | Baker ...................... G11C 7/06 |
| | | 365/148 |
| 9,142,271 B1 | 9/2015 | Srinivasan et al. |
| 2014/0355329 A1 * | 12/2014 | Kitagawa ........... G11C 13/0069 |
| | | 365/148 |
| 2017/0309330 A1 * | 10/2017 | Pyo ..................... G11C 11/1655 |

* cited by examiner

*Primary Examiner* — Tan T. Nguyen
(74) *Attorney, Agent, or Firm* — Foley & Lardner LLP

(57) ABSTRACT

According to one embodiment, a semiconductor memory device, includes a resistance change type memory cell; a first charge section into which a charge based on a current flowing in the memory cell is charged; a second charge section coupled to the first charge section via a switch element; a sense amplifier configured to determine data stored in the memory cell based on the charge charged into the second charge section; and a control circuit configured to control the first charge section, the second charge section, and the sense amplifier.

17 Claims, 50 Drawing Sheets

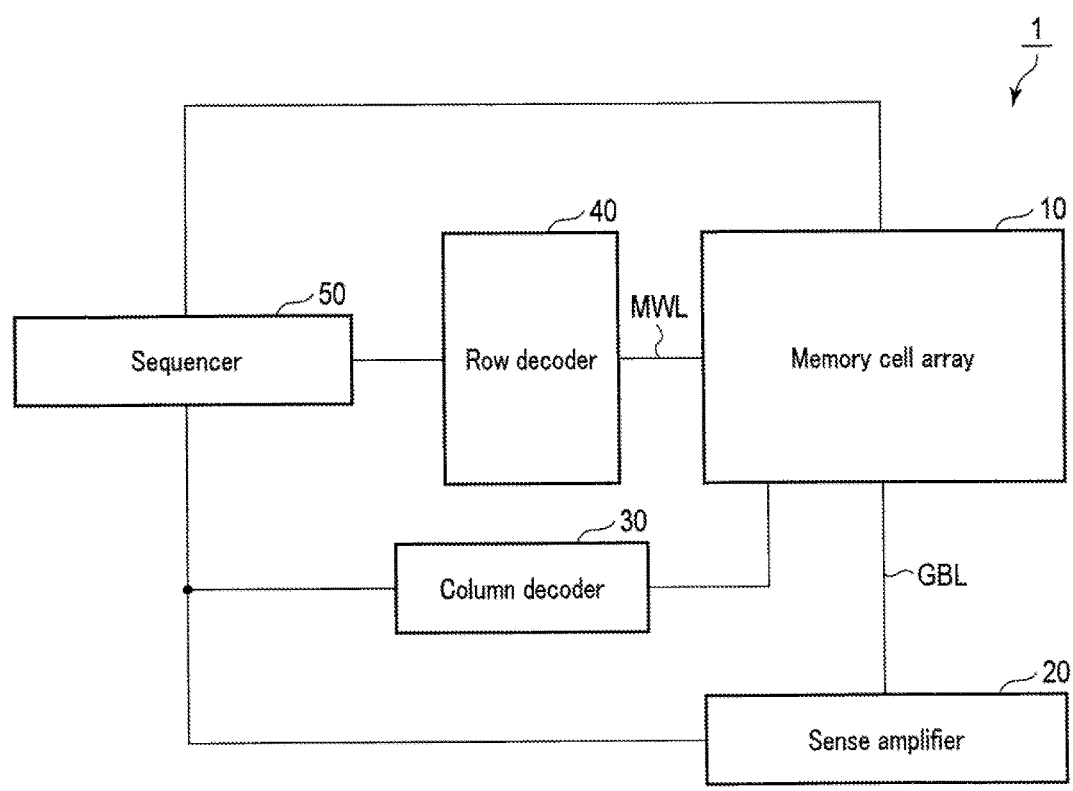
F I G. 1

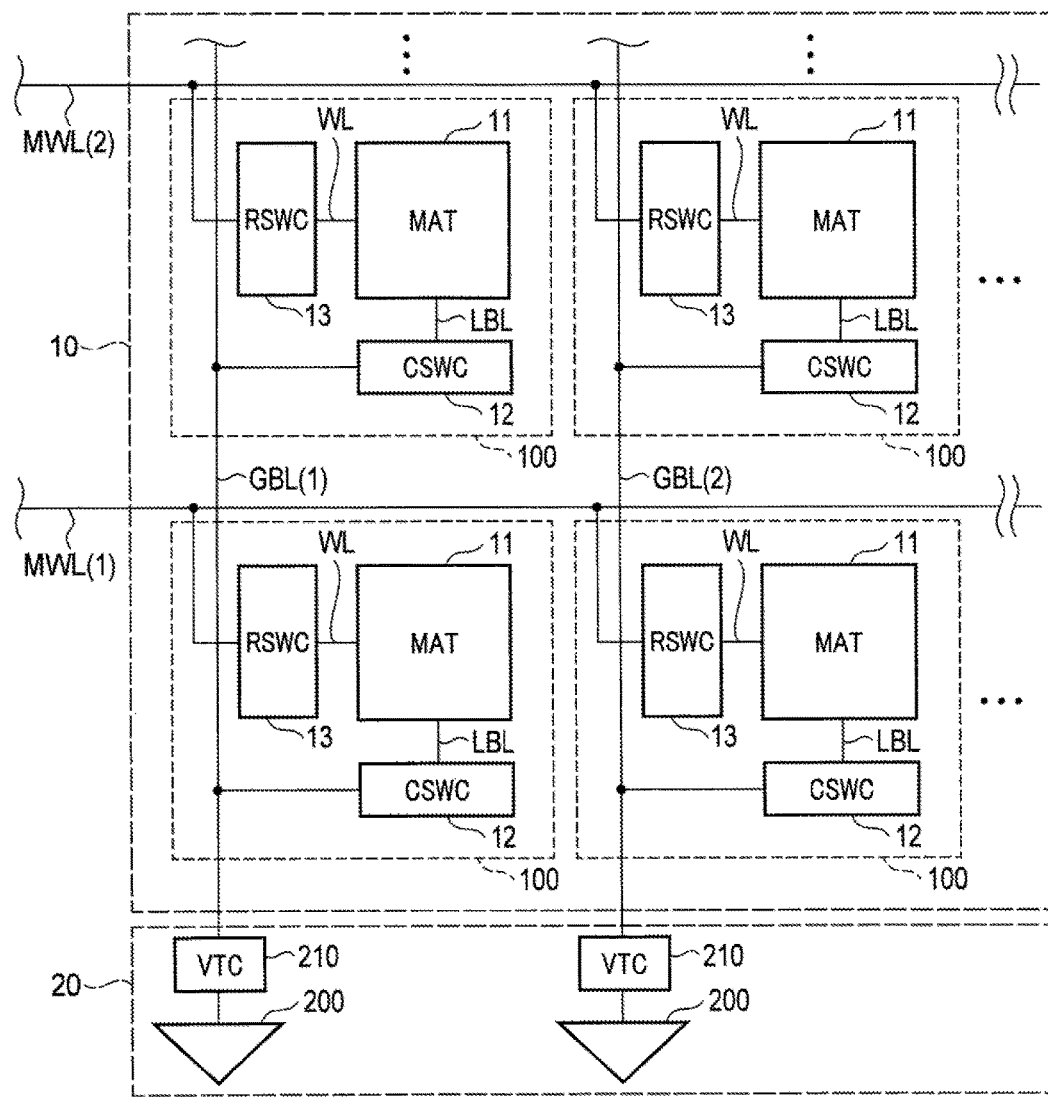
F I G. 2

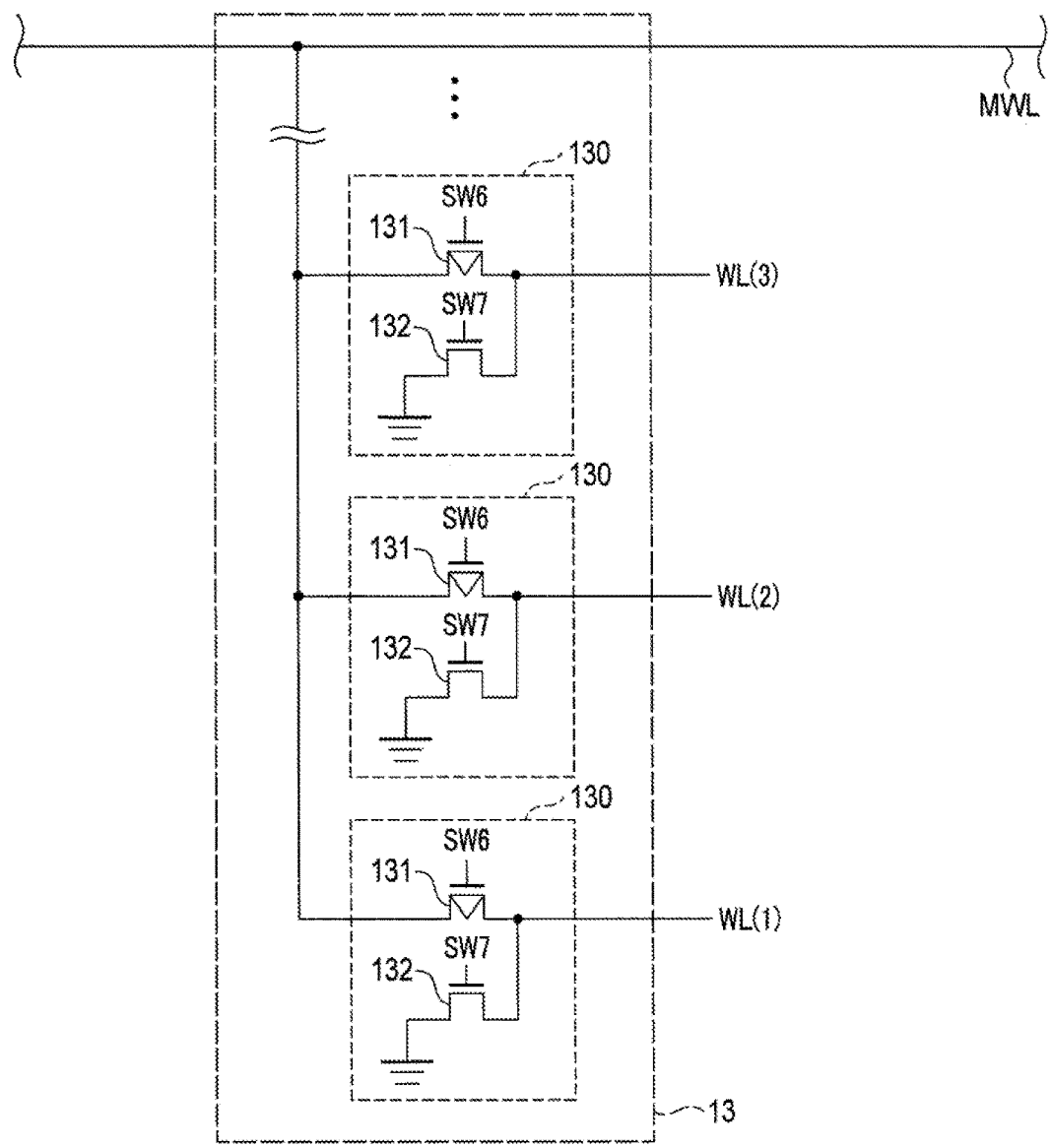
F I G. 4

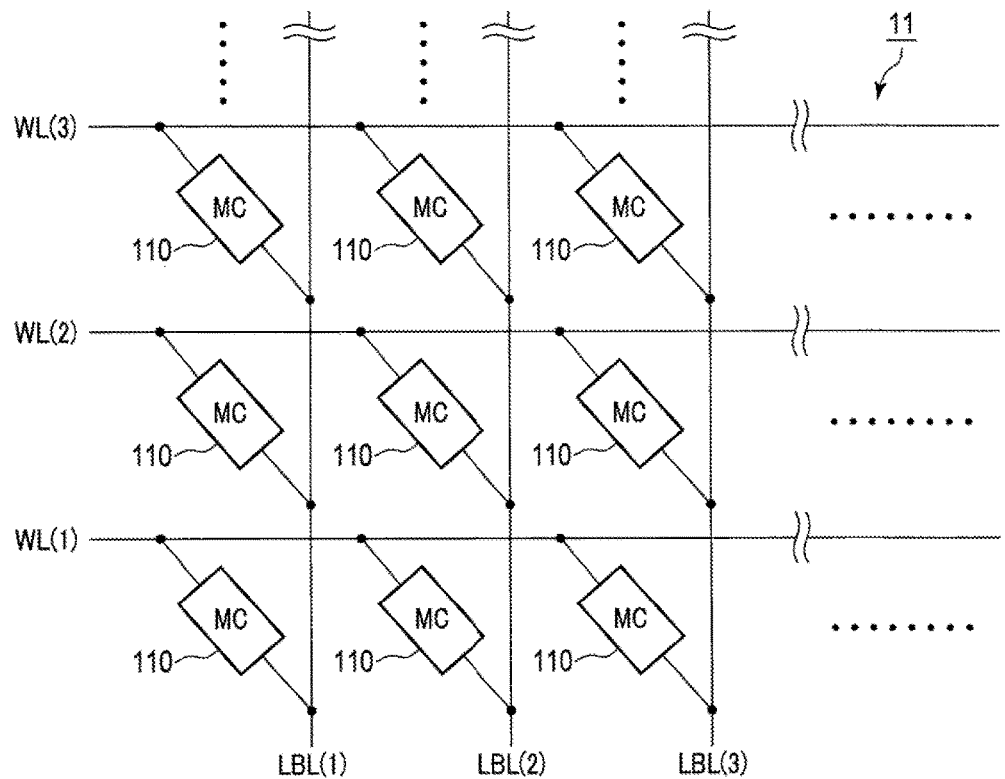
F I G. 5
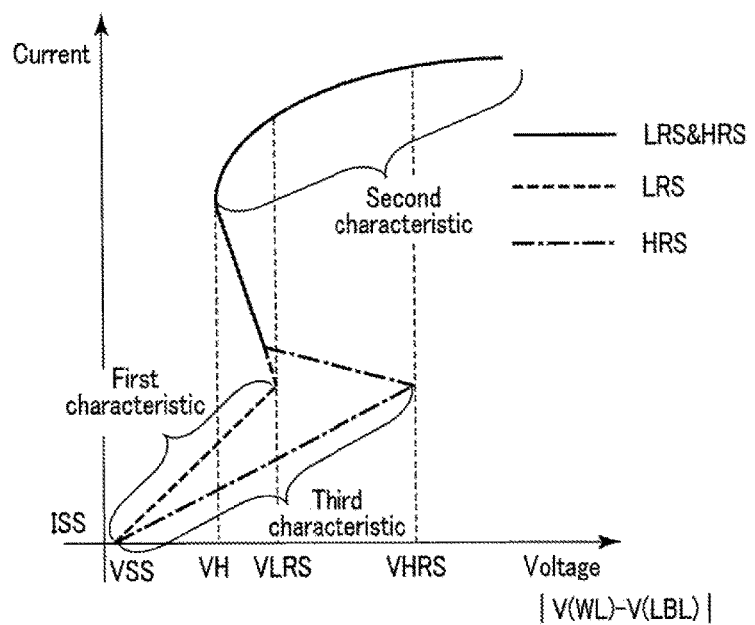
F I G. 6

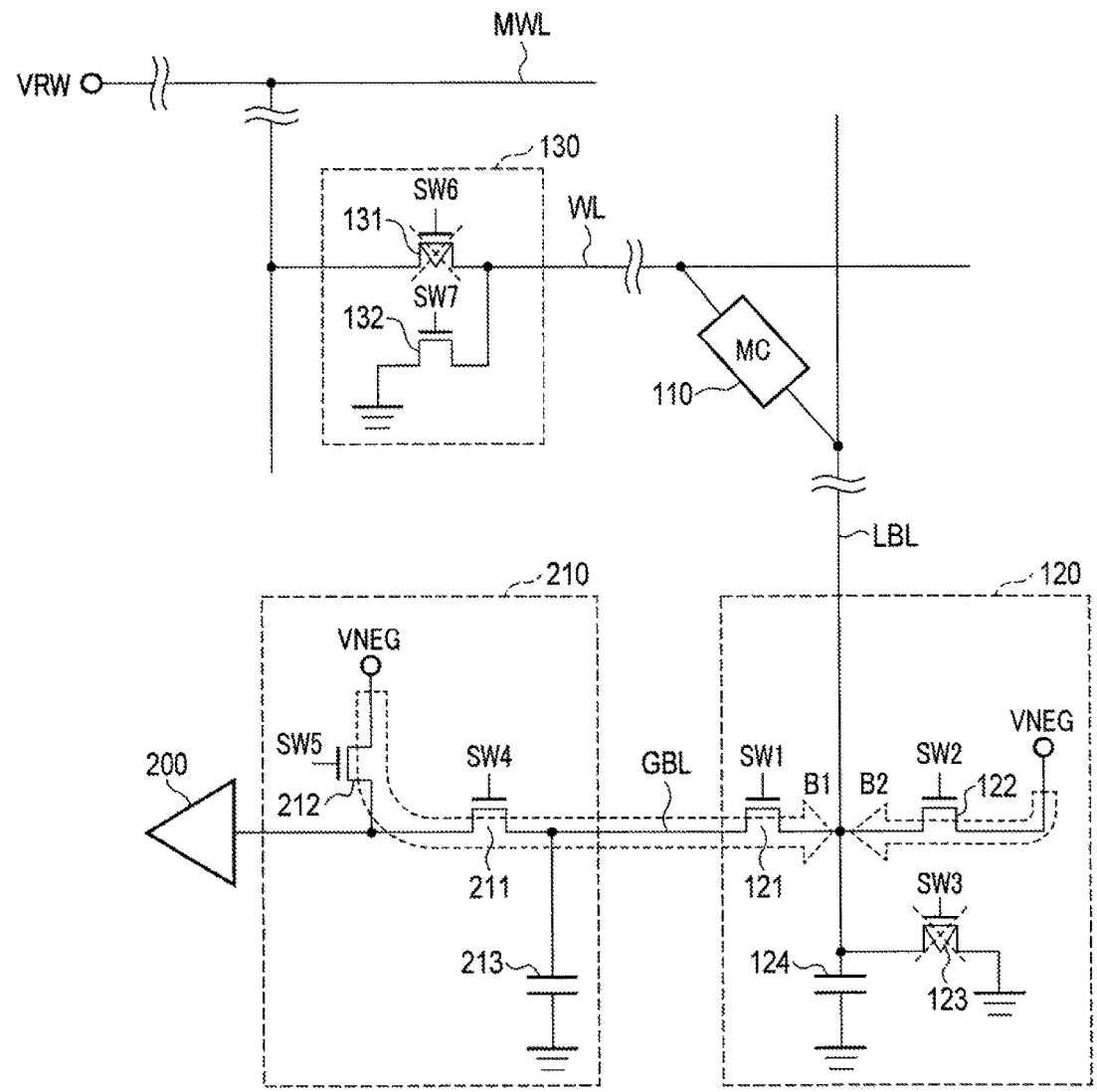
F I G. 13

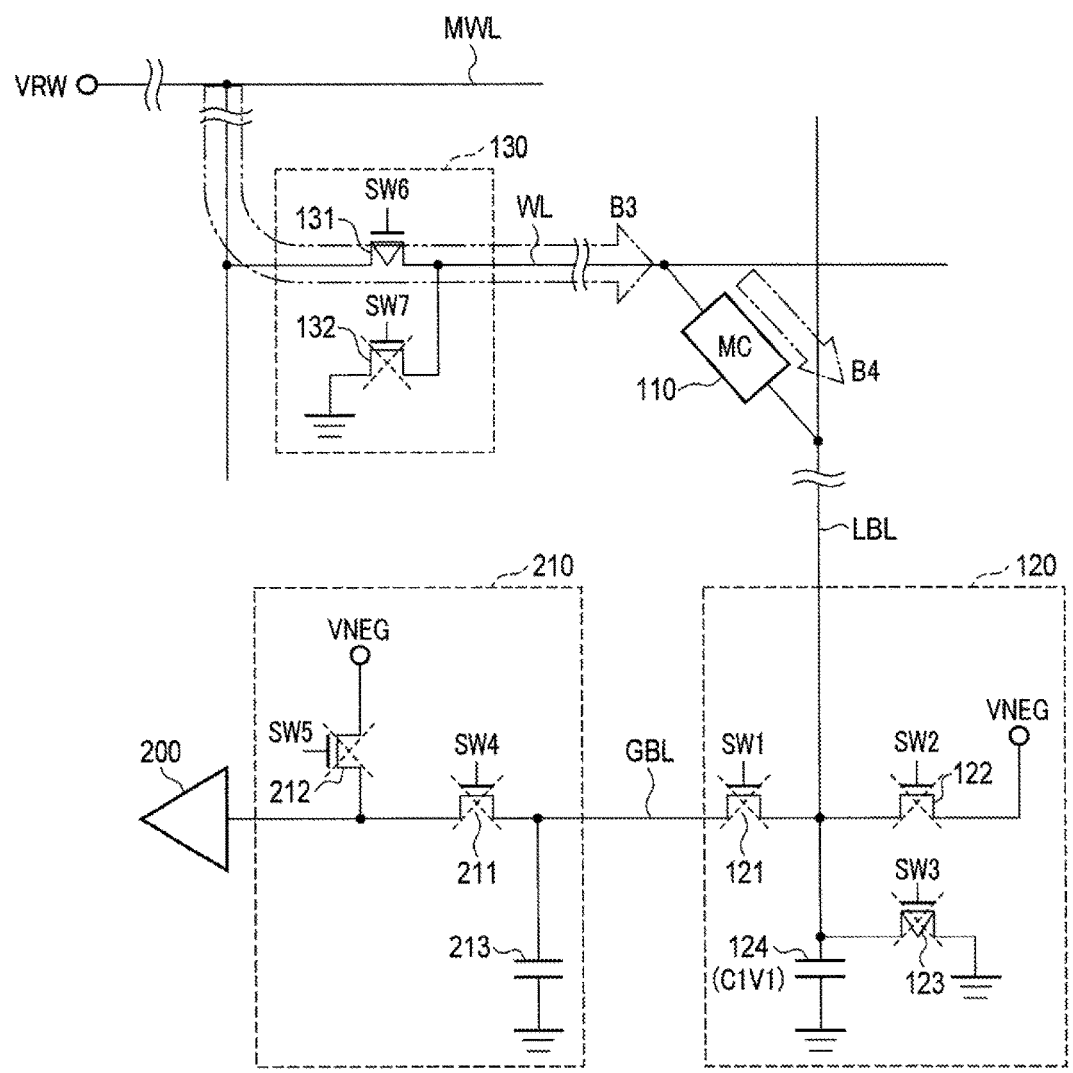
F I G. 14

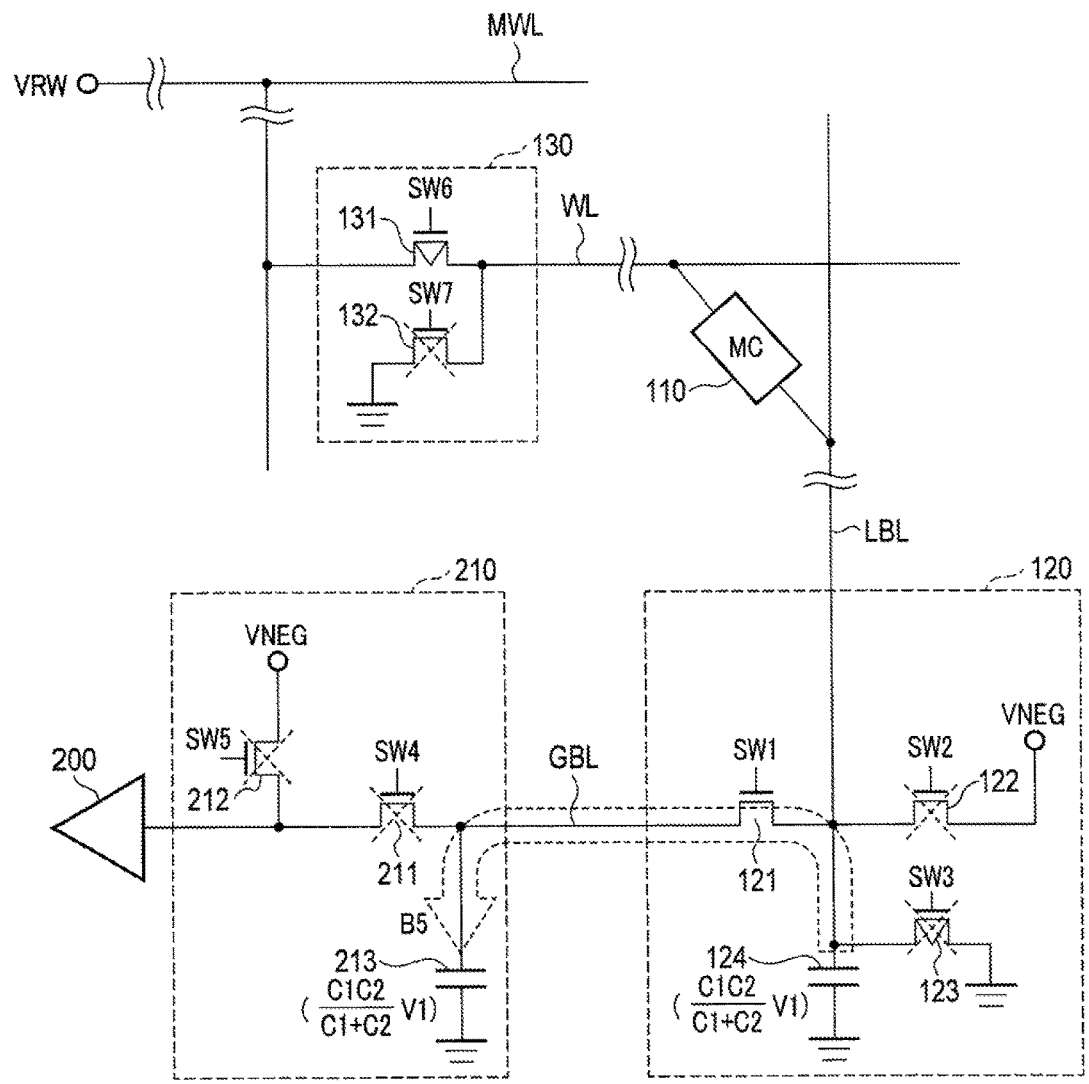
F I G. 17

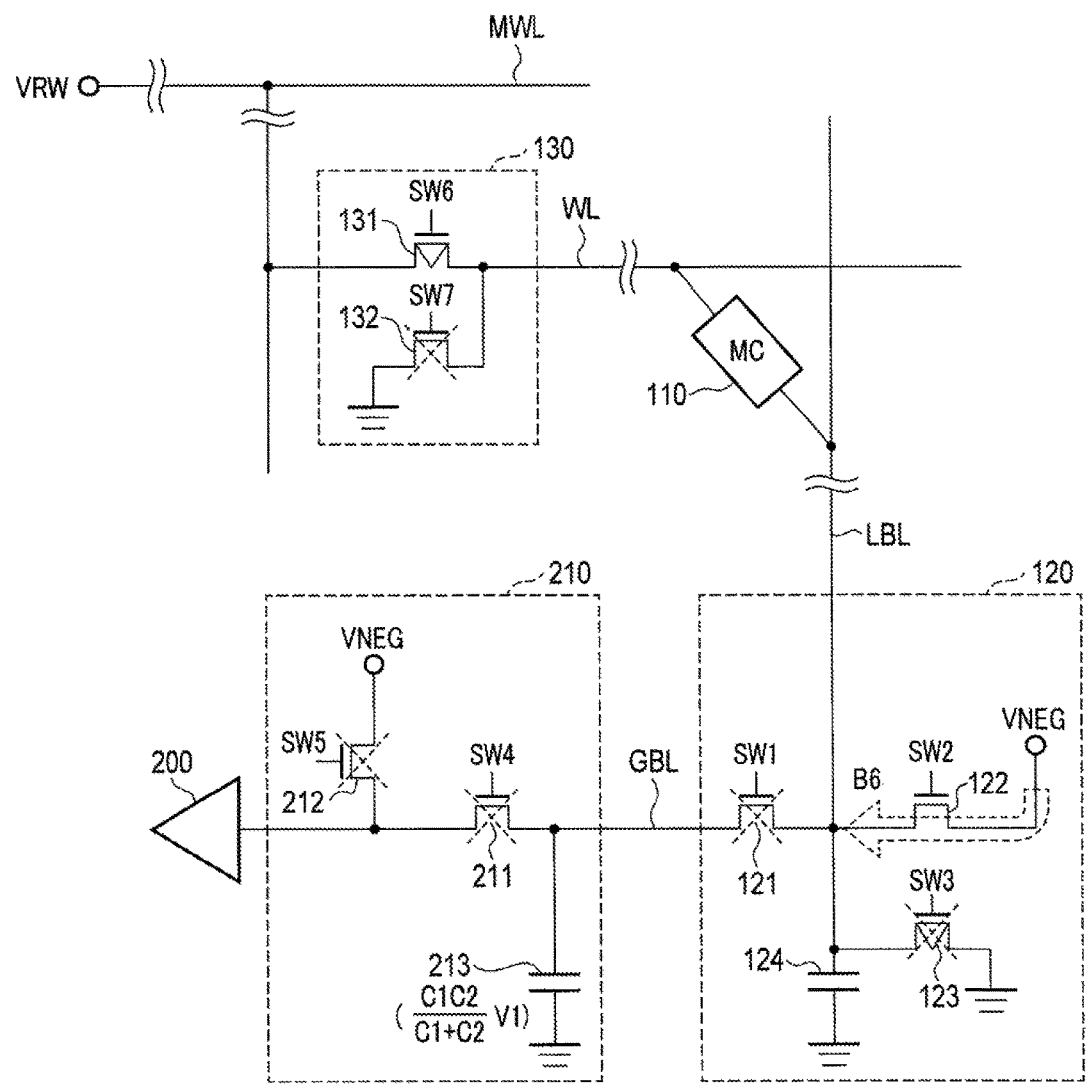
F I G. 18

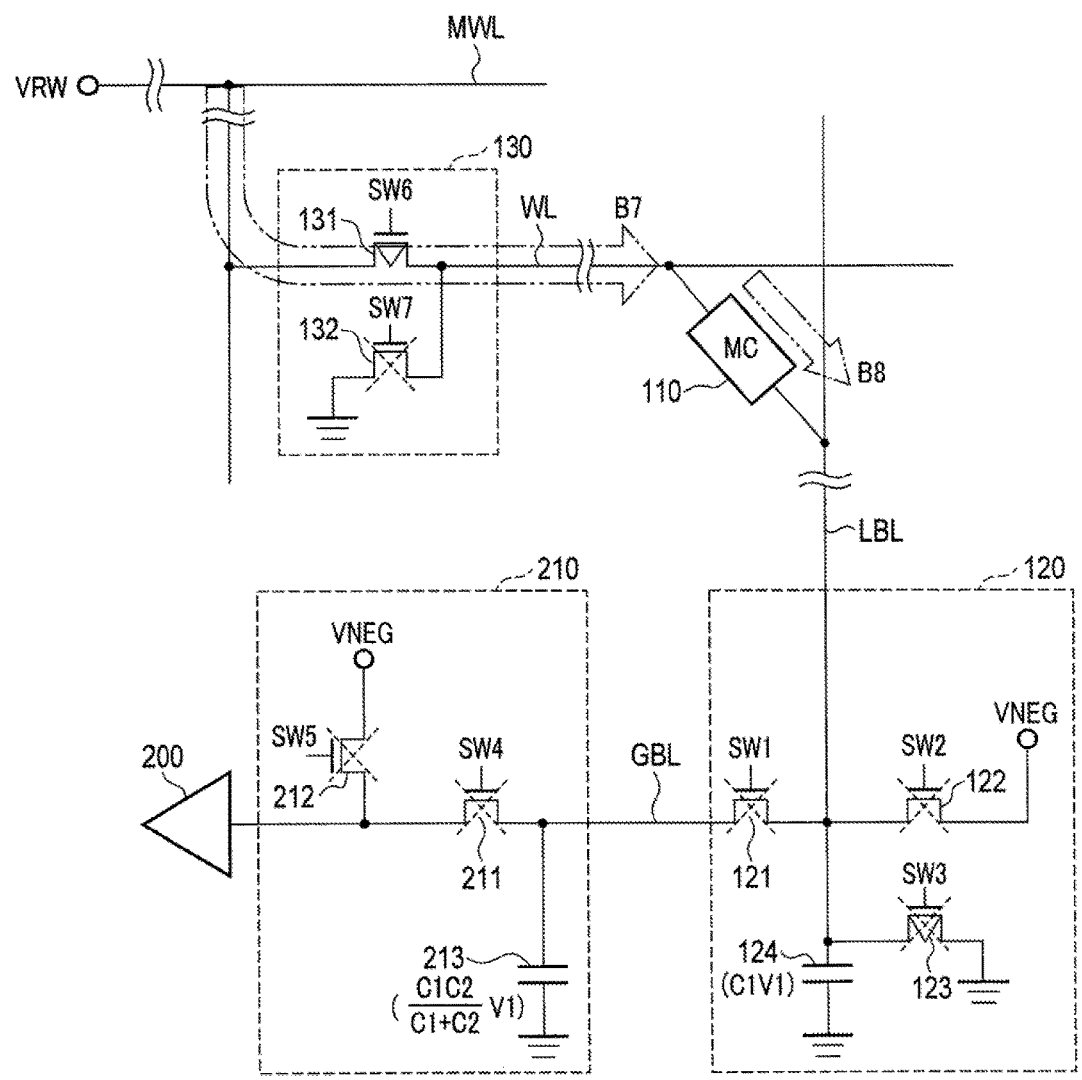
F I G. 19

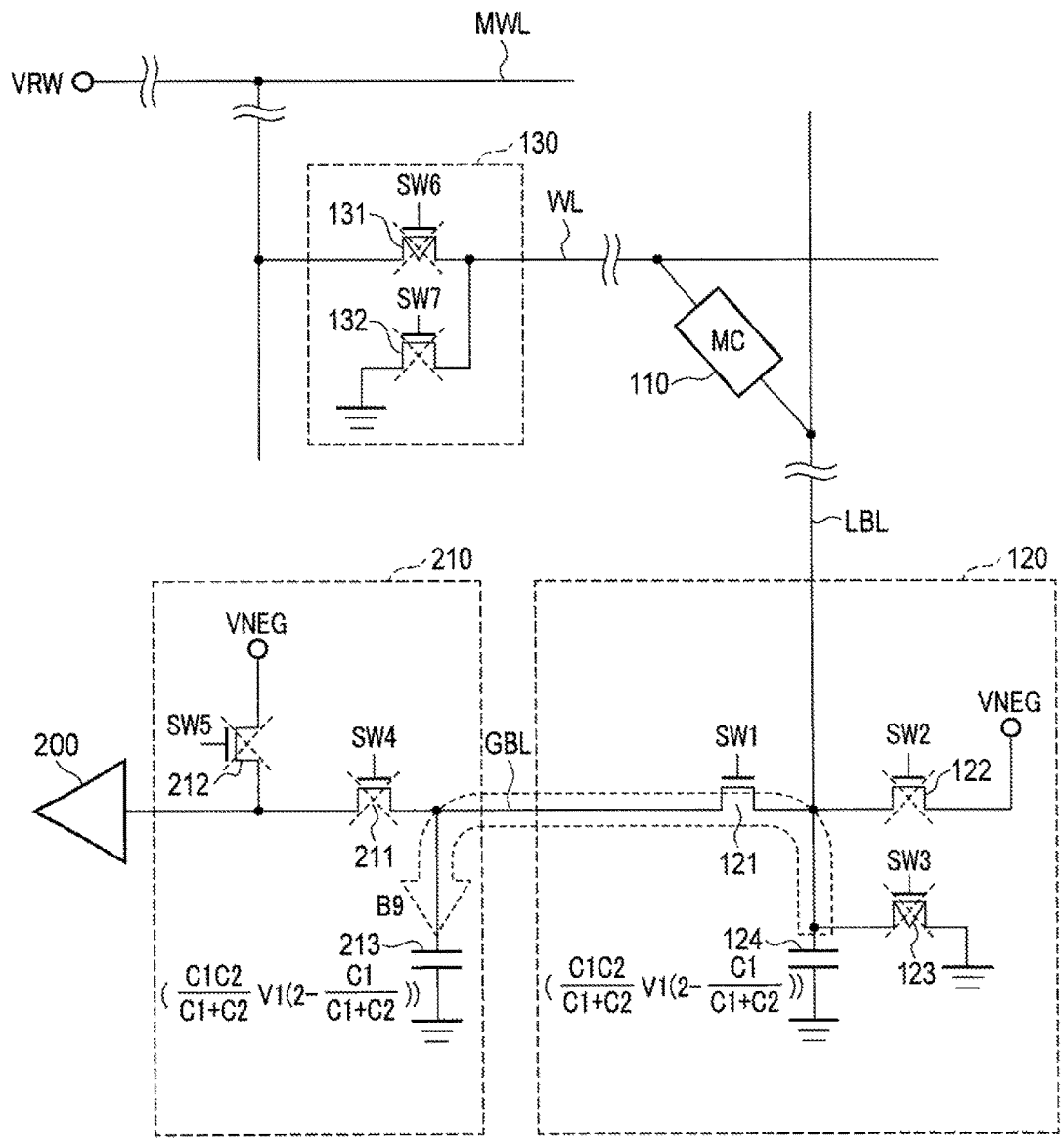
F I G. 20

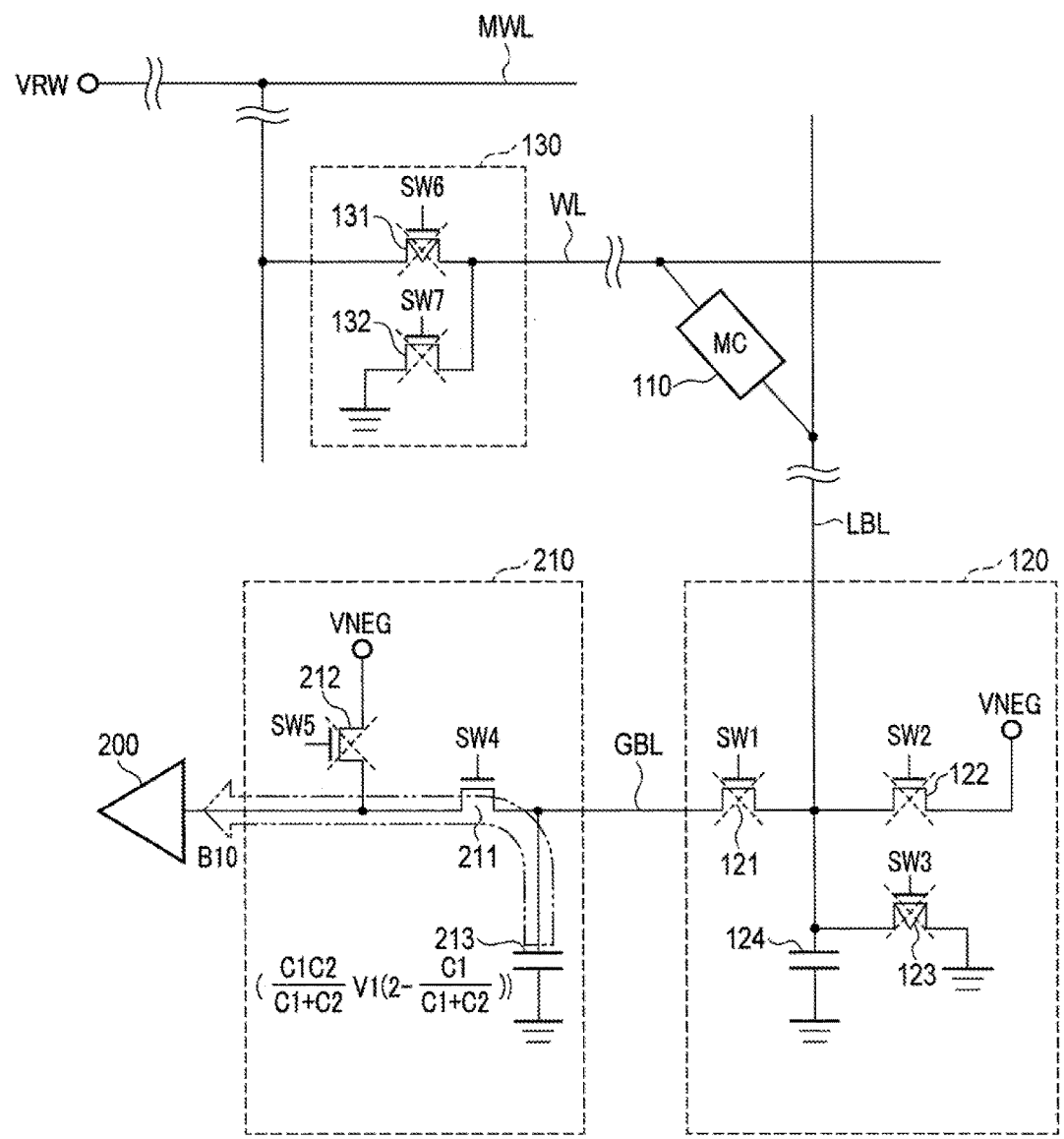
F I G. 21

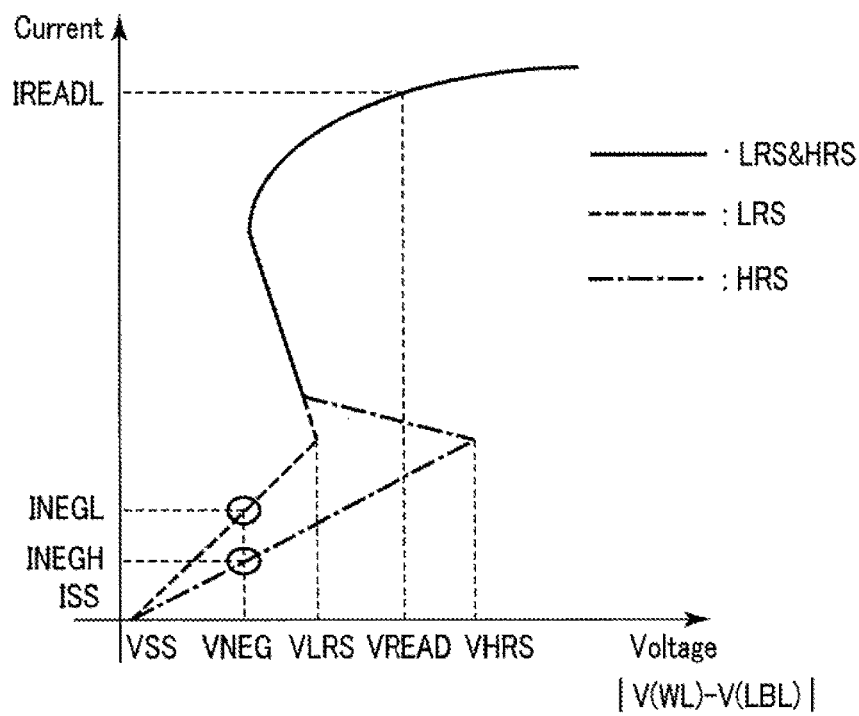
F I G. 22
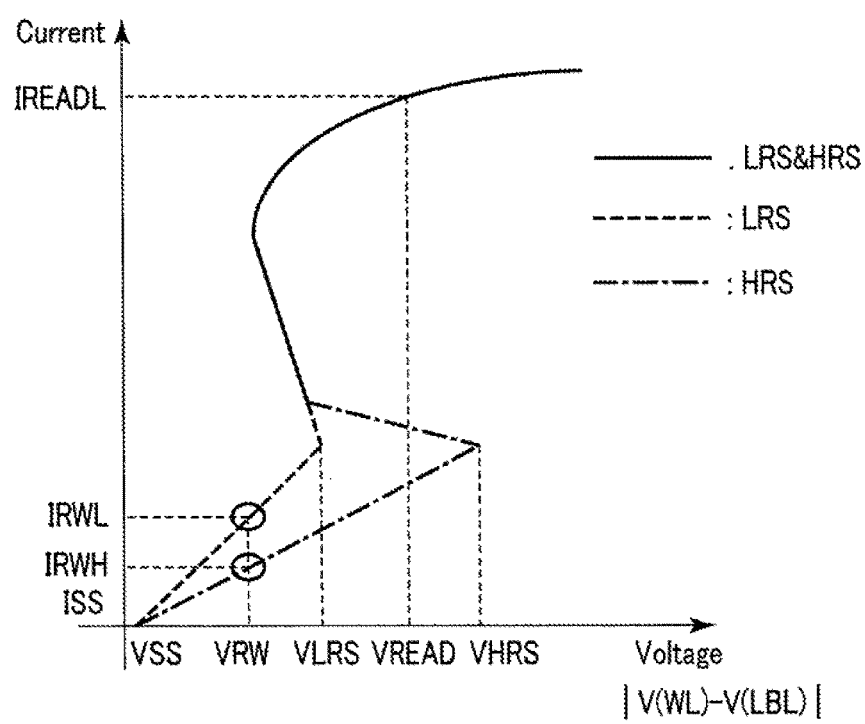
F I G. 23

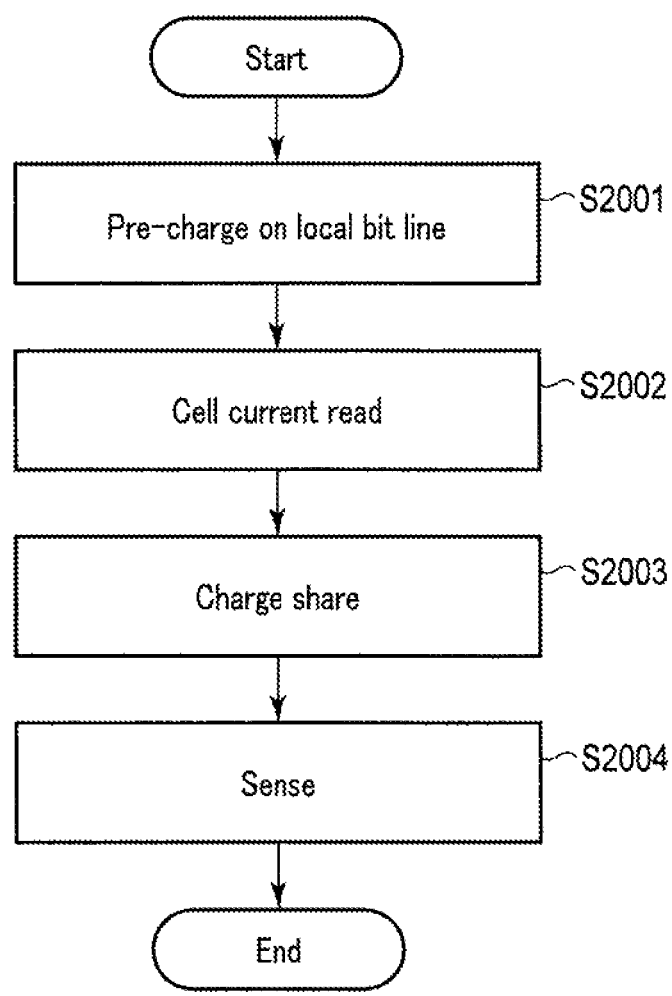
F I G. 24

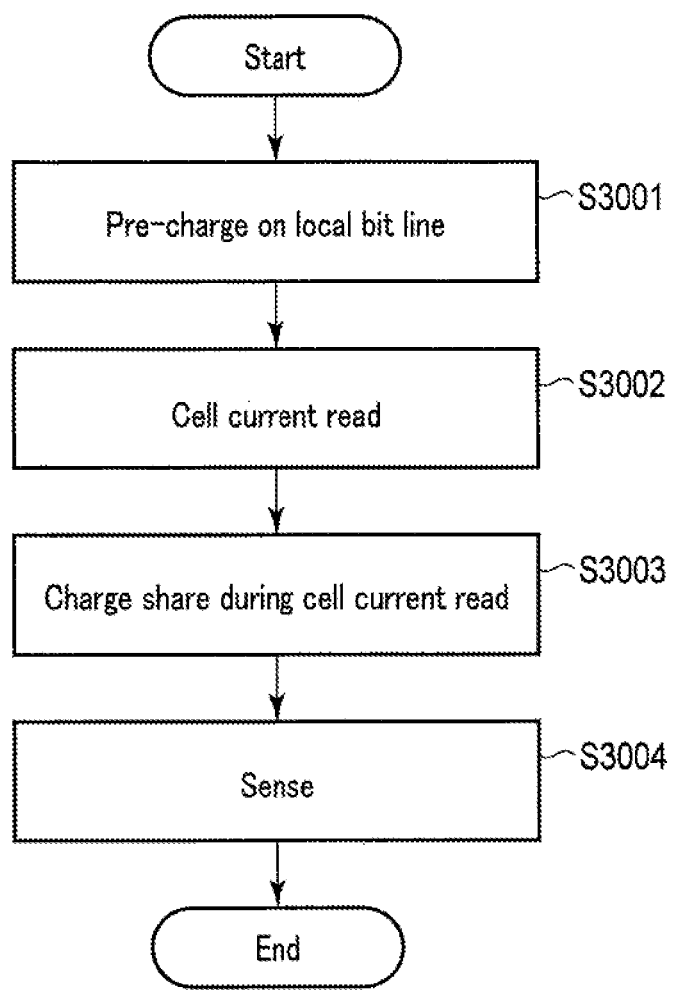
F I G. 26

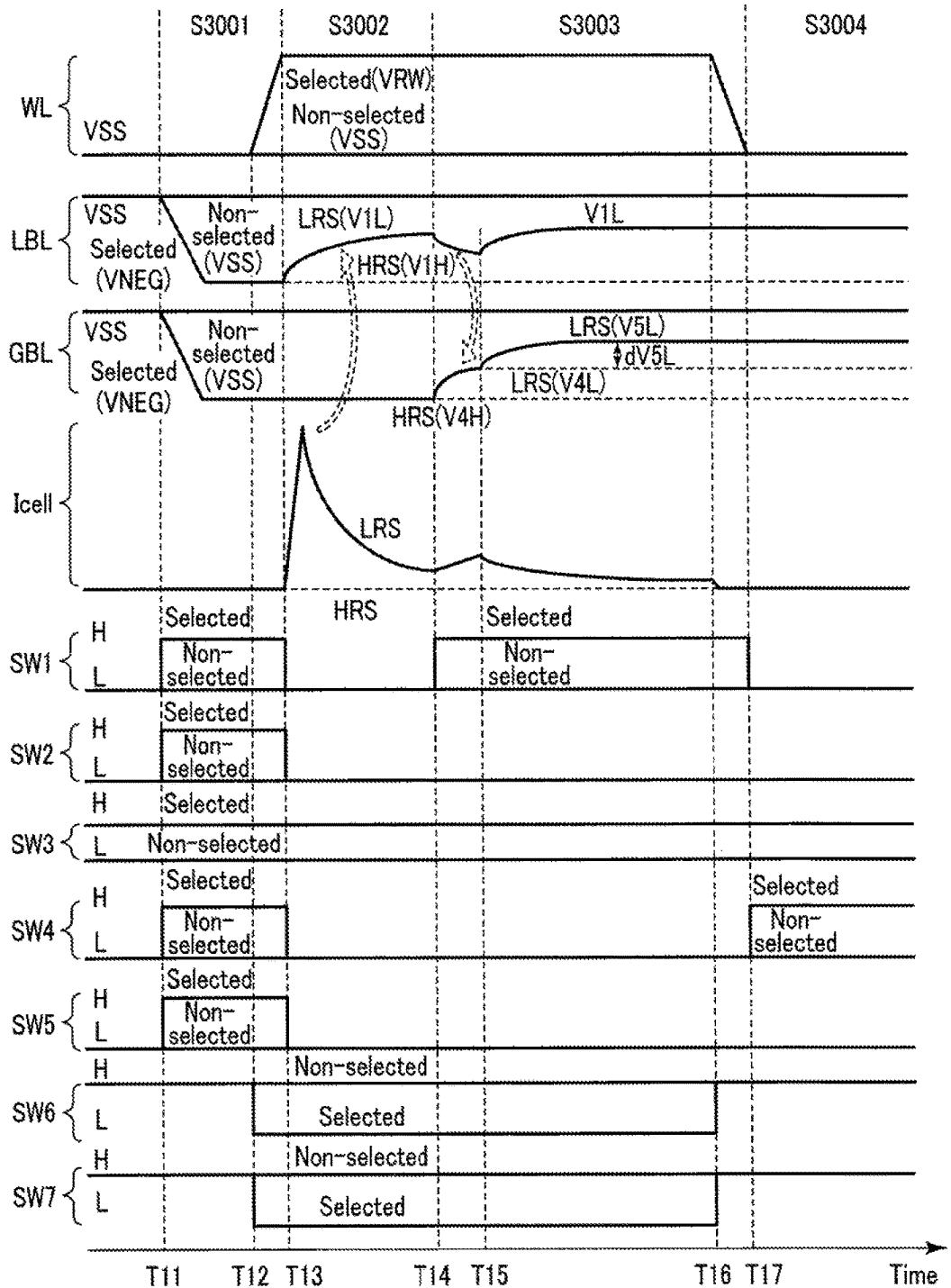
F I G. 27

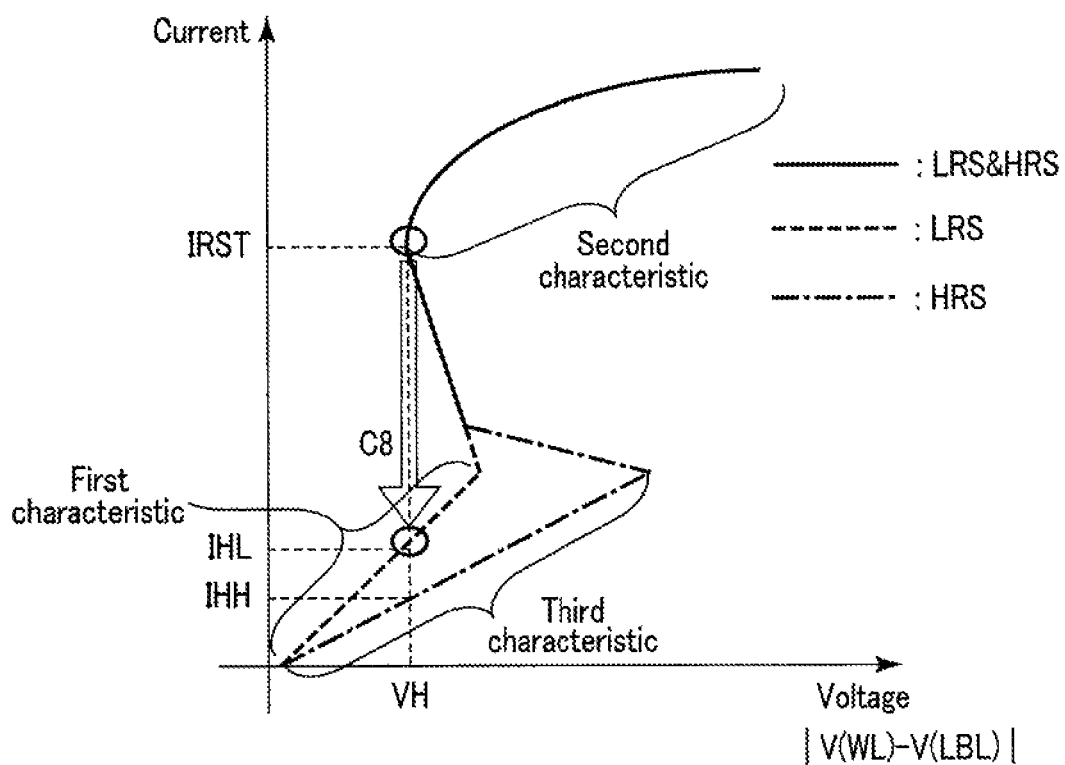
F I G. 32

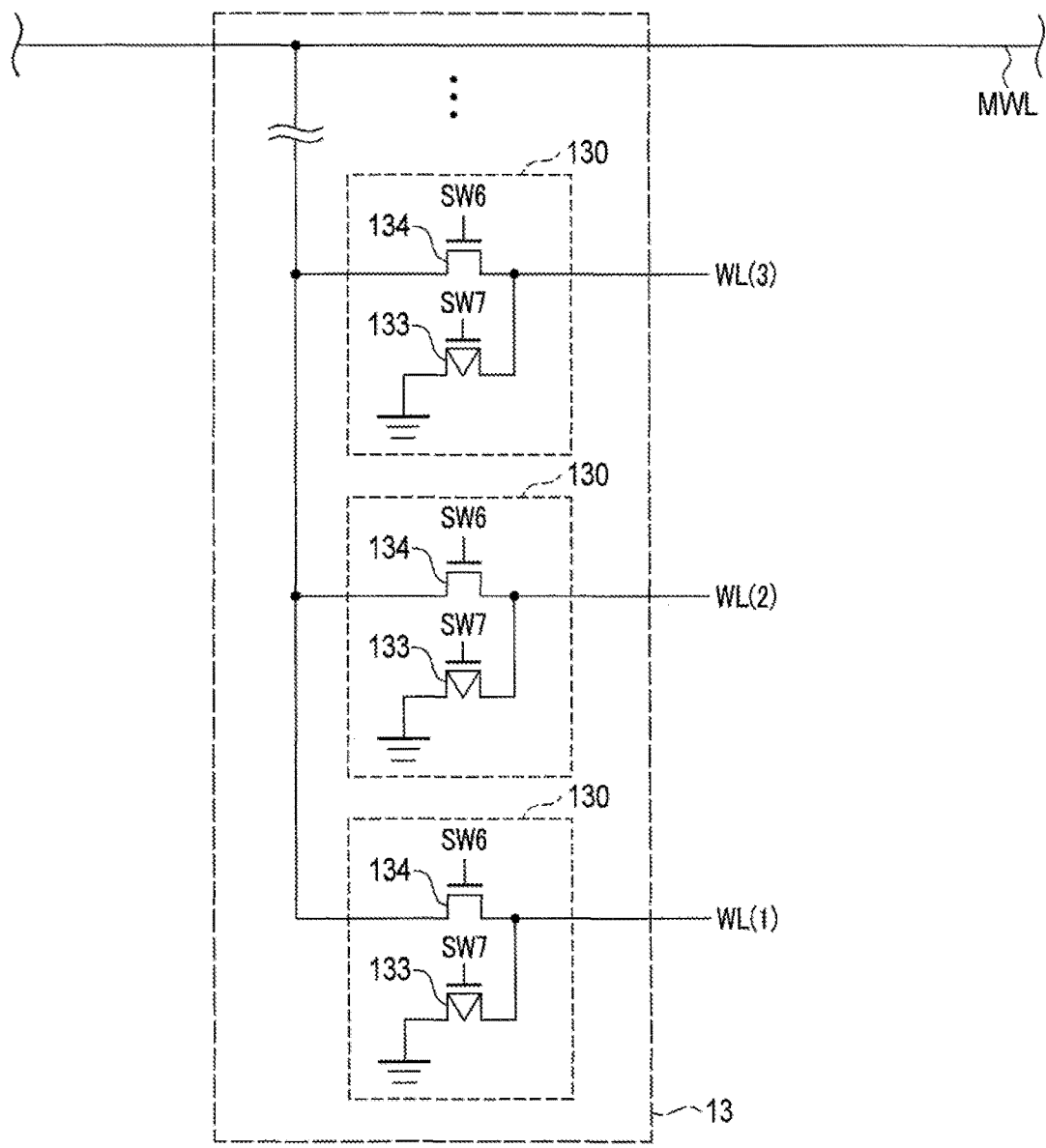
F I G. 35

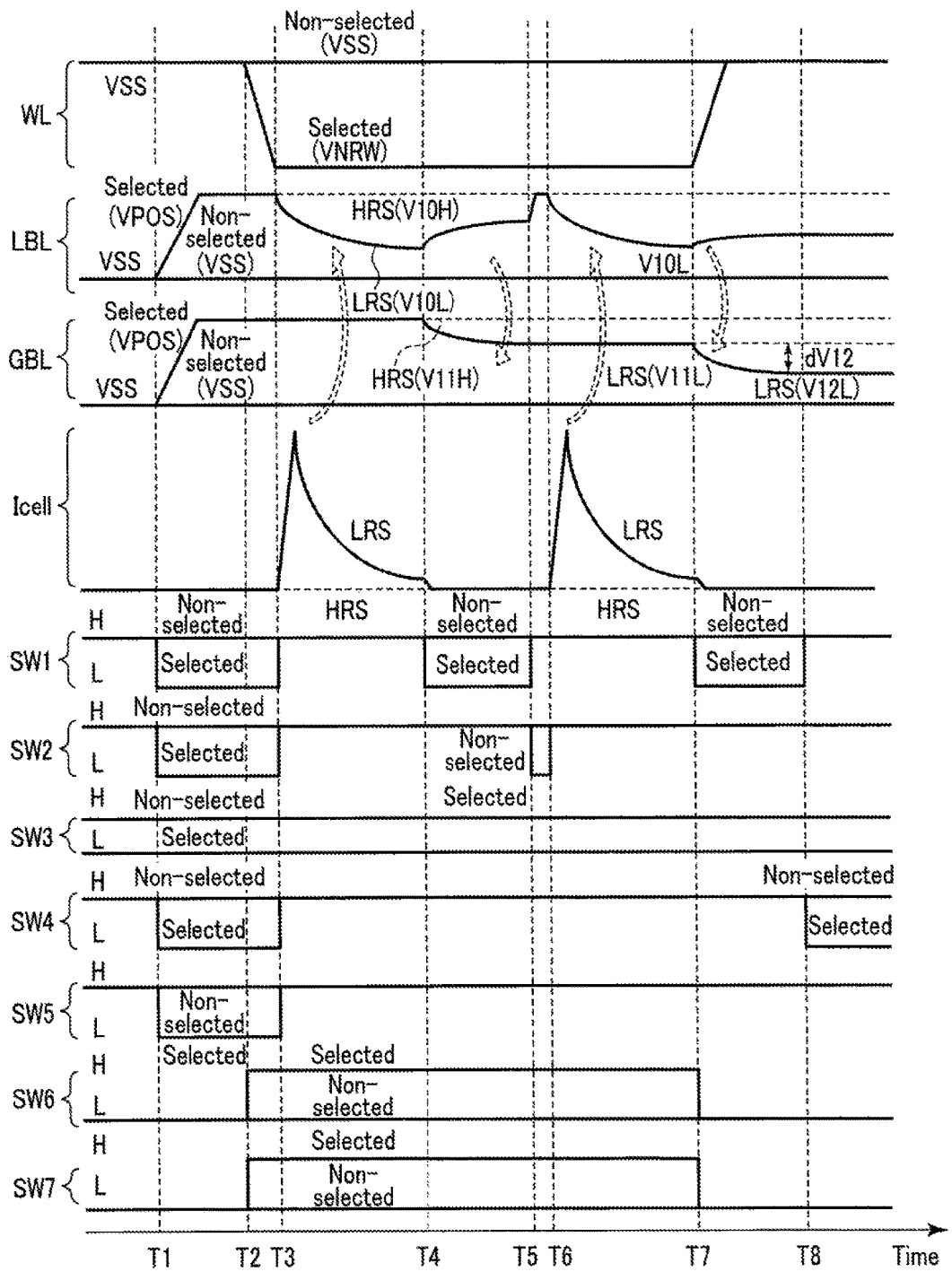
F I G. 36

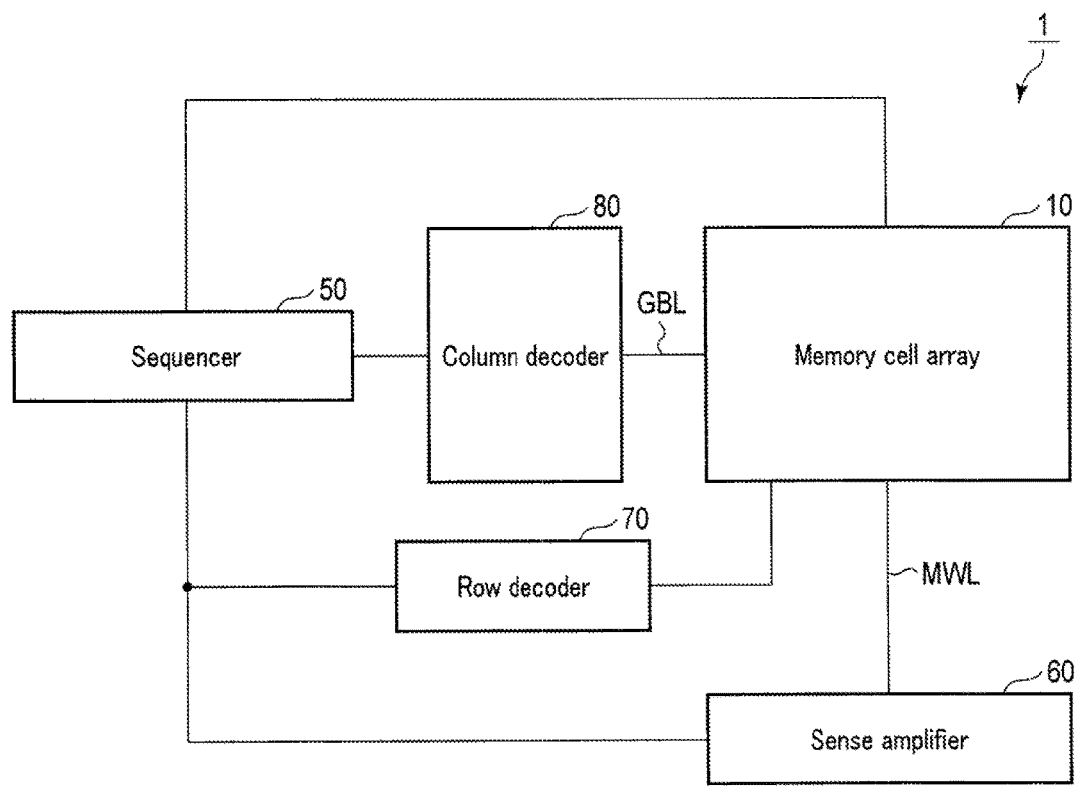
F I G. 38

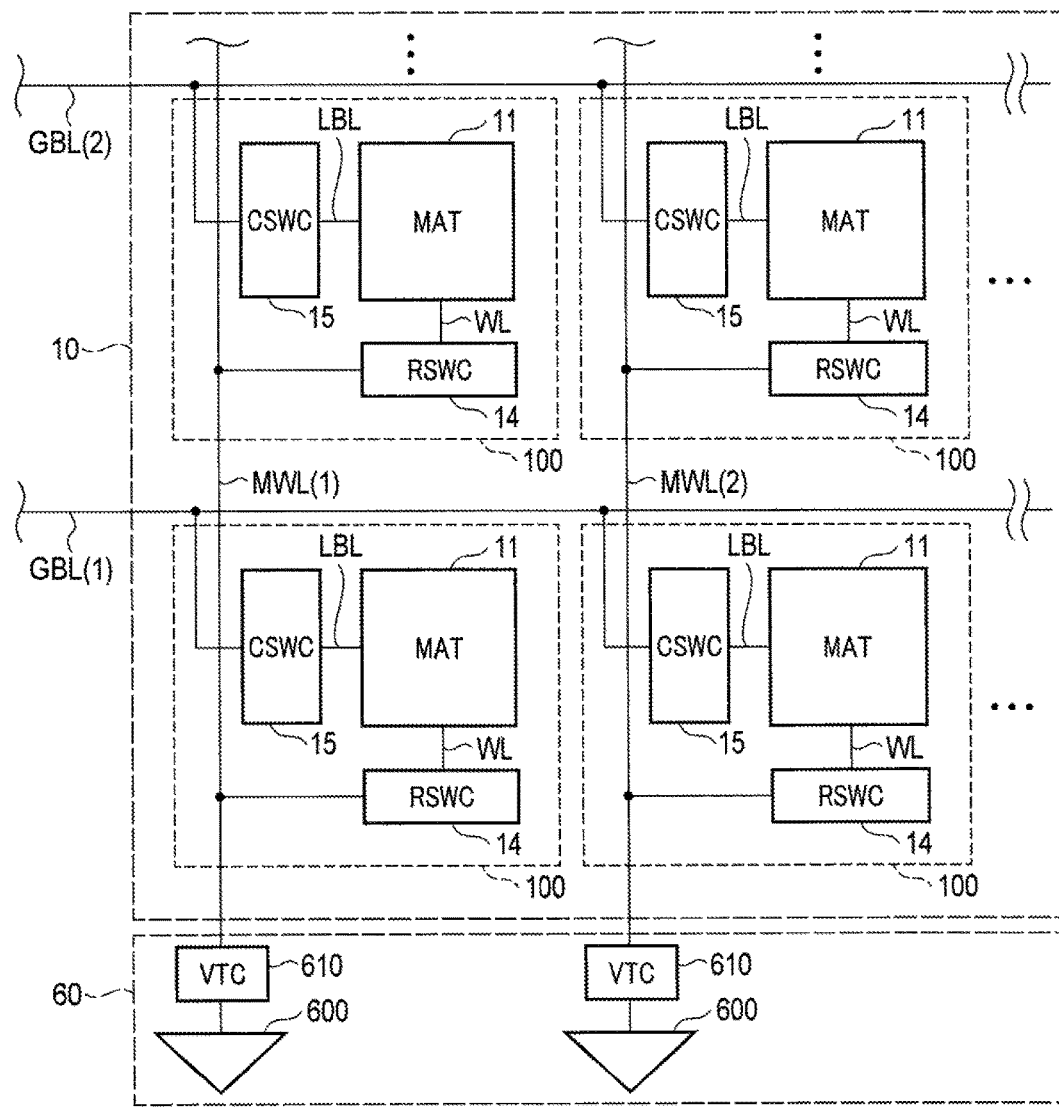
F I G. 39

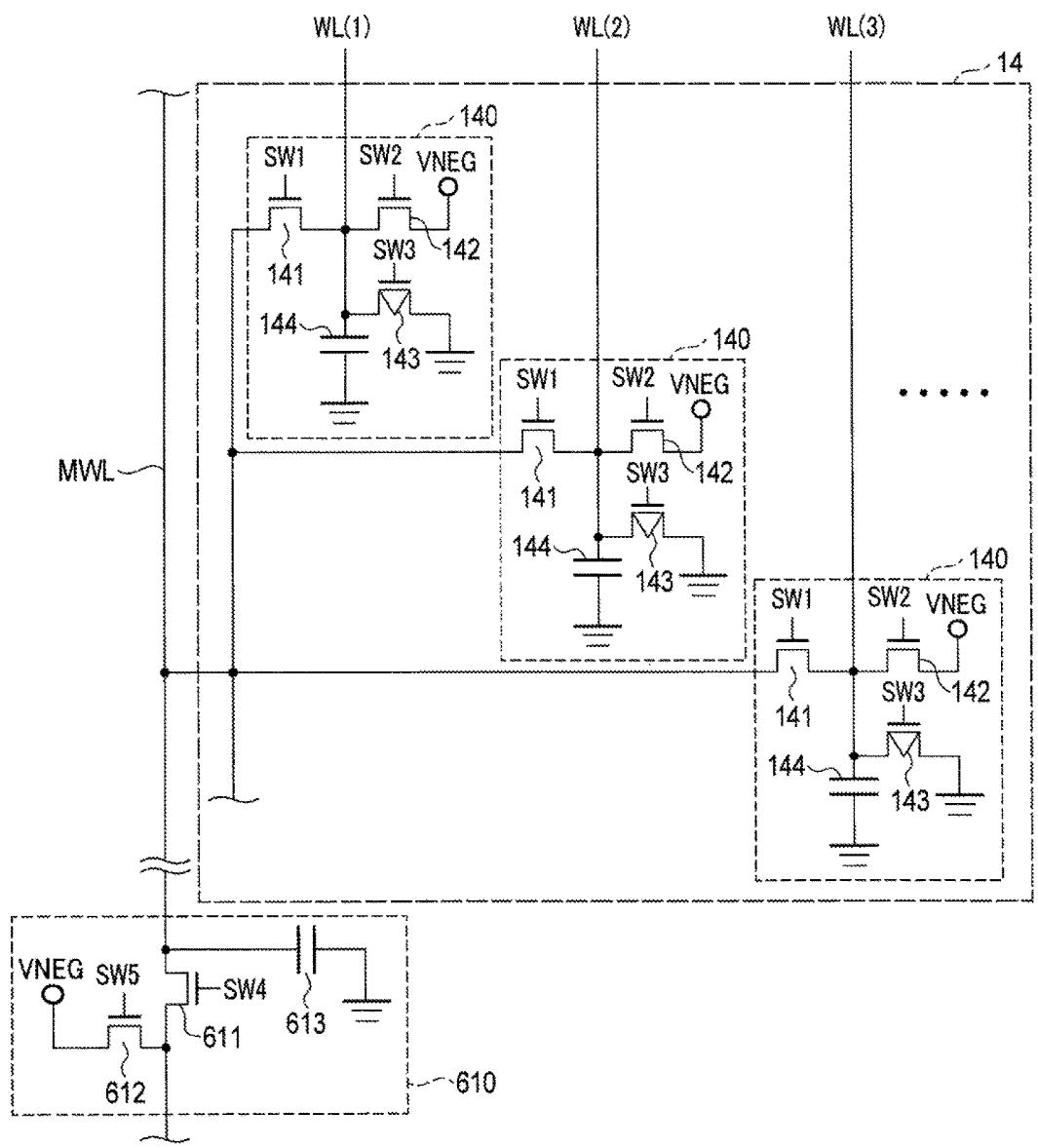
F I G. 40

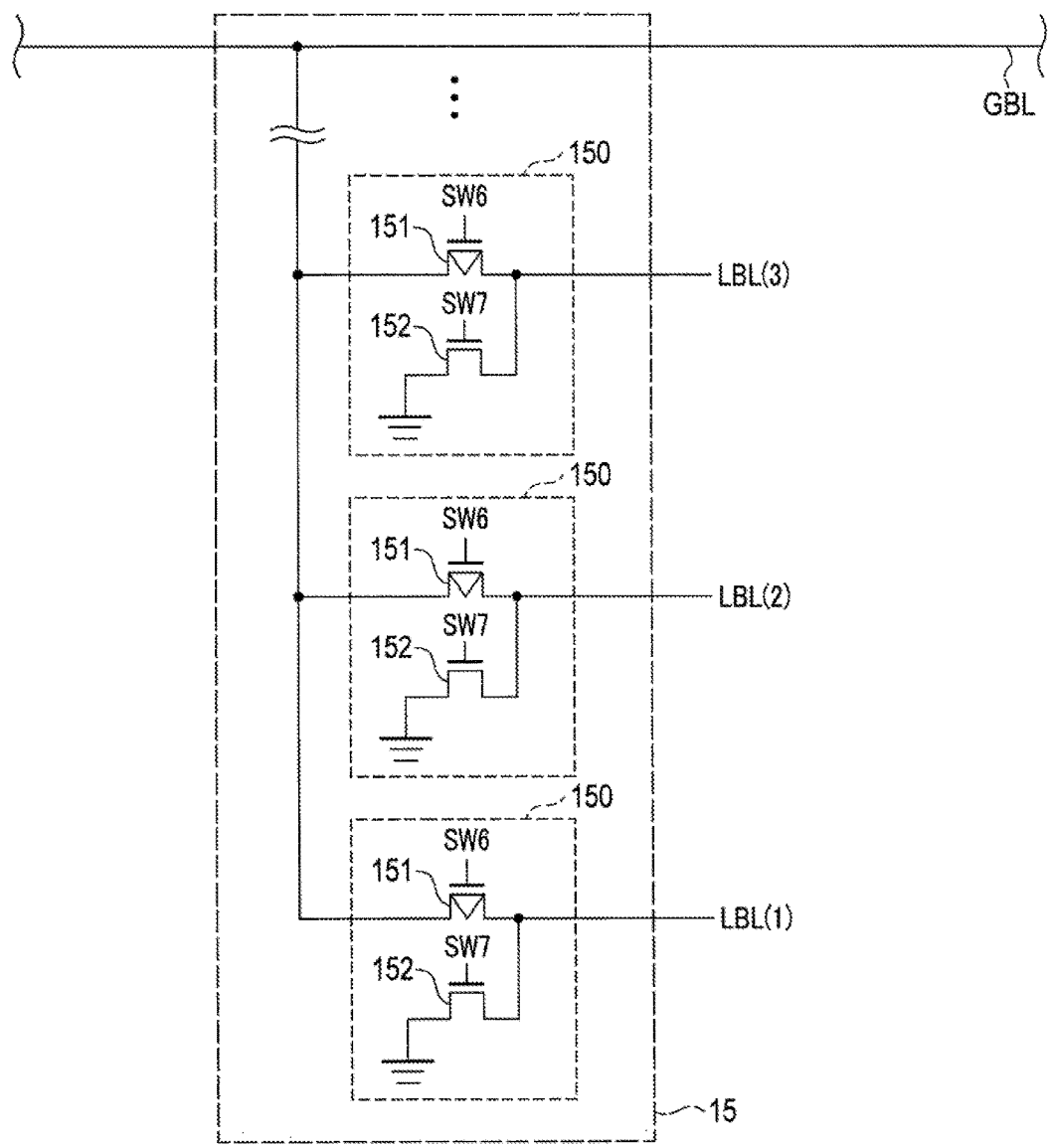
F I G. 41

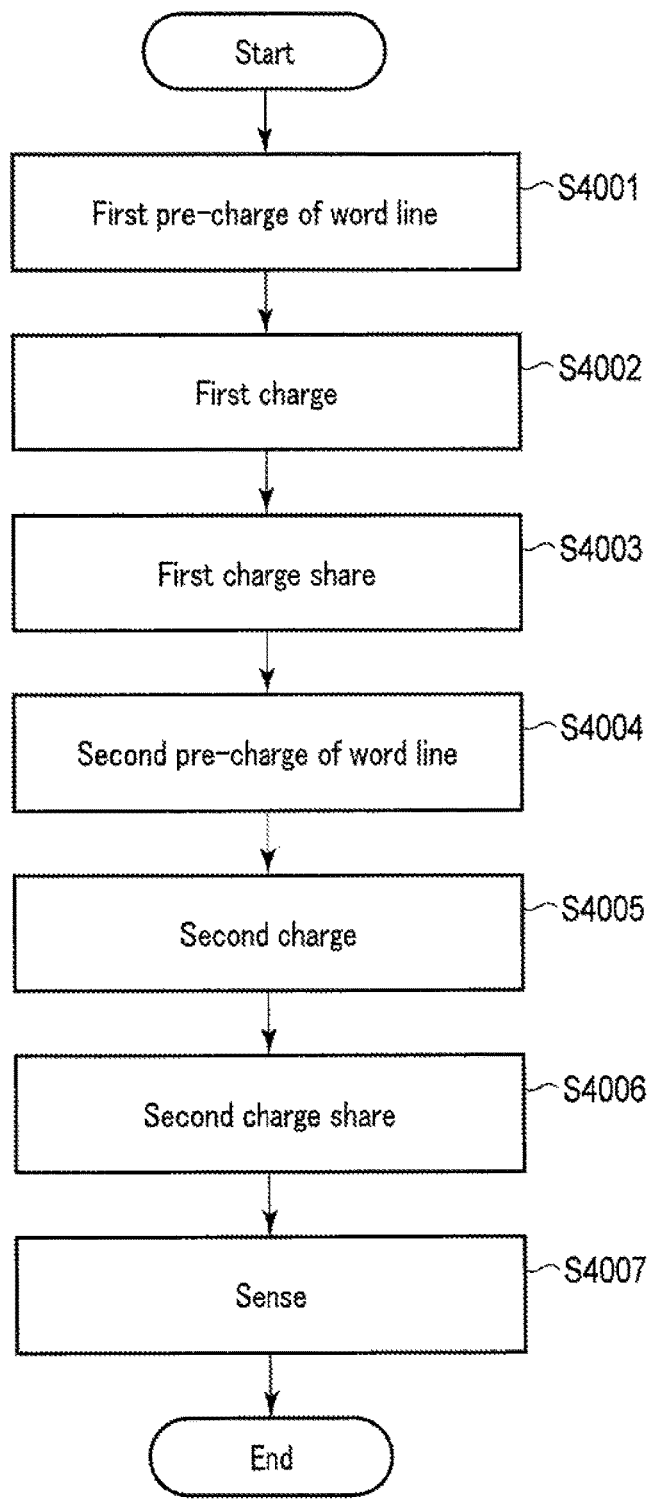
F I G. 42

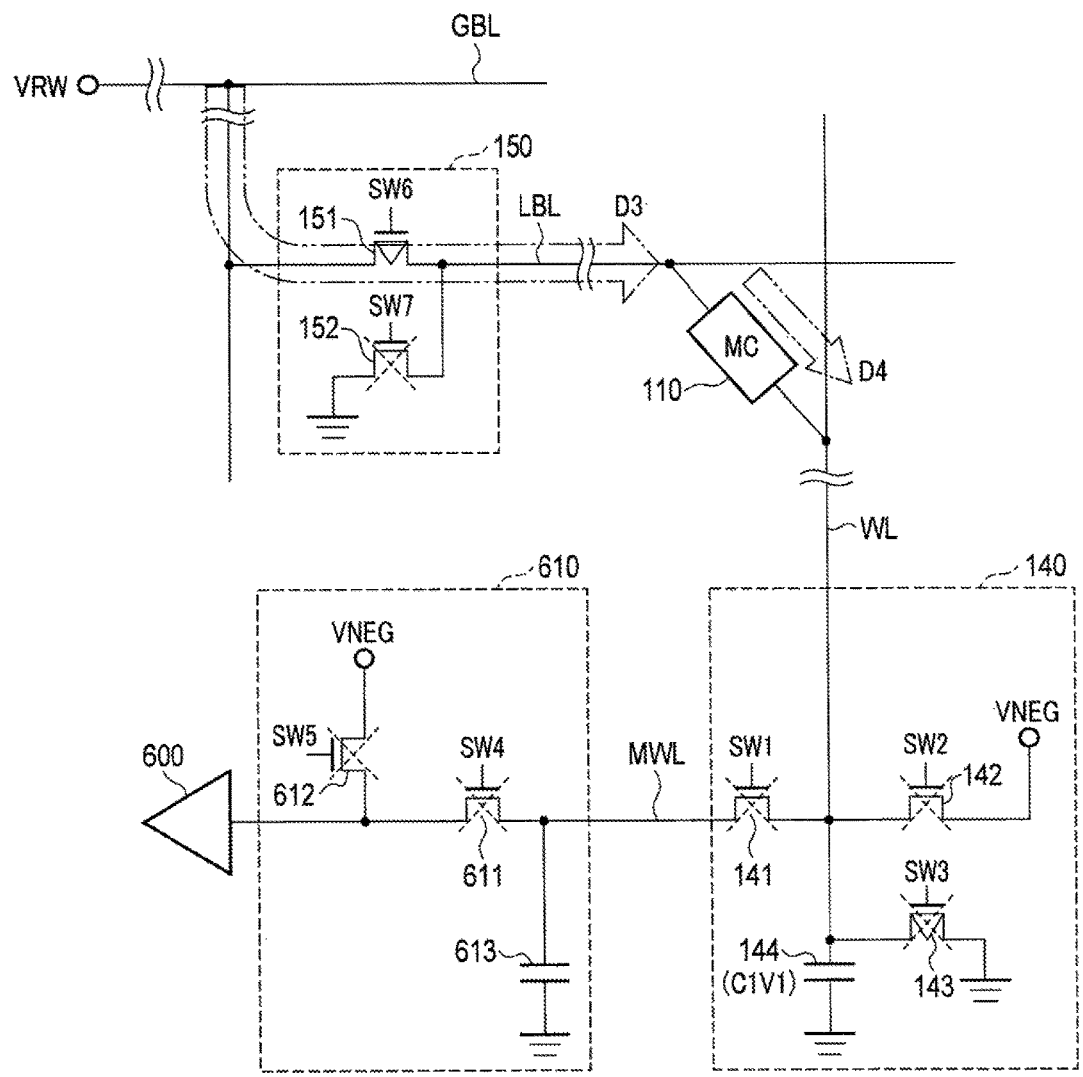
F I G. 45

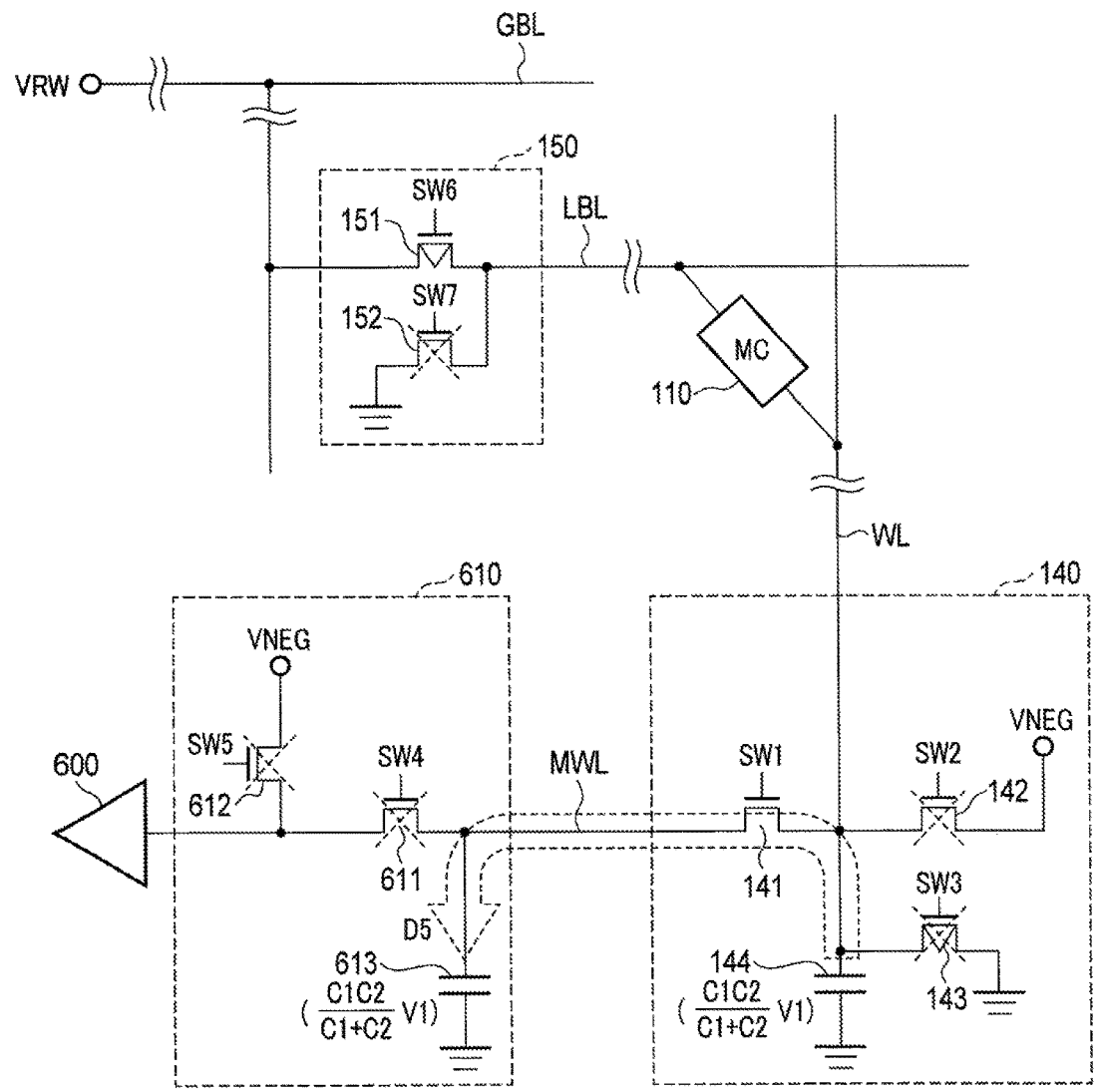
F I G. 46

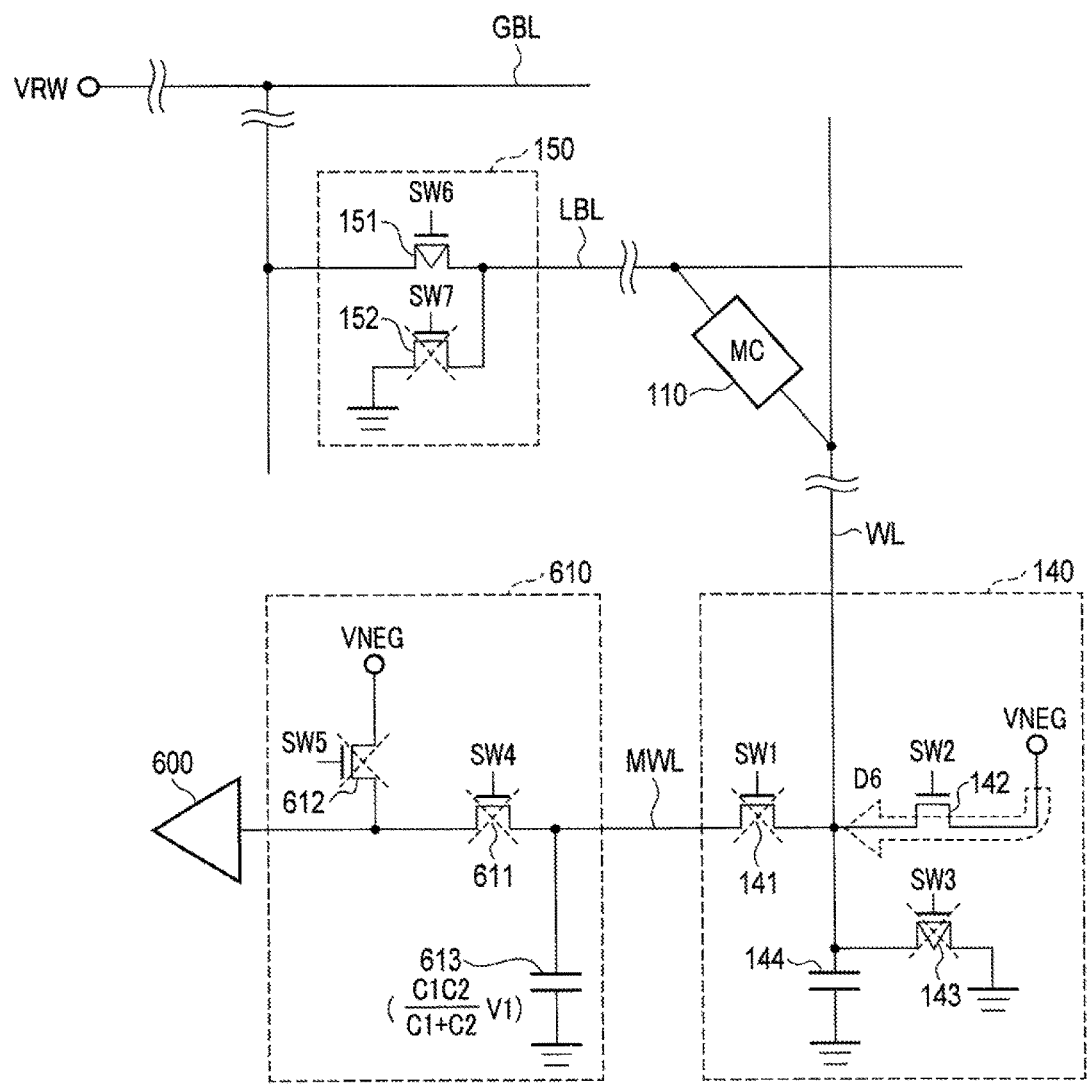
F I G. 47

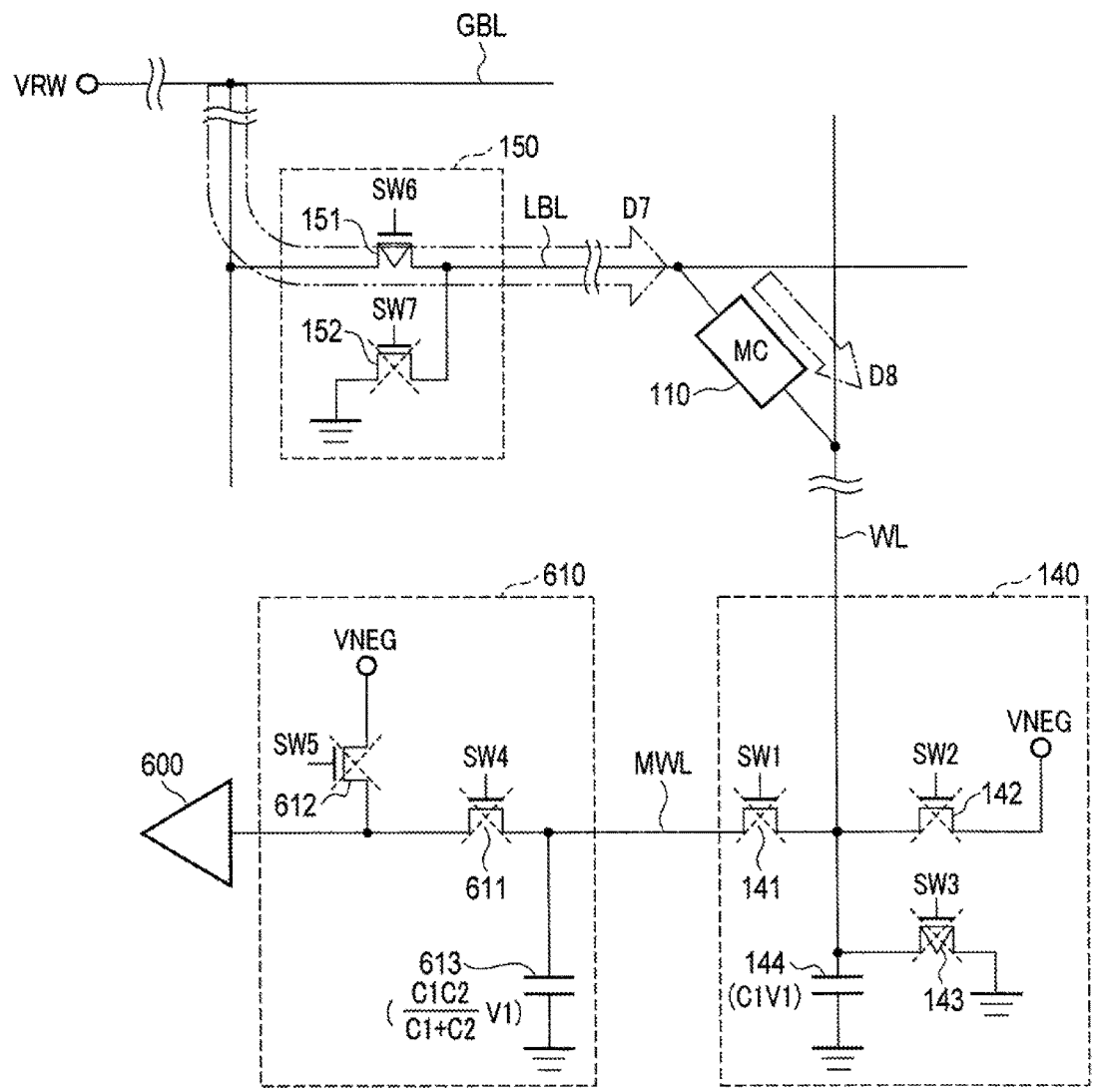
F I G. 48

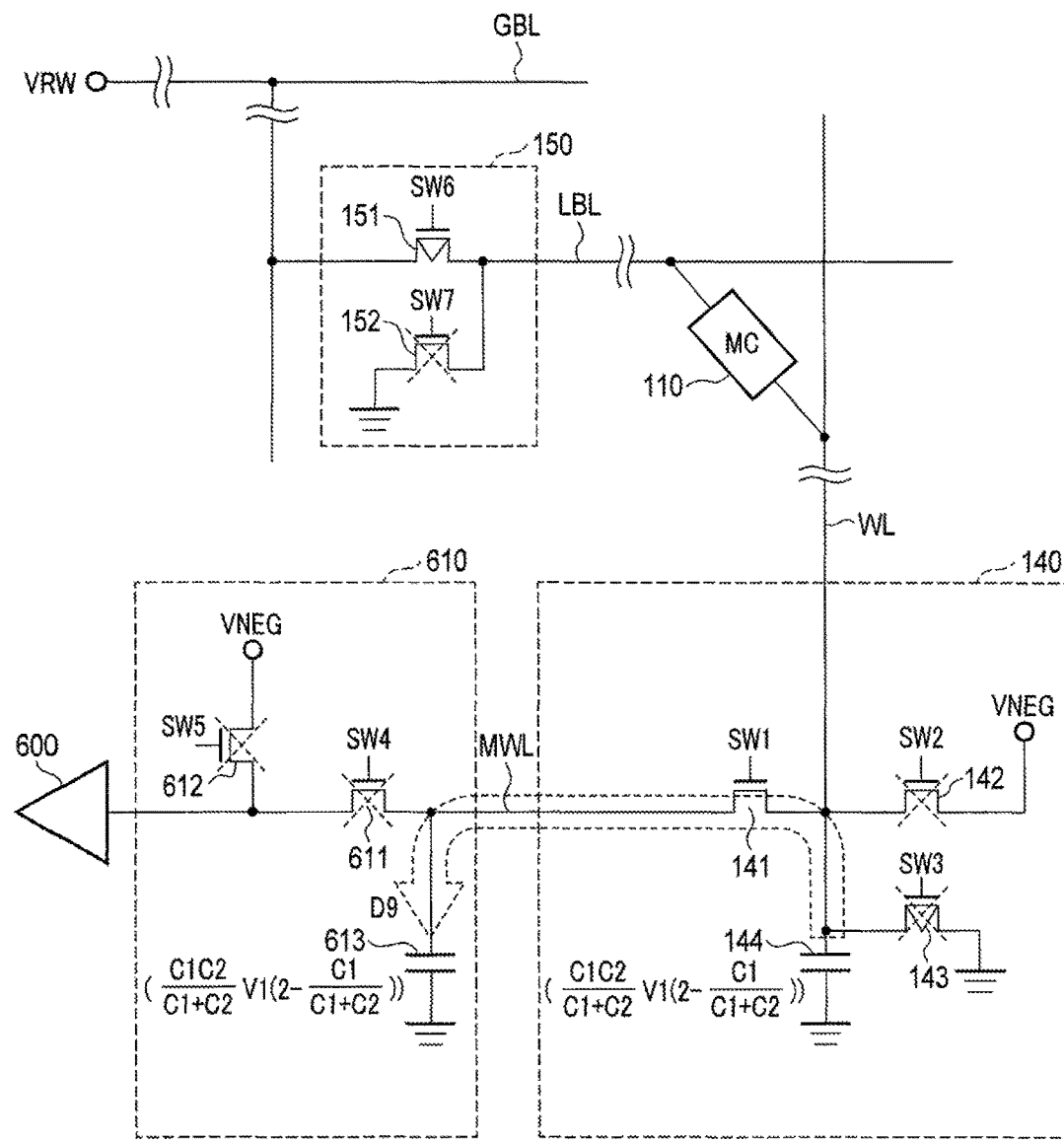
F I G. 49

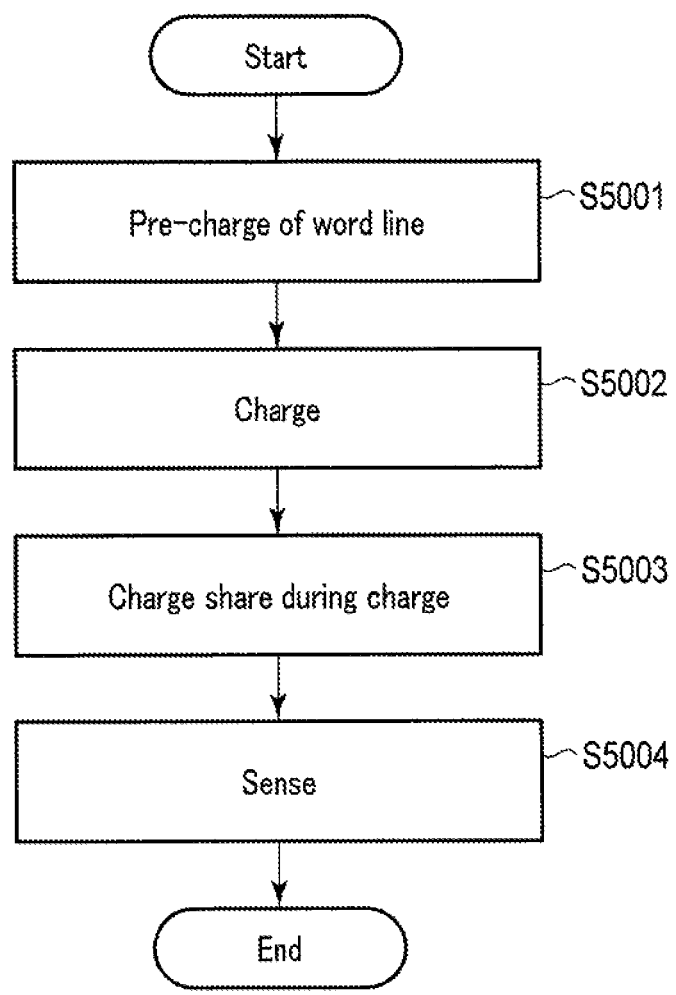
F I G. 51

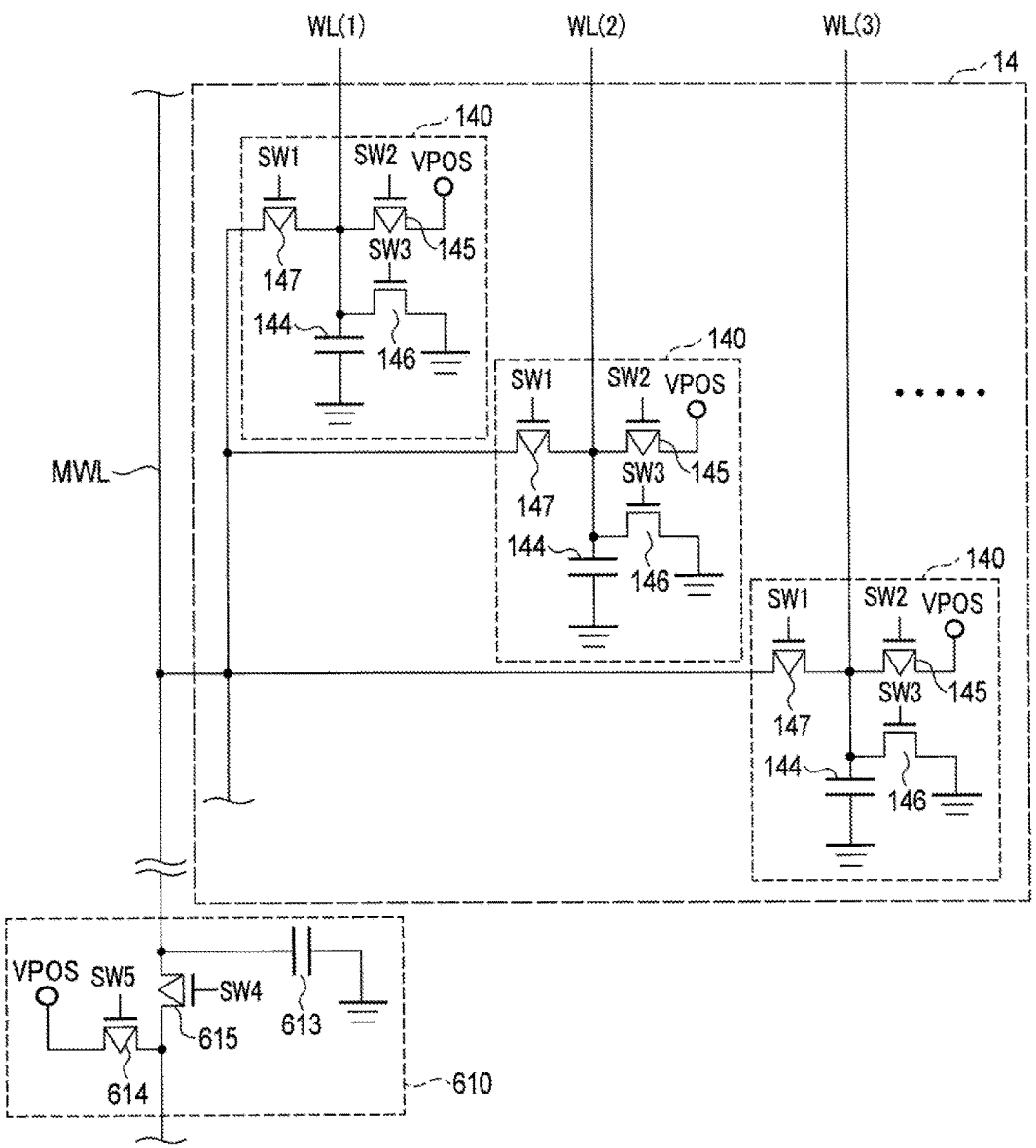
F I G. 53

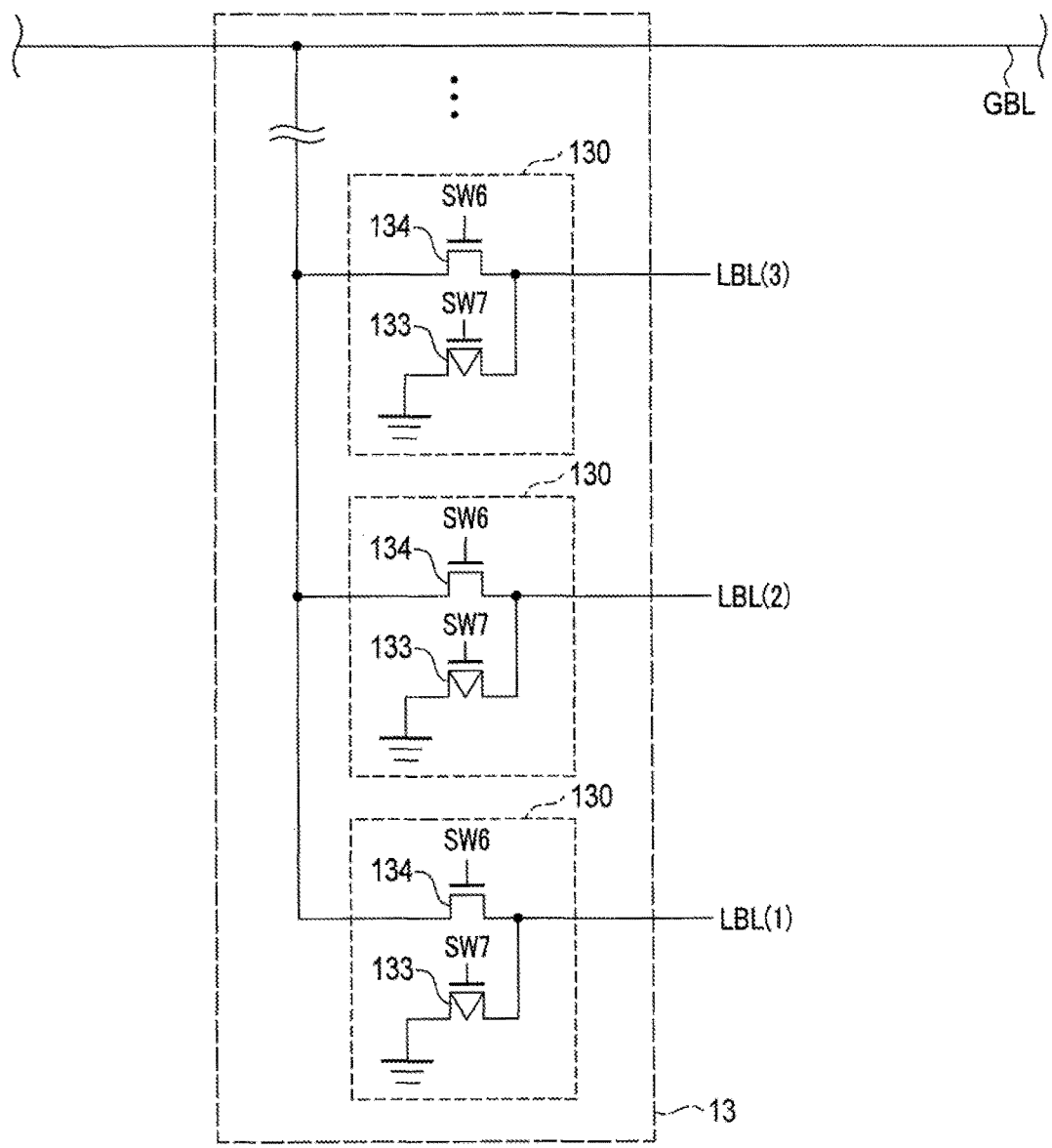
F I G. 54

SEMICONDUCTOR MEMORY DEVICE

CROSS-REFERENCE TO RELATED APPLICATIONS

This application is based upon and claims the benefit of priority from prior Japanese Patent Application No. 2018-054722, filed Mar. 22, 2018; the entire contents of which are incorporated herein by reference.

FIELD

Embodiments relate to a semiconductor memory device.

BACKGROUND

In recent years, a phase change memory (PCM) has been developed as a semiconductor memory device. In the PCM, the crystal state of a variable resistive element is phase-changed by application of a voltage. The variable resistive element is brought into a low resistance state (LRS) or a high resistance state (HRS) by this phase change, and stores data with those two states.

BRIEF DESCRIPTION OF THE DRAWINGS

FIG. 1 is a block diagram showing a general configuration of the semiconductor memory device according to the first embodiment.

FIG. 2 is a block diagram showing the memory cell array of the semiconductor memory device according to the first embodiment.

FIG. 4 is a circuit diagram showing the row switch circuit of the semiconductor memory device according to the first embodiment.

FIG. 5 is a circuit diagram showing the MAT of the semiconductor memory device according to the first embodiment.

FIG. 6 is a graph showing the voltage-current (IV) characteristics of the memory cell.

FIG. 13 is a circuit diagram showing the operation from time T1 to time T2 relating to the selected memory cell MC.

FIG. 14 is a circuit diagram showing the operation from time T2 to time T3 relating to the selected memory cell MC.

FIG. 17 is a circuit diagram showing the operation from time T4 to time T5 relating to the selected memory cell MC.

FIG. 18 is a circuit diagram showing the operation from time T5 to time T6 relating to the selected memory cell MC.

FIG. 19 is a circuit diagram showing the operation from time T6 to time T7 relating to the selected memory cell MC.

FIG. 20 is a circuit diagram showing the operation from time T7 to time T8 relating to the selected memory cell MC.

FIG. 21 is a circuit diagram showing the operation at time T8 relating to the selected memory cell MC.

FIG. 22 is a graph showing the IV characteristics of the first semi-selected memory cell.

FIG. 23 is a graph showing the IV characteristics of the second semi-selected memory cell.

FIG. 24 is a flowchart showing the read operation of the semiconductor memory device according to Comparative Example 1.

FIG. 26 is a flowchart showing the read operation of the semiconductor memory device according to the second embodiment.

FIG. 27 is a timing chart showing the read operation of the semiconductor memory device according to the second embodiment.

FIG. 32 is a graph showing the IV characteristics of the selected memory cell.

FIG. 35 is a circuit diagram showing the row switch circuit of the semiconductor memory device according to the third embodiment.

FIG. 36 is a timing chart showing the read operation of the semiconductor memory device according to the third embodiment.

FIG. 38 is a block diagram showing a general configuration of the semiconductor memory device according to the fourth embodiment.

FIG. 39 is a block diagram showing the memory cell array of the semiconductor memory device according to the fourth embodiment.

FIG. 40 is a circuit diagram showing the row switch circuit and voltage transfer circuit of the semiconductor memory device according to the fourth embodiment.

FIG. 41 is a circuit diagram showing the column switch circuit of the semiconductor memory device according to the fourth embodiment.

FIG. 42 is a flowchart showing the read operation of the semiconductor memory device according to the fourth embodiment.

FIG. 45 is a circuit diagram showing the operation from time T22 to time T23 relating to the selected memory cell MC.

FIG. 46 is a circuit diagram showing the operation from time T24 to time T25 relating to the selected memory cell MC.

FIG. 47 is a circuit diagram showing the operation from time T25 to time T26 relating to the selected memory cell MC.

FIG. 48 is a circuit diagram showing the operation from time T26 to time T27 relating to the selected memory cell MC.

FIG. 49 is a circuit diagram showing the operation from time T27 to time T28 relating to the selected memory cell MC.

FIG. 51 is a flowchart showing the read operation of the semiconductor memory device according to Modification 1 of the fourth embodiment.

FIG. 53 is a circuit diagram showing the row switch circuit and voltage transfer circuit of the semiconductor memory device according to Modification 2 of the fourth embodiment.

FIG. 54 is a circuit diagram showing the column switch circuit of the semiconductor memory device according to Modification 2 of the fourth embodiment.

DETAILED DESCRIPTION

Figure 3:
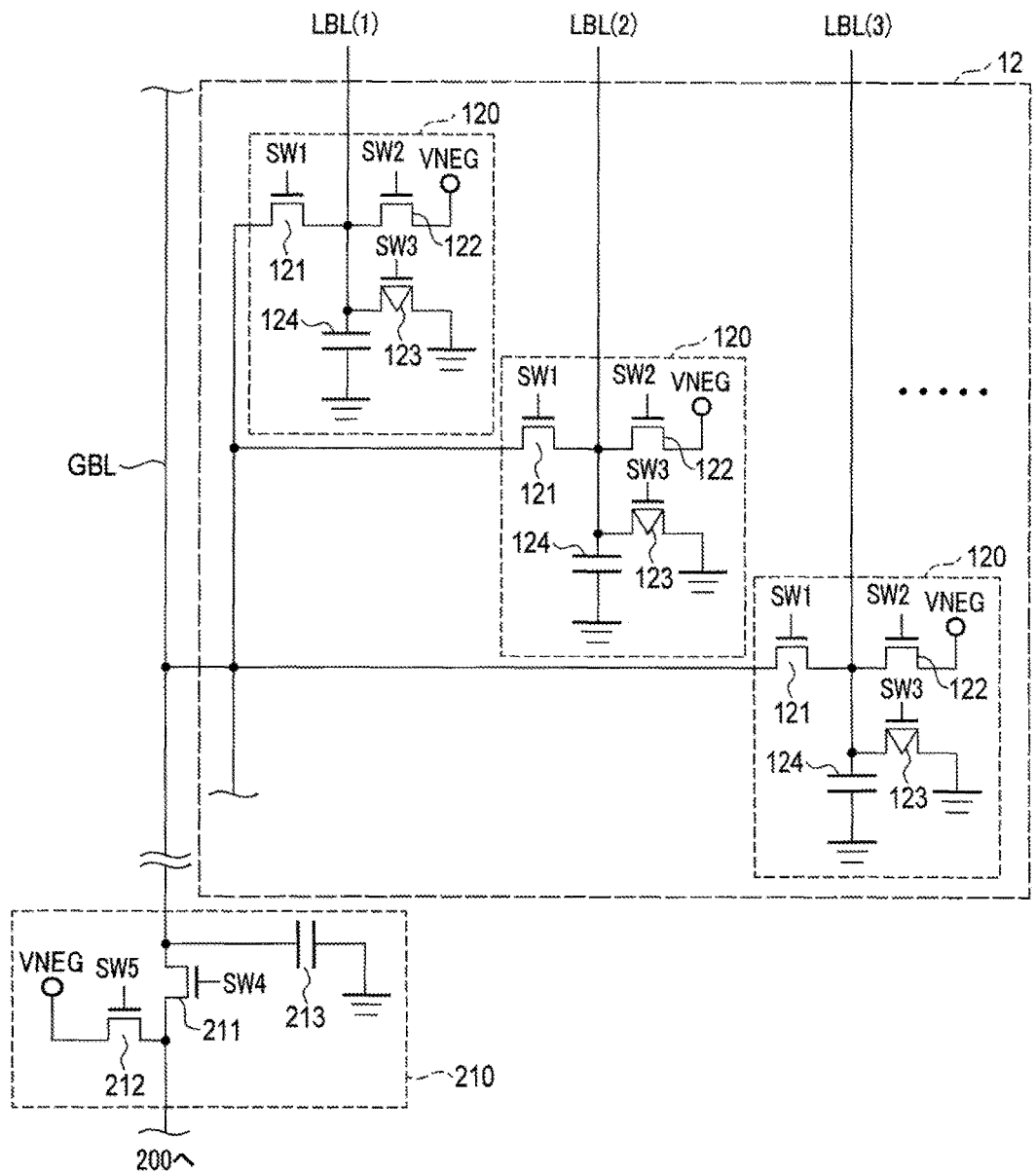
FIG. 3 is a circuit diagram showing the column switch circuit and the voltage transfer circuit of the semiconductor memory device according to the first embodiment.

In general, according to one embodiment, a semiconductor memory device, includes a resistance change type memory cell; a first charge section into which a charge based on a current flowing in the memory cell is charged; a second charge section coupled to the first charge section via a switch element; a sense amplifier configured to determine data stored in the memory cell based on the charge charged into the second charge section; and a control circuit configured to control the first charge section, the second charge section, and the sense amplifier, wherein in a read operation, the control circuit charges a first charge based on a current flowing in the memory cell into the first charge section, turns on the switch element to share a second charge based on the first charge with the second charge section, charges a third charge based on a current flowing in the memory cell into the first charge section, turns on the switch element to share a fourth charge based on the second charge and the third charge with the second charge section, and supplies the fourth charge to the sense amplifier to determine data stored in the memory cell.

Hereinafter, details of embodiments will be described with reference to the drawings. In the description, common parts are assigned with common reference numerals throughout the drawings.

In the following embodiments, descriptions will be provided while using the PCM as an example of the semiconductor memory device.

<1> First Embodiment

A semiconductor memory device according to the first embodiment will be described.

<1-1> Configuration

<1-1-1> Semiconductor Memory Device

FIG. 1 is a block diagram showing a general configuration of the semiconductor memory device according to the first embodiment. A semiconductor memory device 1 of the present embodiment includes a memory cell array 10, a sense amplifier 20, a column decoder 30, a row decoder 40, and a sequencer 50.

The memory cell array 10 includes a plurality of memory cells MC. Each memory cell MC is arranged at an intersection of a local bit line LBL and a word line WL. Access to each memory MC is made via a global bit line GBL and a local bit line LBL, and a main word line MWL and a word line WL. Details will be described later.

The sense amplifier 20 includes a sense amplifier circuit for each global bit line GBL. When data is read, the sense amplifier circuit senses data read from the memory cell MC to the global bit line GBL. When data is written, the sense amplifier 20 supplies a voltage corresponding to write data to the memory cell MC. The voltages are provided by the sequencer 50.

The column decoder 30 decodes a column address to obtain a column address decode signal.

The row decoder 40 selects a main word line MWL based on a row address decode signal obtained by decoding a row address.

The sequencer 50 controls the operation of the whole semiconductor memory device 1. The sequencer 50 also generates a voltage and a current necessary for data reading, writing, or erasing by raising or lowering a source voltage VDD supplied from outside of the semiconductor memory device 1, and supplies them to, for example, the memory cell array 10, the sense amplifier 20, the column decoder 30, or the row decoder 40.

<1-1-2> Memory Cell Array

The memory cell array 10 of the semiconductor memory device according to the first embodiment will be described with reference to FIG. 2. FIG. 2 is a block diagram showing the memory cell array 10 of the semiconductor memory device according to the first embodiment.

As shown in FIG. 2, the memory cell array 10 includes a plurality of sub-cell arrays 100 arranged in a matrix. Each sub-cell array 100 is coupled to the sense amplifier 20 via a global bit line GBL.

The sense amplifier 20 includes a voltage transfer circuit 210 and a sense amplifier circuit 200 for each global bit line GBL. The voltage transfer circuit 210 transfers a voltage from the global bit line GBL to the sense amplifier circuit 200 or transfers a voltage to the global bit line GBL. The sense amplifier circuit 200 senses data transferred by the voltage transfer circuit 210.

The sub-cell array 100 includes a MAT 11, a column switch circuit 12, and a row switch circuit 13.

The MAT 11 includes a plurality of memory cells MC arranged in a matrix on a semiconductor substrate. Details will be described later.

The column switch circuit 12 controls coupling between a global bit line GBL and a local bit line LBL based on a signal from the column decoder 30.

The row switch circuit 13 controls coupling between a main word line MWL and a word line WL based on a signal from the sequencer 50.

<1-1-3> Column Switch Circuit and Voltage Transfer Circuit

The column switch circuit and the voltage transfer circuit of the semiconductor memory device according to the first embodiment will be described with reference to FIG. 3. FIG. 3 is a circuit diagram showing the column switch circuit and the voltage transfer circuit of the semiconductor memory device according to the first embodiment.

As shown in FIG. 3, the column switch circuit 12 includes a column control circuit 120 for each local bit line LBL.

The column control circuit 120 includes an NMOS transistor 121 that controls coupling between a global bit line GBL and a local bit line LBL, an NMOS transistor 122 that transfers negative voltage VNEG to the local bit line LBL, a PMOS transistor 123 that transfers reference voltage VSS (VNEG<VSS) to the local bit line LBL, and a capacitor 124 that accumulates the charge of the local bit line LBL.

Transistor 121 is turned on (brought into conduction) based on "H"-level signal SW1 to couple the global bit line GBL to the local bit line LBL.

Transistor 122 is turned on based on "H"-level signal SW2 to transfer negative voltage VNEG to the local bit line LBL.

Transistor 123 is turned on based on "L"-level signal SW3 to transfer reference voltage VSS to the local bit line LBL.

One end of the capacitor 124 is coupled to the local bit line LBL, and the other end thereof is supplied with reference voltage VSS. The capacitance of the capacitor 124 is C1. The capacitor 124 is, for example, the local bit line LBL itself.

As shown in FIG. 3, the voltage transfer circuit 210 includes an NMOS transistor 211 that controls coupling between the global bit line GBL and the sense amplifier circuit 200, an NMOS transistor 212 that transfers negative voltage VNEG to the global bit line GBL, and a capacitor 213 that accumulates the charge of the global bit line GBL.

Transistor 211 is turned on based on "H"-level signal SW4 to couple the global bit line GBL to the sense amplifier circuit 200.

Transistor 212 is turned on based on "H"-level signal SW5 to transfer voltage VNEG to the global bit line GBL.

One end of the capacitor 213 is coupled to the global bit line GBL, and the other end thereof is supplied with reference voltage VSS. The capacitance of the capacitor 213 is C2. The capacitor 213 is, for example, the global bit line GBL itself.

<1-1-4> Row Switch Circuit

The row switch circuit of the semiconductor memory device according to the first embodiment will be described with reference to FIG. 4. FIG. 4 is a circuit diagram showing the row switch circuit of the semiconductor memory device according to the first embodiment.

As shown in FIG. 4, the row switch circuit 13 includes a row control circuit 130 for each word line WL.

The row control circuit 130 includes a PMOS transistor 131 that controls coupling between a main word line MWL and a word line WL, and an NMOS transistor 132 that transfers reference voltage VSS to the word line WL.

Transistor 131 is turned on based on "L"-level signal SW6 to couple the main word line MWL to the word line WL.

Transistor 132 is turned on based on "H"-level signal SW7 to transfer reference voltage VSS to the word line WL.

<1-1-5> MAT

Next, the MAT of the semiconductor memory device according to the first embodiment will be described with reference to FIG. 5. FIG. 5 is a circuit diagram showing the MAT of the semiconductor memory device according to the first embodiment.

As shown in FIG. 5, the MAT includes a plurality of memory cells MC arranged in a matrix on a semiconductor substrate. The number of memory cells MC may be any number. The memory cells MC arranged in the same row are coupled in common to a local bit line LBLk (k is an integer not less than 0). The memory cells MC arranged in the same column are coupled in common to a word line WLm (m is an integer not less than 0). The memory cell MC includes a PCM and a selector. The PCM in the present embodiment is brought into a low resistance state or a high resistance state by a change of the crystal state. Hereinafter, the change of the crystal state of the PCM will be referred to as a "phase change". The selector in the present embodiment is, for example, a switch element between two terminals. When the voltage applied between two terminals is smaller than a threshold, the switch element is in an "off" state, such as an electrically high resistance state. When the voltage applied between two terminals is equal to or larger than the threshold, the switch element is in an "on" state, such as an electrically low resistance state. The switch element may have this function regardless of the polarity of the voltage. For example, the switch element contains at least one type of chalcogen element selected from a group consisting of Te, Se, and S. Alternatively, the switch element may contain a chalcogenide which is a compound containing the chalcogen element. Instead, the switch element may contain As-doped $SiO_2$ which is not a chalcogenide system.

<1-1-6> Characteristics of Memory Cell

The current-voltage (IV) characteristics of the memory cell of the semiconductor memory device according to the first embodiment will be described with reference to FIGS. 6 to 9. FIGS. 6 to 9 are graphs showing IV characteristics of the memory cell. The horizontal axis indicates the voltage applied to the memory cell MC (the difference between the word line voltage V(WL) and the local bit line voltage V(LBL)), and the vertical axis indicates the cell current flowing in the memory cell MC. The vertical axis is on a log scale.

As shown in FIG. 6, the memory cell MC has different IV characteristics when it is in the low resistance state LRS and when it is in the high resistance state HRS.

When the memory cell MC is in the low resistance state LRS, the memory cell MC has the first characteristic in the figure until the voltage applied to the memory cell MC reaches voltage VLRS. Therefore, the cell current changes in accordance with the first characteristic. In the case where the memory cell MC has the first characteristic, when the voltage applied to the memory cell MC exceeds voltage VLRS, the characteristic of the memory cell MC changes from the first characteristic to the second characteristic in the figure. Therefore, when the voltage applied to the memory cell MC exceeds voltage VLRS, the cell current changes in accordance with the second characteristic. In the case where the memory cell MC has the second characteristic, when the voltage applied to the memory cell MC falls to or below voltage VH with the original resistance state of the memory cell MC maintained, the characteristic of the memory cell MC changes from the second characteristic to the first characteristic in the figure. Therefore, when the voltage applied to the memory cell MC falls to or below voltage VH, the cell current changes in accordance with the first characteristic.

When the memory cell MC is in the high resistance state HRS, the memory cell MC has the third characteristic in the figure until the voltage applied to the memory cell MC reaches voltage VHRS. Therefore, the cell current changes in accordance with the third characteristic. In the case where the memory cell MC has the third characteristic, when the voltage applied to the memory cell MC exceeds voltage VHRS, the characteristic of the memory cell MC changes from the third characteristic to the second characteristic in the figure. Therefore, when the voltage applied to the memory cell MC exceeds voltage VHRS, the cell current changes in accordance with the second characteristic. In the case where the memory cell MC has the second characteristic, when the voltage applied to the memory cell MC falls to or below voltage VH with the original resistance state of the memory cell MC maintained, the characteristic of the memory cell MC changes from the second characteristic to the third characteristic in the figure. Therefore, when the voltage applied to the memory cell MC falls to or below voltage VH, the cell current changes in accordance with the third characteristic.

The cell current in the case where the memory cell MC is in the low resistance state LRS will be specifically described with reference to FIG. 7.

Figure 7:
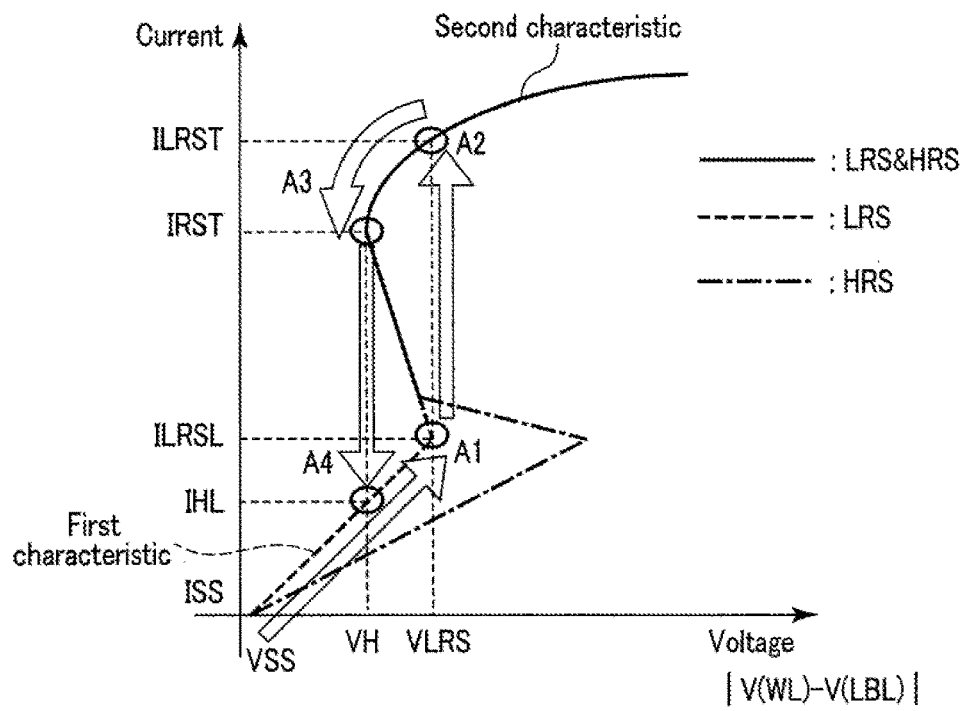
FIG. 7 is a graph showing the voltage-current (IV) characteristics of the memory cell.

As shown in FIG. 7, when the voltage applied to the memory cell MC is raised (charged) from reference voltage VSS to voltage VLRS (VSS<VLRS), the cell current increases from current ISS to current ILRSL (ISS<ILRSL) in accordance with the first characteristic (see arrow A1). When the voltage applied to the memory cell MC exceeds voltage VLRS, the cell current sharply increases from current ILRSL to current ILRST (ILRSL<<ILRST) (see arrow A2). The voltage which causes the cell current flowing in the memory cell MC in the low resistance state LRS to sharply increase as described above will also be referred to as a first threshold voltage. When the voltage applied to the memory cell MC is lowered (discharged) from voltage VLRS to voltage VH (VH<VLRS), the cell current decreases from current ILRST to current IRST (IRST<ILRST) in accordance with the second characteristic (see arrow A3). When the voltage applied to the memory cell MC is lowered to or below voltage VH, the cell current sharply decreases from current IRST to current IHL (IHL<<IRST) (see arrow A4). The voltage which causes the current flowing in the memory cell MC in the low resistance state LRS to sharply decrease as described above will also be referred to as a second threshold voltage.

Next, the cell current in the case where the memory cell MC is in the high resistance state HRS will be specifically described with reference to FIG. 8.

Figure 8:
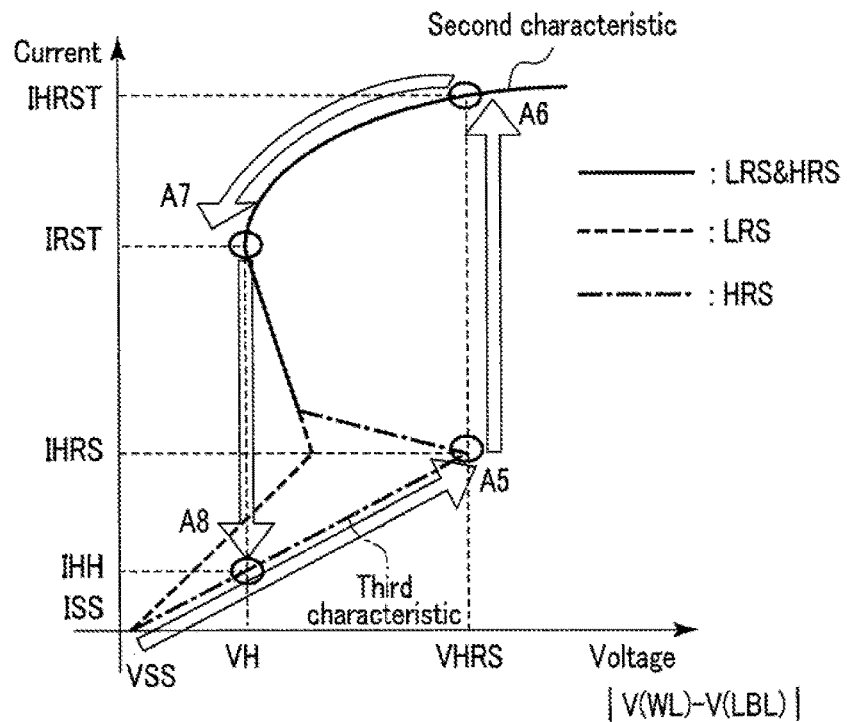
FIG. 8 is a graph showing the voltage-current (IV) characteristics of the memory cell.

As shown in FIG. 8, when the voltage applied to the memory cell MC is raised from reference voltage VSS to voltage VHRS (VSS<VHRS), the cell current increases from current ISS to current IHRS (ISS<IHRS) in accordance with the third characteristic (see arrow A5). When the voltage applied to the memory cell MC exceeds voltage VHRS, the cell current sharply increases from current IHRS to current IHRST (IHRS<<IHRST) (see arrow A6). The voltage which causes the cell current flowing in the memory cell MC in the high resistance state HRS to sharply increase as described above will also be referred to as a third threshold voltage. When the voltage applied to the memory cell MC is lowered from voltage VHRS to voltage VH (VH<VHRS), the cell current decreases from current IHRST to current IRST (IRST<IHRST) in accordance with the second characteristic (see arrow A7). When the voltage applied to the memory cell MC is lowered to or below voltage VH, the cell current sharply decreases from current IRST to current IHH (IHH<<IRST) (see arrow A8). The voltage which causes the current flowing in the memory cell MC in the high resistance state HRS to sharply decrease as described above will also be referred to as a fourth threshold voltage. In the cases shown in FIGS. 6 to 8, the second threshold voltage is equal to the fourth threshold voltage.

Figure 9:
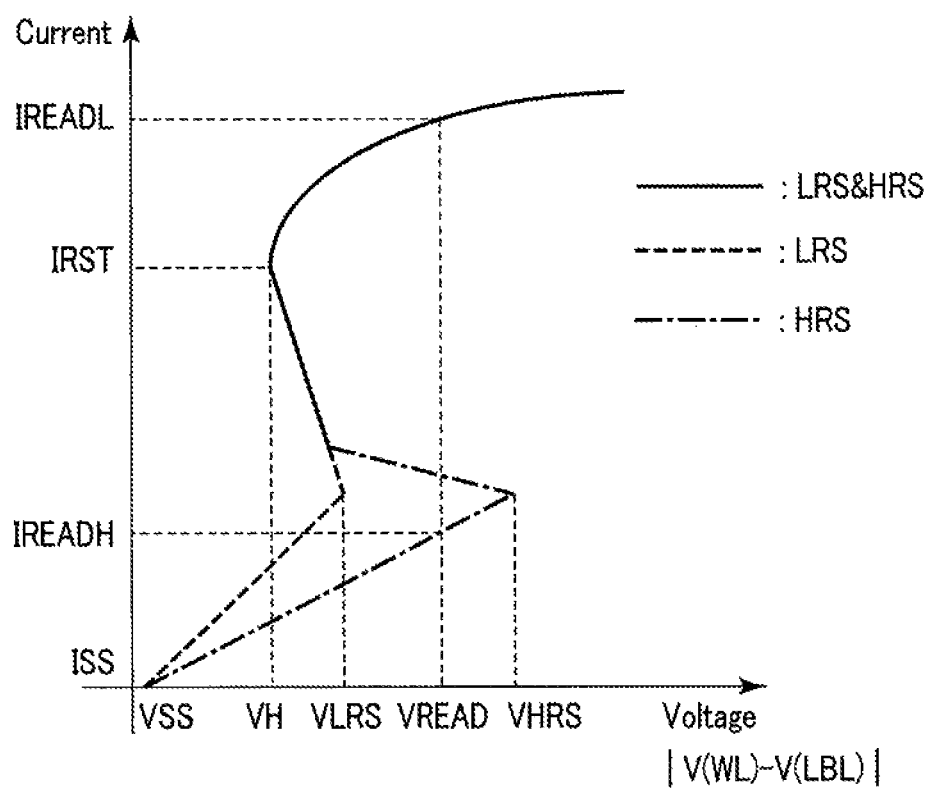
FIG. 9 is a graph showing the voltage-current (IV) characteristics of the memory cell.

Voltage VREAD for determining the resistance state of the memory cell MC will be described with reference to FIG. 9.

The voltage which causes the current flowing in the memory cell MC to sharply increase varies depending on the resistance state of the memory cell MC. Therefore, as shown in FIG. 9, read voltage VREAD is set between the first threshold voltage which causes the current flowing in the memory cell MC in the low resistance state LRS to sharply increase, and the third threshold voltage which causes the current flowing in the memory cell MC in the high resistance state HRS to sharply increase. Accordingly, the semiconductor memory device 1 can determine the resistance state of the memory cell MC based on the magnitude of the current flowing in the memory cell MC. Based on the determination result, the semiconductor memory device 1 determines data. Details of the read operation will be described later.

<1-2> Read Operation

The read operation of the semiconductor memory device according to the first embodiment will be described below.

<1-2-1> Outline

Figure 10:
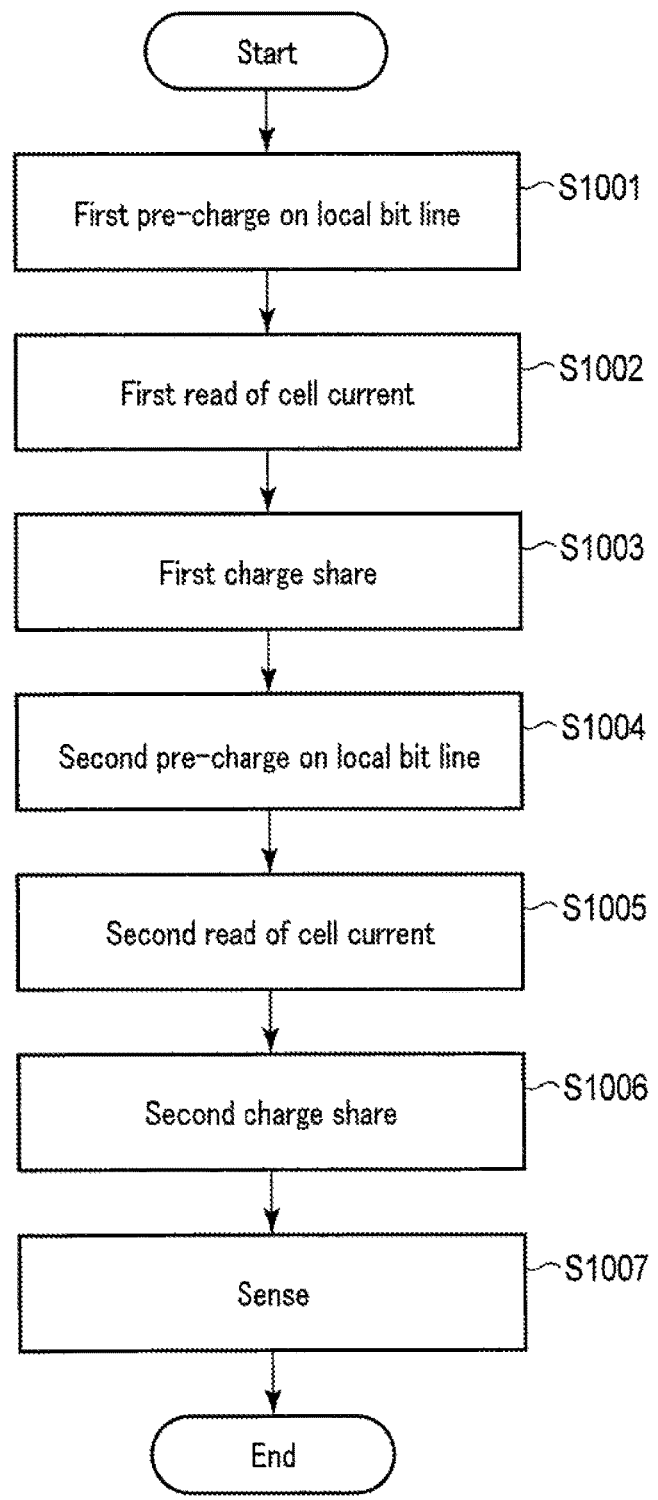
FIG. 10 is a flowchart showing the read operation of the semiconductor memory device according to the first embodiment.

The outline of the read operation of the semiconductor memory device according to the first embodiment will be described with reference to FIG. 10. FIG. 10 is a flowchart showing the read operation of the semiconductor memory device according to the first embodiment.

[Step S1001]

The sequencer 50 performs a pre-charge (first pre-charge) on the local bit line (selected local bit line) LBL coupled to the memory cell (selected memory cell) MC from which data is read.

[Step S1002]

After step S1001, the sequencer 50 performs a charge on the word line (selected word line) WL coupled to the selected memory cell MC. The pre-charge of step S1001 and the charge on the selected word line bring the voltage applied to the selected memory cell MC to voltage VREAD. Then, the cell current following in the selected memory cell MC is read at the column control circuit 120 (first read). Specifically, the cell current read result is charged into the capacitor 124 of the column control circuit 120 as the charge.

[Step S1003]

After step S1002, the sequencer 50 shares the charge charged into the capacitor 124 of the column control circuit 120 with the capacitor 213 of the voltage transfer circuit 210 (first charge share).

[Step S1004]

After step S1003, the sequencer 50 preforms a second pre-charge (second pre-charge) on the selected local bit line LBL while holding the charge charged into the capacitor 213 of the voltage transfer circuit 210.

[Step S1005]

After step S1004, the sequencer 50 stops the second pre-charge to bring the voltage applied to the selected memory cell MC to voltage VREAD. Then, the cell current following in the selected memory cell MC is read at the column control circuit 120 (second read). Specifically, the cell current read result is charged into the capacitor 124 of the column control circuit 120 as the charge.

[Step S1006]

After step S1005, the sequencer 50 shares the charge charged into the capacitor 124 of the column control circuit 120 with the capacitor 213 of the voltage transfer circuit 210 (second charge share). The charge based on the first read and the second read is thereby charged into the capacitor 213 of the voltage transfer circuit 210. By performing two charge shares in one read operation, the charge charged into capacitor 213 can be increased.

[Step S1007]

After step S1006, the sequencer 50 transfers the charge charged into capacitor 213 to the sense amplifier circuit 200. The sense amplifier circuit 200 can thereby determine the resistance state of the memory cell MC. As a result, the sense amplifier circuit 200 can read data stored in the memory cell MC.

Details of the read operation will be described below.

<1-2-2> Details of Read Operation

Details of the read operation of the semiconductor memory device according to the first embodiment will be described below.

<1-2-2-1> Memory Cell in Read Operation

In the read operation, there are a selected memory cell MC, a non-selected memory cell MC, and a semi-selected memory cell MC.

Figure 11:
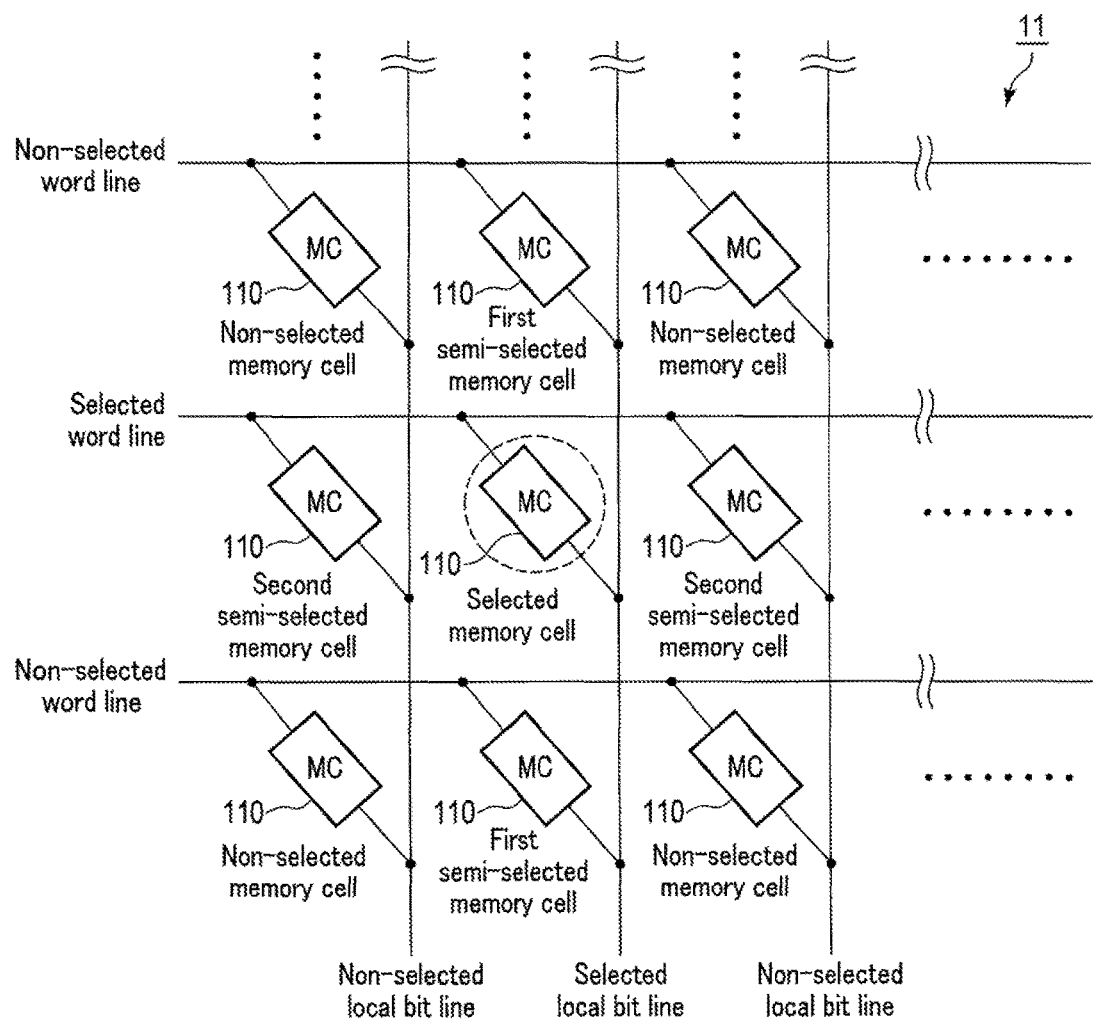
FIG. 11 is a circuit diagram showing the selected memory cell MC, non-selected memory cell MC, and semi-selected memory cell MC.

Here, the definitions of the selected memory cell MC, non-selected memory cell MC, and semi-selected memory cell MC will be described with reference to FIG. 11. FIG. 11 is a circuit diagram showing the selected memory cell MC, non-selected memory cell MC, and semi-selected memory cell MC.

As shown in FIG. 11, the selected memory cell MC is a memory cell MC to be read. The local bit line LBL coupled to the selected memory cell MC will be referred to as a selected local bit line LBL. The word line WL coupled to the selected memory cell MC will be referred to as a selected word line WL.

As shown in FIG. 11, the non-selected memory cell MC is a memory cell MC not coupled to the selected local bit line LBL or the selected word line WL. The local bit line LBL coupled to the non-selected memory cell MC will be referred to as a non-selected local bit line LBL. The word line WL coupled to the non-selected memory cell MC will be referred to as a non-selected word line WL.

As shown in FIG. 11, the semi-selected memory cell MC is not a memory cell MC to be read, but is a memory cell MC coupled to one of the selected local bit line LBL and the selected word line WL. Here, the memory cell MC coupled to the selected local bit line LBL and the non-selected word line WL will be referred to as a first semi-selected memory cell MC. The memory cell MC coupled to the non-selected local bit line LBL and the selected word line WL will be referred to as a second semi-selected memory cell MC.

<1-2-2-2> Details of Read Operation Relating to Selected Memory Cell

Figure 12:
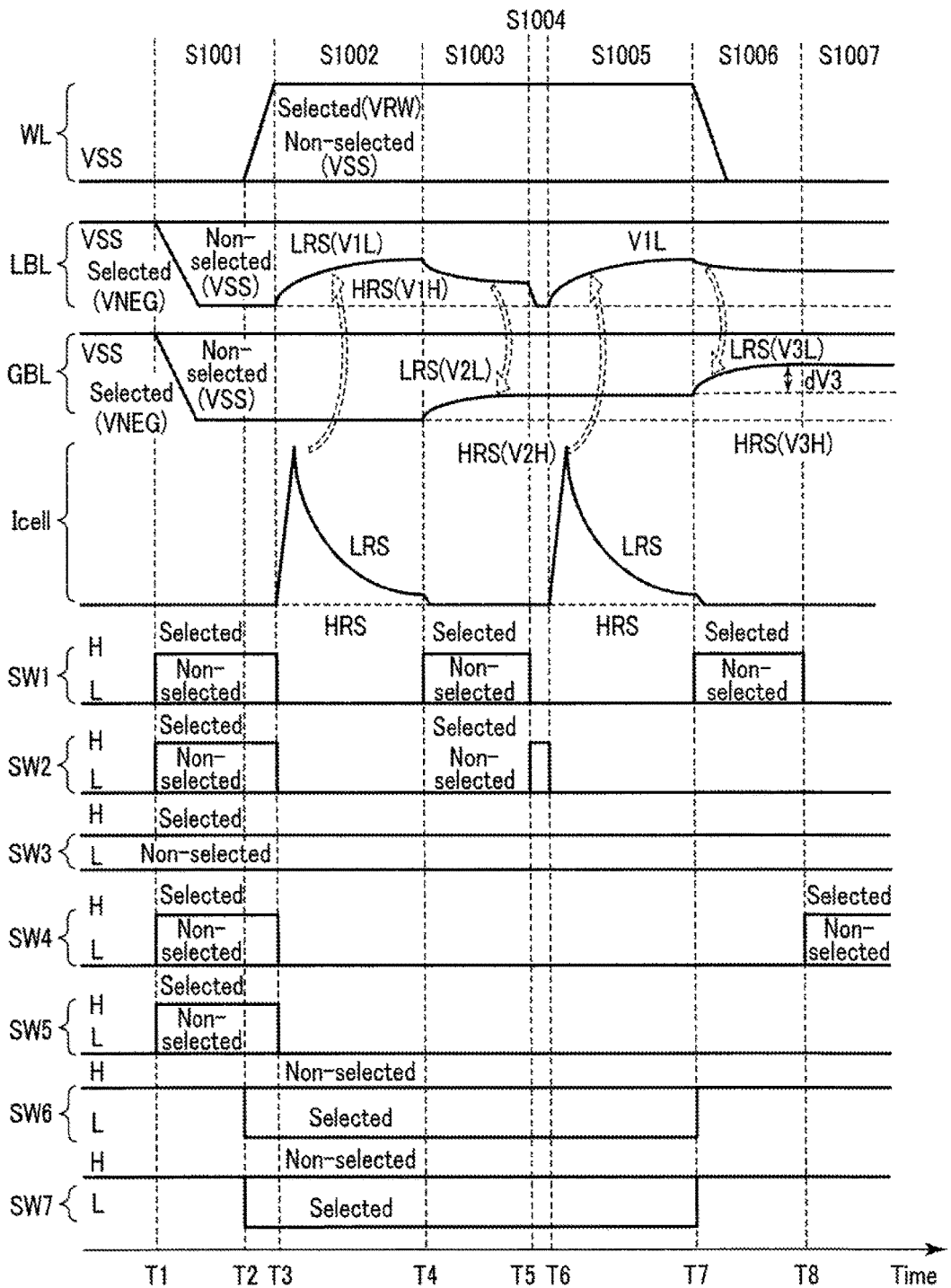
FIG. 12 is a timing chart showing the read operation of the semiconductor memory device according to the first embodiment.

Details of the read operation relating to the selected memory cell MC will be described with reference to FIG. 12. FIG. 12 is a timing chart showing the read operation of the semiconductor memory device according to the first embodiment. FIG. 12 shows the voltages of the word line WL, local bit line LBL, and global bit line GBL, the levels of signals SW1 to SW7, and the cell current Icell.

[Time T1 to Time T2] (Corresponding to Step S1001)

The operation from time T1 to time T2 relating to the selected memory cell MC will be described.

The sequencer 50 pre-charges the local bit line (selected local bit line) LBL relating to the selected memory cell MC. Specifically, the sequencer 50 brings signals SW1, SW2, and SW3 for the column control circuit (selected column control circuit) 120 coupled to the selected local bit line LBL to the "H" level. The sequencer 50 also brings signals SW4 and SW5 for the voltage transfer circuit (selected voltage transfer circuit) 210 relating to the global bit line (selected global bit line) GBL coupled to the selected column control circuit 120 to the "H" level. The sequencer 50 also brings signals SW6 and SW7 for the row control circuit (selected row control circuit) 130 coupled to the word line (selected word line) WL relating to the selected memory cell MC to the "H" level.

The operation from time T1 to time T2 relating to the selected memory cell MC will be described with reference to FIG. 13. FIG. 13 is a circuit diagram showing the operation from time T1 to time T2 relating to the selected memory cell MC. FIG. 13 shows only extracted structures relating to the selected memory cell MC. Specifically, FIG. 13 shows the selected memory cell MC, the selected local bit line LBL, the selected column control circuit 120, the selected global bit line GBL, the selected voltage transfer circuit 210, the selected sense amplifier circuit 200, the selected word line WL, the selected row control circuit 130, and the selected main word line MWL.

As shown in FIG. 13, transistors 211 and 212 of the selected voltage transfer circuit 210 are turned on from time T1 to time T2. Therefore, negative voltage VNEG is transferred to the selected global bit line GBL via transistors 211 and 212 (see arrow B1). Transistor 121 of the selected column control circuit 120 is also turned on. Therefore, negative voltage VNEG is transferred to the selected local bit line LBL via the selected global bit line GBL (see arrow B1). Transistor 122 of the selected column control circuit 120 is also turned on. Therefore, negative voltage VNEG is transferred to the selected local bit line LBL (see arrow B2). Transistor 132 of the selected row control circuit 130 is also turned on, and reference voltage VSS is transferred to the word line WL.

As shown in FIG. 13, transistor 123 of the selected column control circuit 120 and transistor 131 of the selected row control circuit 130 are turned off (brought out of conduction).

[Time T2 to Time T3] (Corresponding to Step S1001)

Referring back to FIG. 12, the operation from time T2 to time T3 relating to the selected memory cell MC will be described.

The sequencer 50 transfers read voltage (positive voltage) VRW to the selected word line while pre-charging the selected local bit line LBL. Specifically, the sequencer 50 lowers the level of signal SW6 from the "H" level to the "L" level for the selected row control circuit 130. The sequencer 50 lowers the level of signal SW7 from the "H" level to the "L" level for the selected row control circuit 130. Read voltage VRW is a voltage that brings the voltage applied to the selected memory cell MC (the absolute value of the difference between the selected word line voltage V(WL) and the selected local bit line voltage V(LBL)) to voltage VREAD.

The operation from time T2 to time T3 relating to the selected memory cell MC will be described with reference to FIG. 14. FIG. 14 is a circuit diagram showing the operation from time T2 to time T3 relating to the selected memory cell MC. Like FIG. 13, FIG. 14 shows only extracted structures relating to the selected memory cell MC.

As shown in FIG. 14, transistor 132 of the selected row control circuit 130 is turned off, and transistor 131 thereof is turned on. Therefore, voltage VRW is transferred from the selected main word line MWL to the selected word line WL via transistor 131. As a result, voltage VRW is applied to one end of the selected memory cell MC (see arrow B3).

The absolute value of the difference between the selected word line voltage V(WL) and the selected local bit line voltage V(LBL) is applied to the selected memory cell MC. A current corresponding to the absolute value of the difference flows in the selected memory cell MC as a cell current (see arrow B4).

Figure 15:
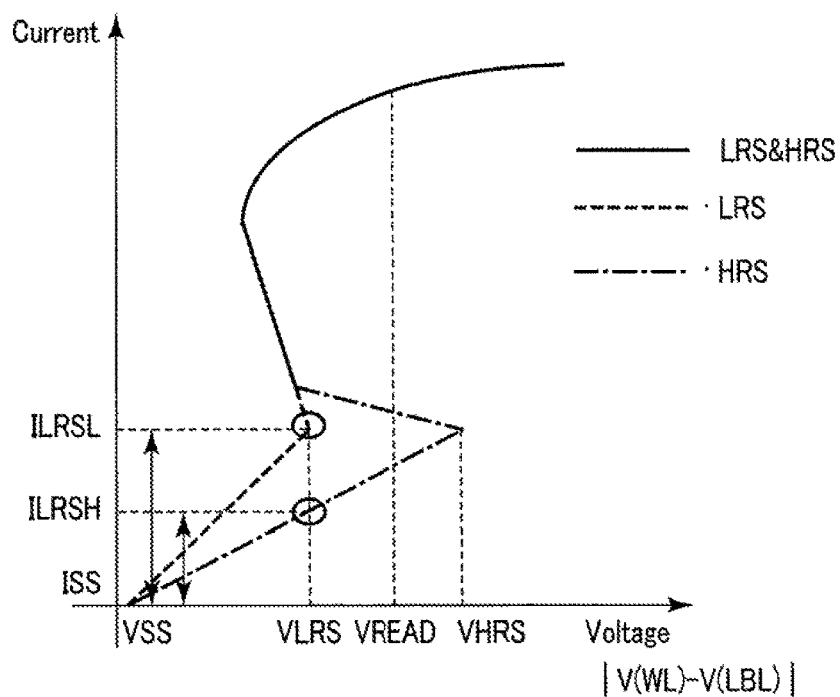
FIG. 15 is a graph showing the IV characteristics of the selected memory cell from time T2 to time T3.

Here, the IV characteristics of the selected memory cell from time T2 to time T3 will be described with reference to FIG. 15. FIG. 15 is a graph showing the IV characteristics of the selected memory cell from time T2 to time T3.

As shown in FIG. 15, the cell current Icell flowing in the memory cell MC does not sharply increase regardless of the resistance state of the memory cell MC until the difference between the selected word line voltage V(WL) and the selected local bit line voltage V(LBL) reaches voltage VLRS.

Specifically, when the selected memory cell MC is in the low resistance state, the cell current Icell is a current within the range between ISS and ILRSL until the difference between the selected word line voltage V(WL) and the selected local bit line voltage V(LBL) reaches at least voltage VLRS.

When the selected memory cell MC is in the high resistance state, the cell current Icell is a current within the range between ISS and IHRS until the difference between the selected word line voltage V(WL) and the selected local bit line voltage V(LBL) reaches at least voltage VHRS.

[Time T3 to Time T4] (Corresponding to Step S1002)

Referring back to FIG. 12, the operation from time T3 to time T4 relating to the selected memory cell MC will be described.

The sequencer 50 stops pre-charging the selected local bit line LBL, and applies the read voltage to the memory cell MC. Specifically, the sequencer 50 lowers signals SW1 and SW2 for the selected column control circuit 120 from the "H" level to the "L" level. The sequencer 50 also lowers signals SW4 and SW5 for the selected voltage transfer circuit 210 from the "H" level to the "L" level. Consequently, voltage supply to the selected local bit line LBL is stopped, and the read voltage is applied to the memory cell MC.

Figure 16:
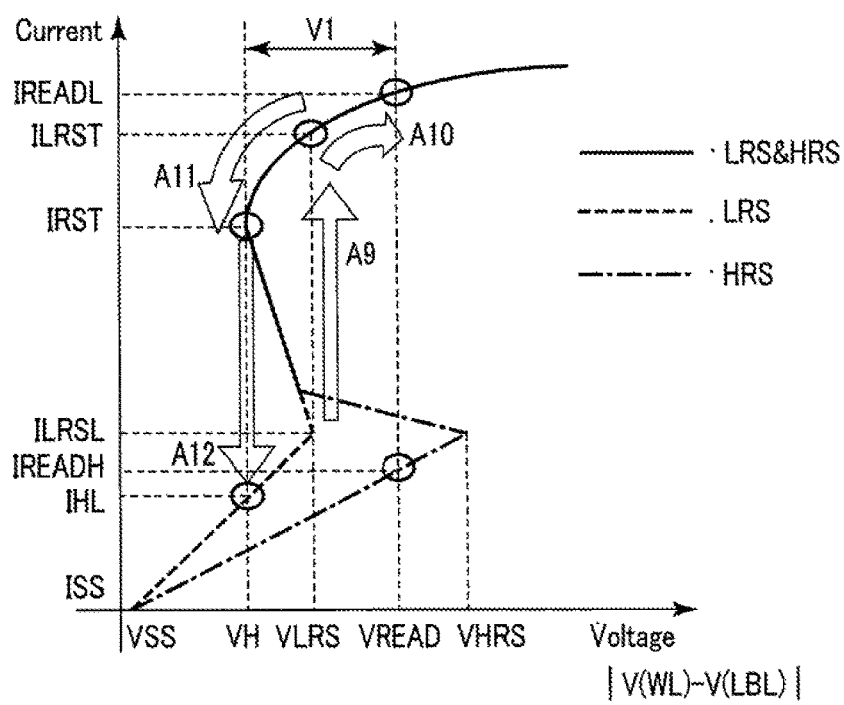
FIG. 16 is a graph showing the IV characteristics of the selected memory cell from time T3 to time T4.

Here, the IV characteristics of the selected memory cell from time T3 to time T4 will be described with reference to FIG. 16. FIG. 16 is a graph showing the IV characteristics of the selected memory cell from time T3 to time T4.

As shown in FIG. 16, the cell current Icell flowing in the selected memory cell MC in the low resistance state sharply increases when the selected word line voltage V(WL) is raised, and the difference between the selected word line voltage V(WL) and the selected local bit line voltage V(LBL) reaches voltage VLRS (see arrow A9).

Specifically, in the case where the selected memory cell MC is in the low resistance state, when the difference between the selected word line voltage V(WL) and the selected local bit line voltage V(LBL) reaches voltage VLRS, the cell current Icell sharply increases from ILRSL to ILRST (ILRSL<ILRST). When the difference between the selected word line voltage V(WL) and the selected local bit line voltage V(LBL) reaches voltage VREAD, the cell current Icell increases from ILRST to IREADL (see arrow A10).

As a large cell current flows in the selected memory cell MC from the selected word line to the selected local bit line, the selected local bit line voltage V(LBL) is raised (or charged) to voltage V1L. Accordingly, the voltage applied to the selected memory cell MC (the difference between the selected word line voltage V(WL) and the selected local bit line voltage V(LBL)) decreases. As described above, when the voltage applied to the selected memory cell MC falls to or below voltage VH, the characteristic of the memory cell MC changes from the second characteristic to the first characteristic.

In the case where the selected memory cell MC is in the high resistance state, when the difference between the selected word line voltage V(WL) and the selected local bit line voltage V(LBL) reaches voltage VREAD, the cell current Icell reaches IREADH (IREADH<<ILRST<IREADL). When the selected memory cell MC is in the high resistance state, the cell current Icell changes less than when the selected memory cell MC is in the low resistance state. As a small cell current flows in the selected memory cell MC from the selected word line to the selected local bit line, the selected local bit line voltage V(LBL) is raised to voltage V1H. This voltage V1H is approximately equal to voltage VNEG.

A charge (C1×V1) is stored in the capacitor 124 of the selected column control circuit 120 based on the voltage of the selected local bit line LBL which will be the read result.

[Time T4 to Time T5] (Corresponding to Step S1003)

Referring back to FIG. 12, the operation from time T4 to time T5 relating to the selected memory cell MC will be described.

The sequencer 50 shares the charge stored in the capacitor 124 of the selected column control circuit 120 with the capacitor 213 of the selected voltage transfer circuit 210. Specifically, the sequencer 50 brings signal SW1 for the selected column control circuit 120 to the "H" level. The selected local bit line LBL and global bit line GBL are thereby electrically coupled to each other. Accordingly, the voltage of the selected local bit line LBL is shared with the selected global bit line GBL. When the selected memory cell is in the low resistance state, the voltage of the selected global bit line GBL is raised from voltage VNEG to voltage V2L. When the selected memory cell is in the high resistance state, the voltage of the selected global bit line GBL is raised from voltage VNEG to voltage V2H.

The operation from time T4 to time T5 relating to the selected memory cell MC will be described with reference to FIG. 17. FIG. 17 is a circuit diagram showing the operation from time T4 to time T5 relating to the selected memory cell MC. Like FIG. 13, FIG. 17 shows only extracted structures relating to the selected memory cell MC.

As shown in FIG. 17, transistor 121 of the selected column control circuit 120 is turned on. Therefore, the charge (C1×V1) charged into capacitor 124 is shared with capacitor 213 via transistor 121 (see arrow B5). As a result, charge (C1×C2/(C1+C2)×V1) is held in capacitor 213.

[Time T5 to Time T6] (Corresponding to Step S1004)

Referring back to FIG. 12, the operation from time T5 to time T6 relating to the selected memory cell MC will be described.

The sequencer 50 pre-charges the selected local bit line LBL. Specifically, the sequencer 50 brings signal SW1 for the selected column control circuit 120 to the "L" level, and brings signals SW2 and SW3 therefor to the "H" level.

The operation from time T5 to time T6 relating to the selected memory cell MC will be described with reference to FIG. 18. FIG. 18 is a circuit diagram showing the operation from time T5 to time T6 relating to the selected memory cell MC. Like FIG. 13, FIG. 18 shows only extracted structures relating to the selected memory cell MC.

As shown in FIG. 18, transistor 121 of the selected column control circuit 120 is turned off. Therefore, the charge held in capacitor 213 does not flow into the selected local bit line LBL. Transistor 122 of the selected column control circuit 120 is turned on. Therefore, negative voltage VNEG is transferred to the selected local bit line LBL (see arrow B6).

[Time T6 to Time T7] (Corresponding to Step S1005)

Referring back to FIG. 12, the operation from time T6 to time T7 relating to the selected memory cell MC will be described.

The sequencer 50 stops pre-charging the selected local bit line LBL, and applies the read voltage to the memory cell MC. Specifically, the sequencer 50 lowers signal SW2 for the selected column control circuit 120 from the "H" level to the "L" level. Consequently, voltage supply to the selected local bit line LBL is stopped, and the read voltage is applied to the memory cell MC.

The operation from time T6 to time T7 relating to the selected memory cell MC will be described with reference to FIG. 19. FIG. 19 is a circuit diagram showing the operation from time T6 to time T7 relating to the selected memory cell MC. Like FIG. 13, FIG. 19 shows only extracted structures relating to the selected memory cell MC.

As shown in FIG. 19, voltage VRW is transferred from the selected main word line MWL to the selected word line WL via transistor 131. As a result, voltage VRW is applied to one end of the selected memory cell MC (see arrow B7).

The absolute value of the difference between the selected word line voltage V(WL) and the selected local bit line voltage V(LBL) is applied to the selected memory cell MC. A current corresponding to the absolute value of the difference flows in the selected memory cell MC as a cell current (see arrow B8). At this time, the cell current Icell changes in the same manner as the one described with reference to FIG. 16.

The charge (C1×V1) is stored in the capacitor 124 of the selected column control circuit 120 based on the voltage of the selected local bit line LBL which will be the read result.

[Time T7 to Time T8] (Corresponding to Step S1006)

Referring back to FIG. 12, the operation from time T7 to time T8 relating to the selected memory cell MC will be described.

The sequencer 50 shares the charge stored in the capacitor 124 of the selected column control circuit 120 with the capacitor 213 of the selected voltage transfer circuit 210. Specifically, the sequencer 50 brings signal SW1 for the selected column control circuit 120 to the "H" level. The selected local bit line LBL and global bit line GBL are thereby electrically coupled to each other. Accordingly, the voltage of the selected local bit line LBL is shared with the selected global bit line GBL. When the selected memory cell is in the low resistance state, the voltage of the selected global bit line GBL is raised from voltage V2L to voltage V3L (V3L=V2L+dV3). When the selected memory cell is in the high resistance state, the voltage of the selected global bit line GBL is raised from voltage V2H to voltage V3H.

The sequencer 50 raises the level of signal SW6 for the selected row control circuit 130 from the "L" level to the "H" level. The sequencer 50 raises the level of signal SW7 from the "L" level to the "H" level for the selected row control circuit 130. Accordingly, transistor 131 of the selected row control circuit 130 is turned off, and transistor 132 thereof is turned on. Therefore, the electric potential of the selected word line WL is brought to reference voltage VSS. As a result, the voltage applied to the selected memory cell MC is significantly lowered, and the characteristic of the selected memory cell MC is changed from the second characteristic to the first characteristic. Therefore, the cell current flowing in the selected memory cell MC significantly decreases.

The operation from time T7 to time T8 relating to the selected memory cell MC will be described with reference to FIG. 20. FIG. 20 is a circuit diagram showing the operation from time T7 to time T8 relating to the selected memory cell MC. Like FIG. 13, FIG. 20 shows only extracted structures relating to the selected memory cell MC.

As shown in FIG. 20, transistor 121 of the selected column control circuit 120 is turned on. Therefore, the charge (C1×V1) charged into capacitor 124 is shared with capacitor 213 via transistor 121 (see arrow B9). As a result, charge $(C1 \times C2/(C1+C2) \times V1) \times (2-C1/(C1+C2))$ is held in capacitor 213.

The charge $(C1 \times C2/(C1+C2) \times V1) \times (2-C1/(C1+C2))$ held in capacitor 213 is larger than the charge $(C1 \times C2/(C1+C2) \times V1)$ held in capacitor 213 from time T4 to time T5.

[After Time T8] (Corresponding to Step S1007)

Referring back to FIG. 12, the operation at time T8 relating to the selected memory cell MC will be described.

The sequencer 50 transfers the charge $(C1 \times C2/(C1+C2) \times V1) \times (2-C1/(C1+C2))$ held in capacitor 213 to the sense amplifier circuit 200. Specifically, the sequencer 50 lowers the level of signal SW1 for the selected column control circuit 120 from the "H" level to the "L" level. The sequencer 50 then raises the level of signal SW4 for the selected voltage transfer circuit 210 from the "L" level to the "H" level.

The operation at time T8 relating to the selected memory cell MC will be described with reference to FIG. 21. FIG. 21 is a circuit diagram showing the operation at time T8 relating to the selected memory cell MC. Like FIG. 13, FIG. 21 shows only extracted structures relating to the selected memory cell MC.

As shown in FIG. 21, transistor 211 of the selected voltage transfer circuit 210 is turned on. Therefore, the charge held in capacitor 213 is transferred to the sense amplifier circuit 200 (see arrow B10).

The sense amplifier circuit 200 can thereby determine the resistance state of the selected memory cell MC based on the charge $(C1 \times C2/(C1+C2) \times V1) \times (2-C1/(C1+C2))$.

<1-2-2-3> Details of Read Operation Relating to Non-Selected Memory Cell

Details of the read operation relating to the non-selected memory cell MC will be described with reference to FIG. 12.

The sequencer 50 maintains the local bit line (non-selected local bit line) LBL relating to the non-selected memory cell MC at reference voltage VSS. Specifically, the sequencer 50 brings signals SW1, SW2, and SW3 for the column control circuit (non-selected column control circuit) 120 coupled to the non-selected local bit line LBL to the "L" level. The sequencer 50 also brings signals SW4 and SW5 for the voltage transfer circuit (non-selected voltage transfer circuit) 210 relating to the global bit line (non-selected global bit line) GBL coupled to the non-selected column control circuit 120 to the "L" level. The sequencer 50 also brings signals SW6 and SW7 for the row control circuit (non-selected row control circuit) 130 coupled to the word line (non-selected word line) WL relating to the non-selected memory cell MC to the "H" level.

Accordingly, a voltage difference is not created between both ends of the non-selected memory cell MC in the read operation; therefore, the cell current does not flow in the non-selected memory cell MC.

<1-2-2-4> Details of Read Operation Relating to Semi-Selected Memory Cell

As mentioned above, there are two types of semi-selected memory cell MC.

<1-2-2-4-1> First Semi-Selected Memory Cell

Details of the read operation relating to the first semi-selected memory cell MC will be described with reference to FIG. 22. FIG. 22 is a graph showing the IV characteristics of the first semi-selected memory cell.

As described above, the first semi-selected memory cell MC is a memory cell MC coupled to a selected local bit line LBL and a non-selected word line WL.

Therefore, in the first semi-selected memory cell MC, the voltage of the word line WL is maintained at reference voltage VSS, but the local bit line LBL is supplied with negative voltage VNEG during the read operation.

As shown in FIG. 22, the absolute value of negative voltage VNEG is set not to exceed voltage VLRS. Therefore, current INEGL flows in the first semi-selected memory cell MC in the low resistance state, and current INEGH (INEGH<INEGL) flows in the first semi-selected memory cell MC in the high resistance state. The current INEGL and current INEGH are far smaller than current IREADL flowing in the selected memory cell MC in the low resistance state. Therefore, the cell current flowing in the first semi-selected memory cell MC does not influence the read operation.

<1-2-2-4-2> Second Semi-Selected Memory Cell

Details of the read operation relating to the second semi-selected memory cell MC will be described with reference to FIG. 23. FIG. 23 is a graph showing the IV characteristics of the second semi-selected memory cell.

As described above, the second semi-selected memory cell MC is a memory cell MC coupled to a non-selected local bit line LBL and a selected word line WL.

Therefore, in the second semi-selected memory cell MC, the word line WL is supplied with voltage VRW, but the local bit line LBL is maintained at reference voltage VSS during the read operation.

As shown in FIG. 23, voltage VRW is set not to exceed voltage VLRS. Therefore, current IRWL flows in the second semi-selected memory cell MC in the low resistance state, and current IRWH (IRWH<IRWL) flows in the second semi-selected memory cell MC in the high resistance state. The current IRWL and current IRWH are far smaller than current IREADL flowing in the selected memory cell MC in the low resistance state. Therefore, the cell current flowing in the second semi-selected memory cell MC does not influence the read operation.

The semiconductor memory device according to the first embodiment can convert the resistance state of the selected memory cell MC into a charge in the above-described manner. Based on the charge, the sense amplifier circuit 200 can determine data stored in the selected memory cell MC.

<1-3> Advantage

<1-3-1> Outline

According to the above-described embodiment, the semiconductor memory device performs two cell current Icell reads in one read operation. Accordingly, a larger charge can be transferred to the sense amplifier circuit 200 than in the case where only one cell current Icell read is performed. Therefore, the sense amplifier circuit 200 can satisfactorily determine data.

To explain the advantage of the present embodiment, a comparative example will be described below.

<1-3-2> Comparative Example 1

The read operation of the semiconductor memory device according to Comparative Example 1 will be described below.

Figure 25:
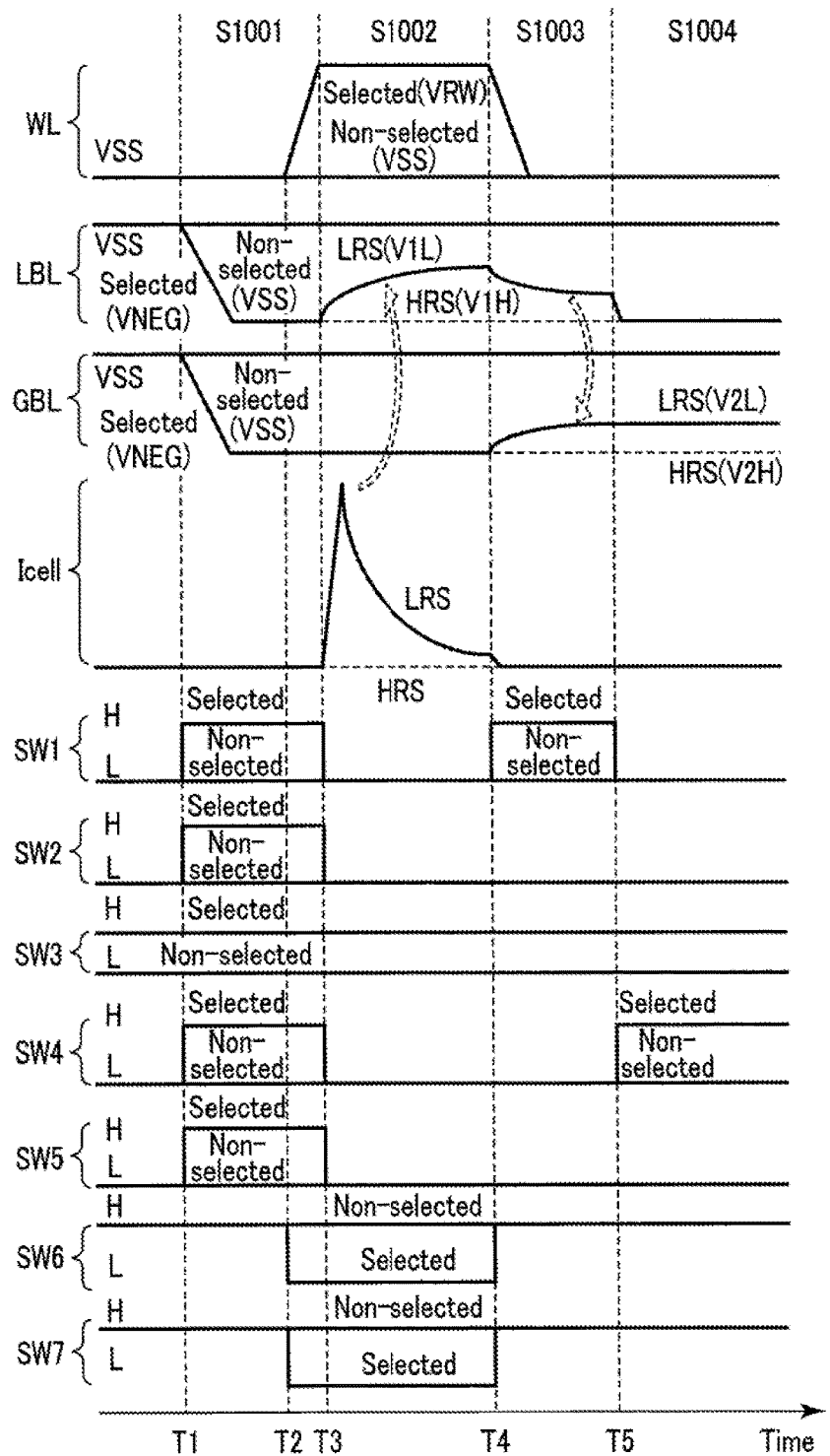
FIG. 25 is a timing chart showing the read operation of the semiconductor memory device according to Comparative Example 1.

The read operation of the semiconductor memory device according to Comparative Example 1 will be described with reference to FIGS. 24 and 25. FIG. 24 is a flowchart showing the read operation of the semiconductor memory device according to Comparative Example 1. FIG. 25 is a timing chart showing the read operation of the semiconductor memory device according to Comparative Example 1.

As shown in FIG. 24, steps S1004 to S1006 described with reference to FIG. 10 are not performed in Comparative Example 1. Namely, in Comparative Example 1, only one cell current Icell read is performed in one read operation.

Therefore, capacitor 213 only stores information on one cell current Icell read.

Unlike in the first embodiment, the operation of sharing the voltage of the selected local bit line LBL with the selected global bit line GBL is performed only once (time T4 to time T5) in Comparative Example 1, as shown in FIG. 25. Therefore, the voltage of the selected global bit line GBL after the cell current read operation is voltage V2L or V2H. In contrast, the voltage of the selected global bit line GBL after the cell current read operations is voltage V3L (V2L<V3L) or V3H (V2H<V3H) in the first embodiment. Accordingly, a smaller charge is transferred to the sense amplifier circuit 200 in Comparative Example 1 than in the first embodiment.

<1-3-3> Conclusion

In the resistance change type memory as described above, the IV characteristics of the cell limit the charge (signal amount) in a cell current Icell read. For example, if miniaturization of the semiconductor memory device is advanced, the charge in a cell current Icell read may be further decreased. As a result, the sense amplifier circuit 200 may fail to appropriately read data of the memory cell MC based on the cell current Icell.

Therefore, two cell current Icell reads are performed in one read operation as described in the above-embodiment to increase the charge in the read operation. Consequently, the sense amplifier circuit 200 can satisfactorily determine data.

<2> Second Embodiment

The second embodiment will be described. In the second embodiment, a charge share is performed while the cell current is flowing. The basic configuration and basic operation of the device according to the second embodiment are the same as those of the device according to the first embodiment. Thus, descriptions of matters described in the first embodiment and matters easily inferable from the first embodiment will be omitted.

<2-1> Read Operation

The read operation of the semiconductor memory device according to the second embodiment will be described below.

<2-1-1> Outline

The outline of the read operation of the semiconductor memory device according to the second embodiment will be described with reference to FIG. 26. FIG. 26 is a flowchart showing the read operation of the semiconductor memory device according to the second embodiment.

[Step S3001]

In step S3001, the sequencer 50 performs the same operation as that of step S1001.

[Step S3002]

After step S3001, the sequencer 50 charges the word line coupled to the selected memory cell MC. The pre-charge of step S3001 and the charge on the selected word line bring the voltage applied to the selected memory cell MC to voltage VREAD. Then, the cell current following in the selected memory cell MC is read at the column control circuit 120 (first read). Specifically, the cell current read result is charged into the capacitor 124 of the column control circuit 120 as the charge.

[Step S3003]

In step S3002, the sequencer 50 shares the charge charged into the capacitor 124 of the column control circuit 120 with the capacitor 213 of the voltage transfer circuit 210 before the characteristic of the selected memory cell MC changes from the second characteristic to the first characteristic.

Accordingly, the charge charged into the capacitor 124 of the column control circuit 120 decreases. As a result, the voltage applied to the selected memory cell MC is raised, and the charge based on the cell current is accumulated in the capacitor 213 of the voltage transfer circuit 210. By performing a charge share in the cell current read operation, the charge charged into capacitor 213 can be increased.

[Step S3004]

After step S3003, the sequencer 50 transfers the charge charged into capacitor 213 to the sense amplifier circuit 200. The sense amplifier circuit 200 can thereby determine the resistance state of the memory cell MC. As a result, the sense amplifier circuit 200 can read data stored in the memory cell.

Details of the read operation will be described below.

<2-1-2> Details of Read Operation

Details of the read operation of the semiconductor memory device according to the second embodiment will be described below.

Hereinafter, details of the read operation will be described for each of the selected memory cell, non-selected memory cell, and semi-selected memory cell.

<2-1-2-1> Details of Operation Relating to Selected Memory Cell

First, details of the operation relating to the selected memory cell MC will be described with reference to FIG. 27. FIG. 27 is a timing chart showing the read operation of the semiconductor memory device according to the second embodiment.

[Time T11 to Time T13] (Corresponding to Step S3001)

The operation from time T11 to time T13 is the same as the operation from time T1 to time T3 described with reference to FIG. 12.

[Time T13 to Time T14] (Corresponding to Step S3002)

The operation from time T13 to time T14 relating to the selected memory cell MC will be described.

The sequencer 50 stops pre-charging the selected local bit line LBL, and applies the read voltage to the memory cell MC. Specifically, the sequencer 50 lowers signals SW1 and SW2 for the selected column control circuit 120 from the "H" level to the "L" level. The sequencer 50 also lowers signals SW4 and SW5 for the selected voltage transfer circuit 210 from the "H" level to the "L" level. Consequently, voltage supply to the selected local bit line LBL is stopped, and the read voltage is applied to the memory cell MC.

Figure 28:
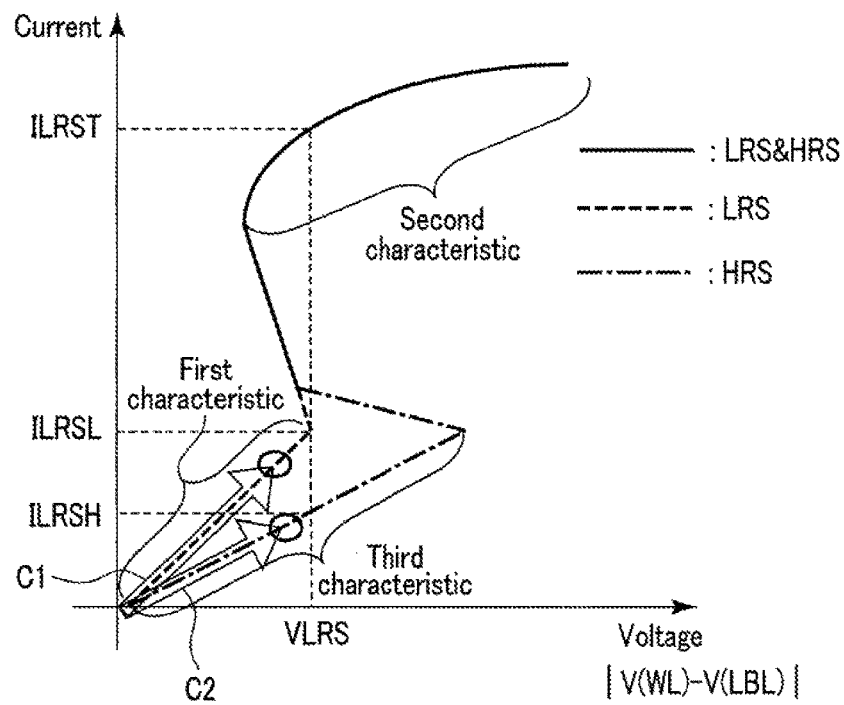
FIG. 28 is a graph showing the IV characteristics of the selected memory cell.
Figure 29:
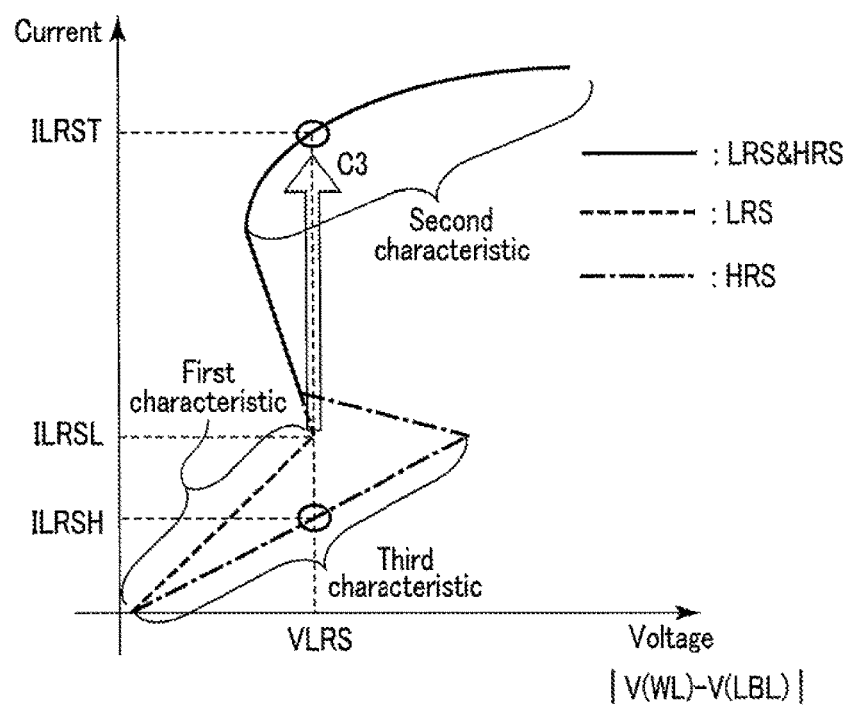
FIG. 29 is a graph showing the IV characteristics of the selected memory cell.
Figure 30:
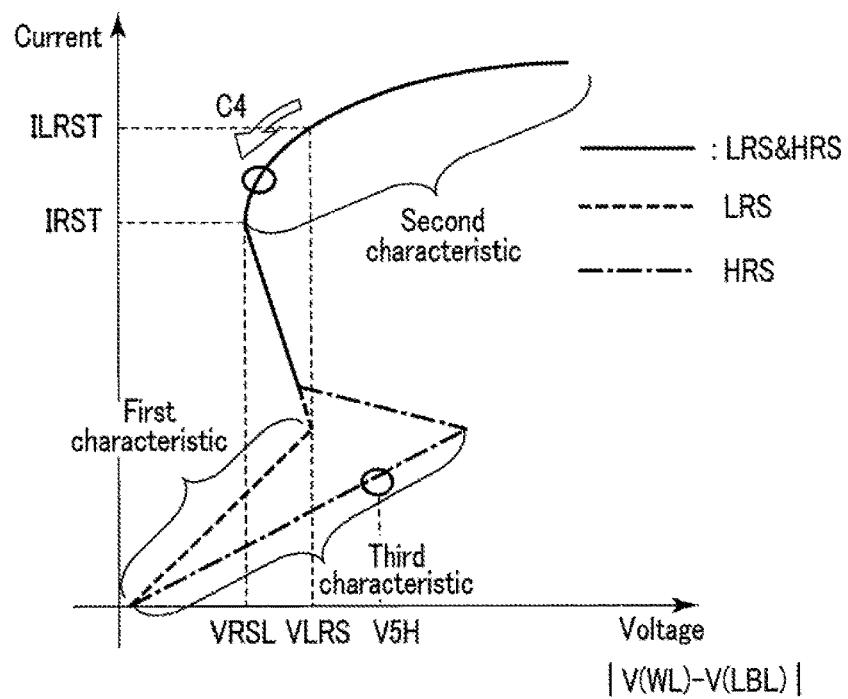
FIG. 30 is a graph showing the IV characteristics of the selected memory cell.

The cell current flowing in the selected memory cell MC will be described with reference to FIGS. 28 to 30. FIGS. 28 to 30 are graphs showing the IV characteristics of the selected memory cell.

As shown in FIG. 28, when the voltage applied to the selected memory cell MC in the low resistance state is raised from reference voltage VSS to voltage VLRS (VSS<VLRS), the cell current increases from current ISS to current ILRSL (ISS<ILRSL) in accordance with the first characteristic (see arrow C1).

When the voltage applied to the selected memory cell MC is raised from reference voltage VSS to voltage VLRS (VSS<VLRS), the cell current increases from current ISS to current ILRSH (ISS<ILRSH<ILRSL) in accordance with the third characteristic (see arrow C2).

As shown in FIG. 29, when the voltage applied to the memory cell MC in the low resistance state reaches voltage VLRS, the cell current sharply increases from current ILRSL to current ILRST (ILRSL<<ILRST) (see arrow C3). Since a large cell current flows in the selected memory cell MC from the selected word line to the selected local bit line, the selected local bit line voltage V(LBL) is raised to voltage V1L. Accordingly, the voltage applied to the selected memory cell MC (the difference between the selected word line voltage V(WL) and the selected local bit line voltage V(LBL)) decreases.

In contrast, even when the voltage applied to the memory cell MC in the high resistance state reaches voltage VLRS, the cell current changes in accordance with the third characteristic. Namely, the cell current does not sharply change unlike in the case of the selected memory cell MC in the low resistance state. As a small cell current flows in the selected memory cell MC from the selected word line to the selected local bit line, the selected local bit line voltage V(LBL) is raised to voltage V1H. This voltage V1H is approximately equal to voltage VNEG.

As shown in FIG. 30, when the voltage applied to the selected memory cell MC in the low resistance state is lowered from voltage VLRS to voltage VH (VH<VLRS), the cell current decreases from current ILRST to current IRST (IRST<ILRST) in accordance with the second characteristic (see arrow C4).

When the voltage applied to the selected memory cell MC in the high resistance state is lowered from voltage VLRS to voltage VH (VH<VLRS), the cell current changes in accordance with the third characteristic (see arrow C5).

[Time T14 to Time T17] (Corresponding to Step S3003)

Referring back to FIG. 27, the operation from time T14 to time T17 relating to the selected memory cell MC will be described.

The sequencer 50 shares the charge stored in the capacitor 124 of the selected column control circuit 120 with the capacitor 213 of the selected voltage transfer circuit 210 during the cell current read and before the characteristic of the selected memory cell MC changes from the second characteristic to the first characteristic. Specifically, the sequencer 50 brings signal SW1 for the selected column control circuit 120 to the "H" level. Therefore, transistor 121 of the selected column control circuit 120 is turned on. The selected local bit line LBL and global bit line GBL are electrically coupled to each other. As a result, the charge charged into capacitor 124 is shared with capacitor 213 via transistor 121. When the selected memory cell is in the low resistance state, the voltage of the selected global bit line GBL is raised from voltage VNEG to voltage V4L. When the selected memory cell is in the high resistance state, the voltage of the selected global bit line GBL is raised from voltage VNEG to voltage V4H.

Figure 31:
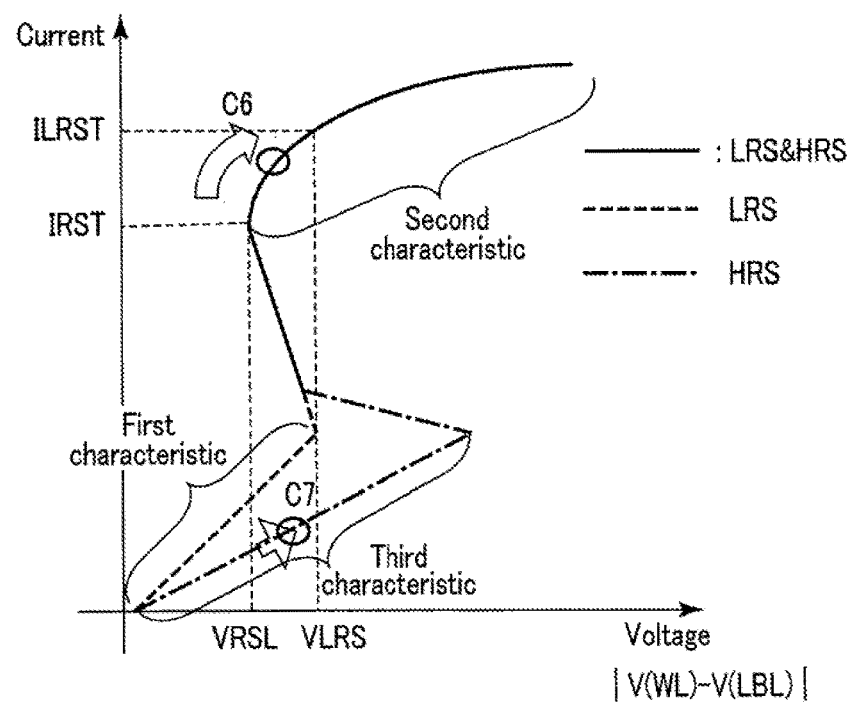
FIG. 31 is a graph showing the IV characteristics of the selected memory cell.

The cell current flowing in the selected memory cell MC will be described with reference to FIGS. 31 and 32. FIGS. 31 and 32 are graphs showing the IV characteristics of the selected memory cell.

When the voltage applied to the selected memory cell MC having the second characteristic is lowered to or below voltage VH, the cell current sharply decreases from current IRST to current IHL (IHL<<IRST). The sequencer 50 shares the charge charged into capacitor 124 with capacitor 213 before the characteristic of the selected memory cell MC changes from the second characteristic to the first characteristic. As the charge charged into capacitor 124 is shared with capacitor 213, the voltage of the selected local bit line LBL is lowered. Consequently, the difference between the voltage of the selected local bit line LBL and the voltage of the selected word line WL increases, and the voltage applied to the selected memory cell MC is raised. The cell current flowing in the selected memory cell MC in the low resistance state changes in accordance with the second characteristic as indicated by arrow C6 in FIG. 31, and the cell current flowing in the selected memory cell MC in the high resistance state changes in accordance with the third characteristic as indicated by arrow C7 in FIG. 31.

When the voltages of the selected local bit line LBL and global bit line GBL of the selected memory cell MC in the low resistance state are raised respectively to voltage V1L and voltage V5L (V5L=V4L+dV5L) at time T15 in FIG. 27, the cell current of the selected memory cell MC in the low resistance state decreases in accordance with the second characteristic as shown in FIG. 30 (see arrow C4). The voltages of the selected local bit line LBL and global bit line GBL of the selected memory cell MC in the high resistance state are raised respectively to voltage V1H and voltage V5H.

At time T16 in FIG. 27, the sequencer 50 raises the level of signal SW6 for the selected row control circuit 130 from the "L" level to the "H" level. The sequencer 50 raises the level of signal SW7 for the selected row control circuit 130 from the "L" level to the "H" level. Accordingly, transistor 131 of the selected row control circuit 130 is turned off, and transistor 132 thereof is turned on. Therefore, the electric potential of the selected word line WL is brought to reference voltage VSS. As a result, the voltage applied to the selected memory cell MC is significantly lowered. Consequently, as shown in FIG. 32, the characteristic of the selected memory cell MC in the low resistance state is changed from the second characteristic to the first characteristic (see arrow C8). Therefore, the cell current flowing in the selected memory cell MC significantly decreases.

[After Time T17] (Corresponding to Step S3004)

The operation after time T17 relating to the selected memory cell MC will be described.

The sequencer 50 transfers the charge held in capacitor 213 to the sense amplifier circuit 200. Specifically, the sequencer 50 lowers the level of signal SW1 for the selected column control circuit 120 from the "H" level to the "L" level. The sequencer 50 raises the level of signal SW4 for the selected voltage transfer circuit 210 from the "L" level to the "H" level. Transistor 211 of the selected voltage transfer circuit 210 is thereby turned on. Therefore, the charge held in capacitor 213 is transferred to the sense amplifier circuit 200.

The sense amplifier circuit 200 can thereby determine the resistance state of the selected memory cell MC based on the charge.

<2-1-2-2> Operations Relating to Non-Selected Memory Cell and Semi-Selected Memory Cell The cell current does not flow in the non-selected memory cell MC because a voltage difference is not created between both ends of the non-selected memory cell MC in the read operation for the same reason as the principle described in the first embodiment.

The cell current flowing in the semi-selected memory cell MC is very small and does not influence the read operation as the voltage applied to the semi-selected memory cell MC is set not to exceed voltage VLRS in the read operation for the same reason as the principle described in the first embodiment.

As described above, the semiconductor memory device according to the second embodiment can convert the resistance state of the selected memory cell MC into charge. Based on the charge, the sense amplifier circuit 200 can determine data stored in the selected memory cell MC.

<2-2> Advantage

<2-2-1> Outline

According to the above-described embodiment, the semiconductor memory device couples the selected local bit line LBL to the selected global bit line GBL during the cell current Icell read and before the characteristic of the selected memory cell MC is changed from the second characteristic to the first characteristic.

To explain the advantage of the present embodiment, a comparative example will be described below.

<2-2-2> Comparative Example 2

The read operation of the semiconductor memory device according to Comparative Example 2 will be described below.

Figure 33:
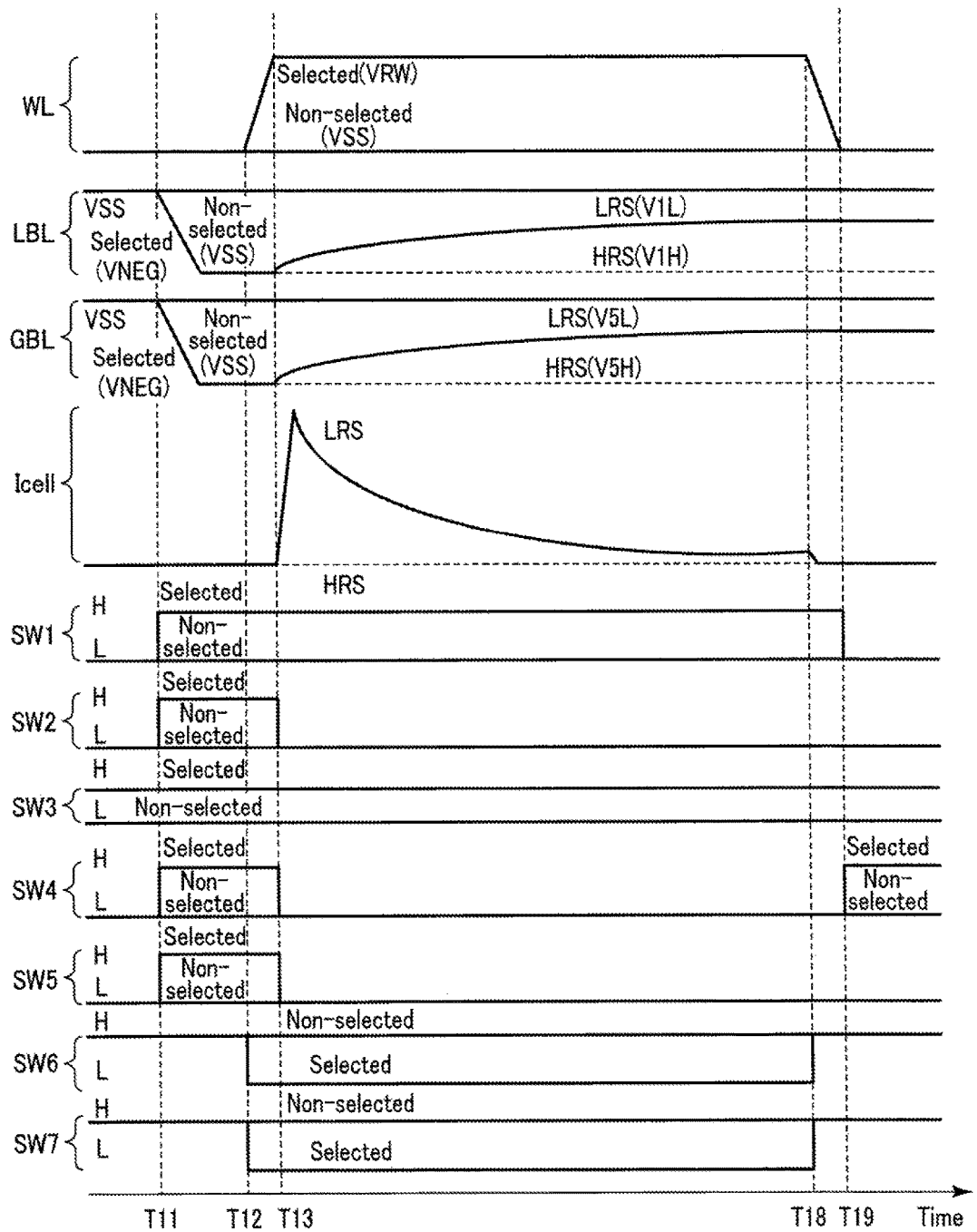
FIG. 33 is a timing chart showing the read operation of the semiconductor memory device according to Comparative Example 2.

The read operation of the semiconductor memory device according to Comparative Example 2 will be described with reference to FIG. 33. FIG. 33 is a timing chart showing the read operation of the semiconductor memory device according to Comparative Example 2.

In Comparative Example 2, the operation of sharing the charge stored in the capacitor 124 of the selected column control circuit 120 with the capacitor 213 of the selected voltage transfer circuit 210 as described in the second embodiment is not performed, and the cell current read operation is performed while maintaining the electrical coupling between capacitor 124 and capacitor 213.

Namely, as shown in FIG. 33, the sequencer 50 maintains the level of signal SW1 for the selected column control circuit 120 at the "H" level from the pre-charge of the local bit line LBL to the end of the cell current read.

Accordingly, as in the second embodiment, the charge charged into capacitor 213 can be increased in comparison with Comparative Example 1. However, the time required for the cell current read is longer than in the second embodiment. Specifically, the cell current read period of Comparative Example 2 (time T13 to time T19) is longer than the cell current read period of the second embodiment (time T13 to time T17). This is because the cell current flows through not only the selected local bit line LBL, but also the selected global bit line GBL, which has a large capacity, when the cell current read is started; therefore, it takes time to raise the voltages of the selected local bit line LBL and the selected global bit line GBL.

<2-2-3> Conclusion

According to the above-described embodiment, a larger charge is transferred to the sense amplifier circuit 200 than in the case where one cell current Icell read is performed. In addition, the period in which the peak current flows is shorter, and disturbance of the cell is smaller than in the case where the selected local bit line is coupled to the selected global bit line simultaneously with the cell current Icell read. Therefore, the sense amplifier circuit 200 can satisfactorily determine data.

<3> Third Embodiment

The third embodiment will be described. In the third embodiment, the case where a negative voltage is applied to the word line and a positive voltage is applied to the local bit line in the read operation will be described. The basic configuration and basic operation of the device according to the third embodiment are the same as those of the device according to the above-described first embodiment. Thus, descriptions of matters described in the above-described first embodiment and matters easily inferable from the first embodiment will be omitted.

<3-1> Configuration

In the read operation of the third embodiment, the sequencer 50 applies a negative voltage to the word line WL. In the read operation, the sequencer 50 applies a positive voltage to the local bit line. Hereinafter, a column switch circuit, a voltage transfer circuit, and a row switch circuit which enable the sequencer 50 to realize such operations will be described.

<3-1-1> Column Switch Circuit and Voltage Transfer Circuit

Figure 34:
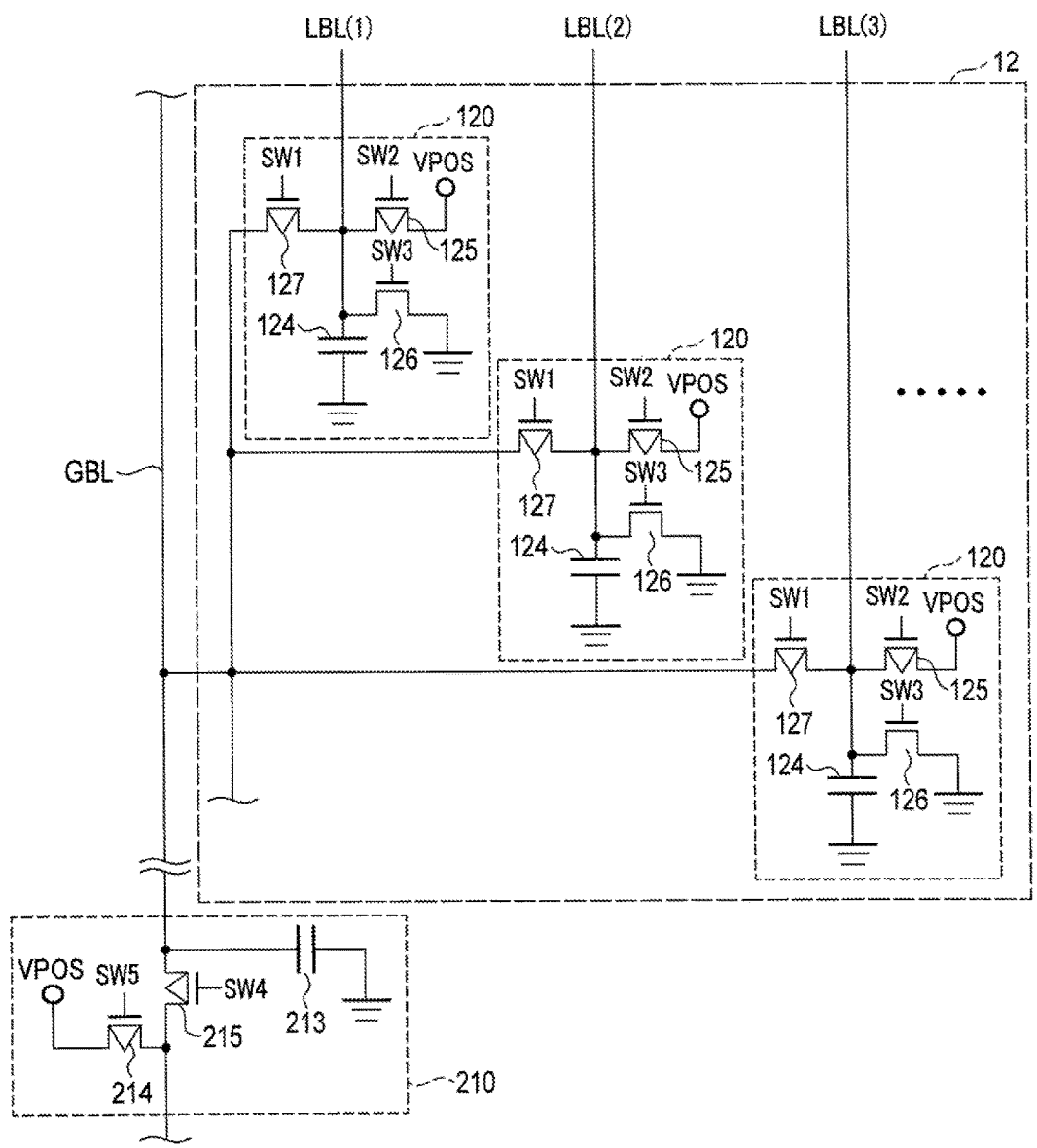
FIG. 34 is a circuit diagram showing the column switch circuit and voltage transfer circuit of the semiconductor memory device according to the third embodiment.

The column switch circuit and voltage transfer circuit of the semiconductor memory device according to the third embodiment will be described with reference to FIG. 34. FIG. 34 is a circuit diagram showing the column switch circuit and voltage transfer circuit of the semiconductor memory device according to the third embodiment.

As shown in FIG. 34, the column switch circuit 12 includes a column control circuit 120 for each local bit line LBL.

The column control circuit 120 includes a PMOS transistor 127 that controls coupling between a global bit line GBL and a local bit line LBL, and a PMOS transistor 125 that transfers positive voltage VPOS to the local bit line LBL, an NMOS transistor 126 that transfers reference voltage VSS (VSS<VPOS) to the local bit line LBL, and a capacitor 124 that accumulates the charge of the local bit line LBL.

Transistor 127 is turned on based on "L"-level signal SW1 to control coupling between the global bit line GBL and the local bit line LBL.

Transistor 125 is turned on based on "L"-level signal SW2 to transfer positive voltage VPOS to the local bit line LBL.

Transistor 126 is turned on based on "H"-level signal SW3 to transfer reference voltage VSS to the local bit line LBL.

As shown in FIG. 34, the voltage transfer circuit 210 includes a PMOS transistor 215 that controls coupling between the global bit line GBL and the sense amplifier circuit 200, a PMOS transistor 214 that transfers positive voltage VPOS to the global bit line GBL, and a capacitor 213 that accumulates the charge of the global bit line GBL.

Transistor 215 is turned on based on "L"-level signal SW4 to control coupling between the global bit line GBL and the sense amplifier circuit 200.

Transistor 214 is turned on based on "L"-level signal SW5 to transfer positive voltage VPOS to the global bit line GBL.

<3-1-2> Row Switch Circuit

The row switch circuit of the semiconductor memory device according to the third embodiment will be described with reference to FIG. 35. FIG. 35 is a circuit diagram showing the row switch circuit of the semiconductor memory device according to the third embodiment.

As shown in FIG. 35, the row switch circuit 13 includes a row control circuit 130 for each word line WL.

The row control circuit 130 includes an NMOS transistor 134 that controls coupling between a main word line MWL and a word line WL, and a PMOS transistor 133 that transfers reference voltage VSS to the word line WL.

Transistor 134 is turned on based on "H"-level signal SW7 to control coupling between the main word line MWL and the word line WL.

Transistor 133 is turned on based on "L"-level signal SW7 to transfer reference voltage VSS to the word line WL.

<3-2> Read Operation

The read operation of the semiconductor memory device according to the third embodiment will be described with reference to FIG. 36. FIG. 36 is a timing chart showing the read operation of the semiconductor memory device according to the third embodiment.

The outline of the read operation of the semiconductor memory device according to the third embodiment is the same as the one described with reference to FIG. 10. The read operation of the semiconductor memory device according to the third embodiment differs from that according to the first embodiment in that the voltages of the selected word line WL, selected local bit line LBL, and selected global bit line GBL, and the levels of signals SW2, SW3, SW5, and SW7 are inverted.

Specifically, the sequencer 50 can supply positive voltage VPOS (such as a voltage obtained by inverting the sign of negative voltage VNEG) to the selected local bit line LBL and selected global bit line GBL by inverting the levels of signals SW1 to SW5, as shown in FIG. 36. The sequencer 50 can also supply negative voltage VNRW (such as a voltage obtained by inverting the sign of positive voltage VRW) to the selected word line WL by inverting the level of signal SW7.

<3-3> Advantage

According to the above-described embodiment, the semiconductor memory device performs two cell current Icell reads in one read operation as in the first embodiment. The third embodiment differs from the first embodiment in that a negative voltage is applied to the word line, and a positive voltage is applied to the local bit line in the read operation. Even in such a case, the same advantage as that of the first embodiment can be gained.

<3-4> Modification of Third Embodiment

Next, a modification of the third embodiment will be described.

<3-4-1> Read Operation

Figure 37:
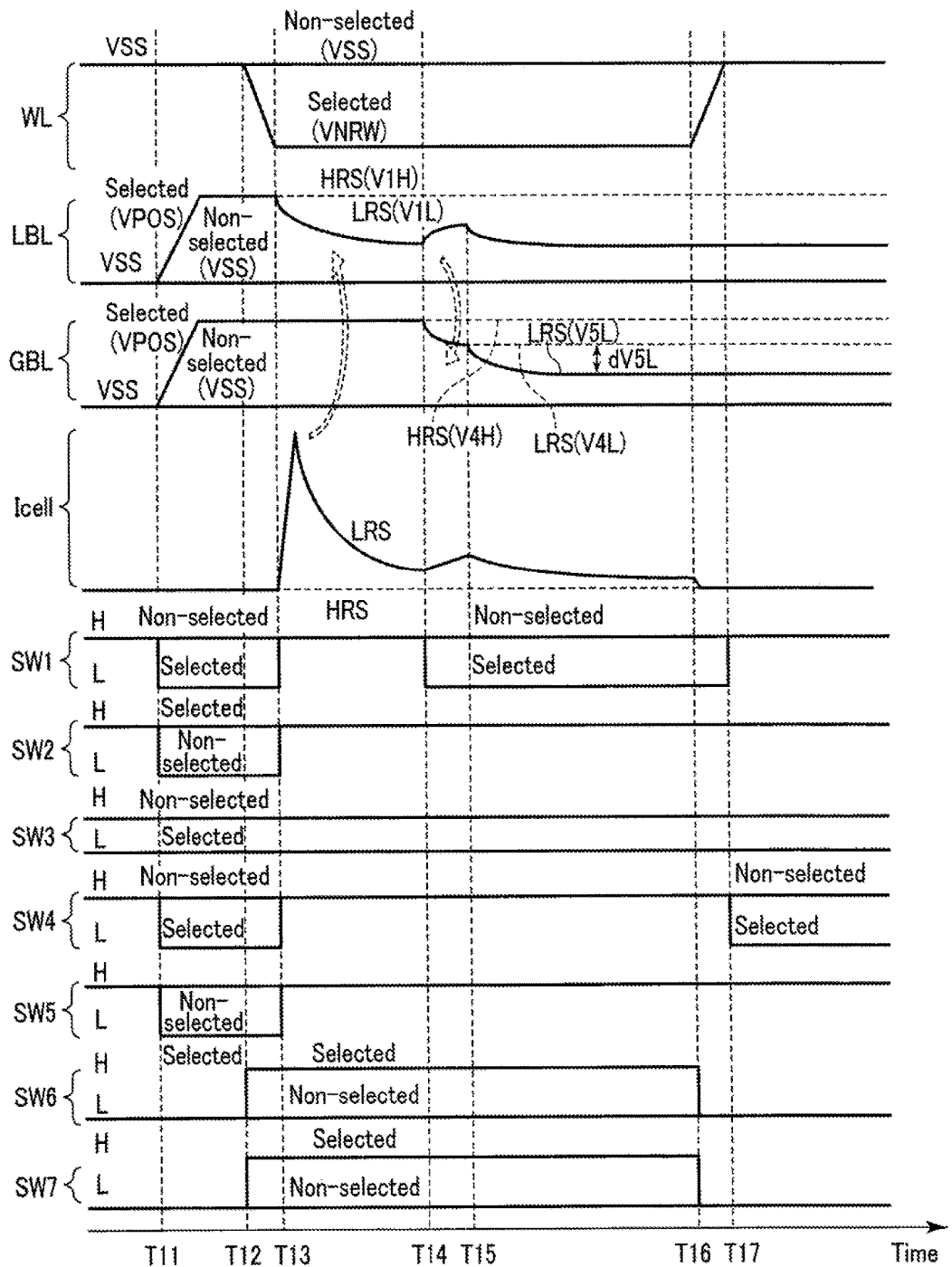
FIG. 37 is a timing chart showing the read operation of the semiconductor memory device according to the modification of the third embodiment.

The read operation of the semiconductor memory device according to the modification of the third embodiment will be described with reference to FIG. 37. FIG. 37 is a timing chart showing the read operation of the semiconductor memory device according to the modification of the third embodiment.

The outline of the read operation of the semiconductor memory device according to the modification of the third embodiment is the same as the one described with reference to FIG. 26. The read operation of the semiconductor memory device according to the modification of the third embodiment differs from that according to the second embodiment in that the voltages of the selected word line WL, selected local bit line LBL, and selected global bit line GBL, and the levels of signals SW2, SW3, SW5, and SW7 are inverted.

Specifically, the sequencer 50 can supply positive voltage VPOS (such as a voltage obtained by inverting the sign of negative voltage VNEG) to the selected local bit line LBL and selected global bit line GBL by inverting the levels of signals SW2, SW3, and SW5, as shown in FIG. 37. The sequencer 50 can also supply negative voltage VNRW (such as a voltage obtained by inverting the sign of positive voltage VRW) to the selected word line WL by inverting the level of signal SW7.

<3-4-2> Advantage

According to the above-described embodiment, the semiconductor memory device couples the selected local bit line LBL to the selected global bit line GBL during the cell current Icell read and before the characteristic of the selected memory cell MC is changed from the second characteristic to the first characteristic. The modification of the third embodiment differs from the second embodiment in that a negative voltage is applied to the word line, and a positive voltage is applied to the local bit line in the read operation. Even in such a case, the same advantage as that of the second embodiment can be gained.

<4> Fourth Embodiment

The fourth embodiment will be described. In the fourth embodiment, the case where the sense amplifier is coupled to the word line will be described. The basic configuration and basic operation of the device according to the fourth embodiment are the same as those of the device according to the above-described first embodiment. Thus, descriptions of matters described in the above-described first embodiment and matters easily inferable from the first embodiment will be omitted.

<4-1> Configuration

Hereinafter, the configuration of the case where the word line and the bit line in the first embodiment are switched will be described.

<4-1-1> Semiconductor Memory Device

A general configuration of the semiconductor memory device according to the fourth embodiment will be described with reference to FIG. 38. FIG. 38 is a block diagram showing a general configuration of the semiconductor memory device according to the fourth embodiment. The semiconductor memory device 1 of the present embodiment includes a memory cell array 10, a sense amplifier 60, a row decoder 70, a column decoder 80, and a sequencer 50.

The sense amplifier 60 includes a sense amplifier circuit for each main word line MWL. When data is read, the sense amplifier circuit senses data read from the memory cell MC to the main word line MWL. When data is written, the sense amplifier 60 supplies a voltage corresponding to write data to the memory cell MC. The voltages are provided by the sequencer 50.

The row decoder 70 decodes a row address to obtain a row address decode signal.

The sequencer 50 supplies voltages necessary for data reading and writing to, for example, the sense amplifier 60.

The sequencer 50 supplies voltages necessary for data reading, writing, and erasing to, for example, the column decoder 80.

The column decoder 80 selects a global bit line GBL based on a column address decode signal obtained by decoding a column address.

The sequencer 50 generates a voltage and a current necessary for data reading, writing, or erasing by raising or lowering a source voltage VDD supplied from outside of the semiconductor memory device 1, and supplies them to, for example, the memory cell array 10, the sense amplifier 60, the row decoder 70, or the column decoder 80.

<4-1-2> Memory Cell Array

The memory cell array 10 of the semiconductor memory device according to the fourth embodiment will be described with reference to FIG. 39. FIG. 39 is a block diagram showing the memory cell array 10 of the semiconductor memory device according to the fourth embodiment.

As shown in FIG. 39, the memory cell array 10 includes a plurality of sub-cell arrays 100 arranged in a matrix. Each sub-cell array 100 is coupled to the sense amplifier 60 via a main word line MWL.

The sense amplifier 60 includes a voltage transfer circuit 610 and a sense amplifier circuit 600 for each main word line MWL. The voltage transfer circuit 610 transfers a voltage from the main word line MWL to the sense amplifier circuit 600 or transfers a voltage to the main word line MWL. The sense amplifier circuit 600 senses data transferred by the voltage transfer circuit 610.

The sub-cell array 100 includes a MAT 11, a row switch circuit 14, and a column switch circuit 15.

The MAT 11 includes a plurality of memory cells MC arranged in a matrix on a semiconductor substrate. Details will be described later.

The row switch circuit 14 controls coupling between a main word line MWL and a word line WL based on a signal from the row decoder 70.

The column switch circuit 15 controls coupling between a global bit line GBL and a local bit line LBL based on a signal from the sequencer 50.

<4-1-3> Row Switch Circuit and Voltage Transfer Circuit

The row switch circuit and voltage transfer circuit of the semiconductor memory device according to the fourth embodiment will be described with reference to FIG. 40. FIG. 40 is a circuit diagram showing the row switch circuit and voltage transfer circuit of the semiconductor memory device according to the fourth embodiment.

As shown in FIG. 40, the row switch circuit 14 includes a row control circuit 140 for each word line WL.

The row control circuit 140 includes an NMOS transistor 141 that controls coupling between a main word line MWL and a word line WL, an NMOS transistor 142 that transfers negative voltage VNEG to the word line WL, a PMOS transistor 143 that transfers reference voltage VSS (VNEG<VSS) to the word line WL, and a capacitor 144 that accumulates the charge of the word line WL.

Transistor 141 is turned on (brought into conduction) based on "H"-level signal SW1 to couple the main word line MWL to the word line WL.

Transistor 142 is turned on based on "H"-level signal SW2 to transfer negative voltage VNEG to the word line WL.

Transistor 143 is turned on based on "L"-level signal SW3 to transfer reference voltage VSS to the word line WL.

One end of the capacitor 144 is coupled to the word line WL, and the other end thereof is supplied with reference voltage VSS. The capacitance of the capacitor 144 is C1. The capacitor 144 is, for example, the word line WL itself.

As shown in FIG. 40, the voltage transfer circuit 610 includes an NMOS transistor 611 that controls coupling between the main word line MWL and the sense amplifier circuit 600, an NMOS transistor 612 that transfers negative voltage VNEG to the main word line MWL, and a capacitor 613 that accumulates the charge of the main word line MWL.

Transistor 611 is turned on based on "H"-level signal SW4 to couple the main word line MWL to the sense amplifier circuit 600.

Transistor 612 is turned on based on "H"-level signal SW5 to transfer negative voltage VNEG to the main word line MWL.

One end of the capacitor 613 is coupled to the main word line MWL, and the other end thereof is supplied with reference voltage VSS. The capacitance of the capacitor 613 is C2. The capacitor 613 is, for example, the main word line MWL itself.

<4-1-4> Column Switch Circuit

The column switch circuit of the semiconductor memory device according to the fourth embodiment will be described with reference to FIG. 41. FIG. 41 is a circuit diagram showing the column switch circuit of the semiconductor memory device according to the fourth embodiment.

As shown in FIG. 41, the column switch circuit 15 includes a column control circuit 150 for each local bit line LBL.

The column control circuit 150 includes a PMOS transistor 151 that controls coupling between a global bit line GBL and a local bit line LBL, and an NMOS transistor 152 that transfers reference voltage VSS to the local bit line LBL.

Transistor 151 is turned on based on "L"-level signal SW6 to couple the global bit line GBL to the local bit line LBL.

Transistor 152 is turned on based on "H"-level signal SW7 to transfer reference voltage VSS to the local bit line LBL.

<4-2> Read Operation

The read operation of the semiconductor memory device according to the fourth embodiment will be described below.

<4-2-1> Outline

The outline of the read operation of the semiconductor memory device according to the fourth embodiment will be described with reference to FIG. 42. FIG. 42 is a flowchart showing the read operation of the semiconductor memory device according to the fourth embodiment.

[Step S4001]

The sequencer 50 performs a pre-charge (first pre-charge) on the word line (selected word line) WL coupled to the memory cell (selected memory cell) MC from which data is read.

[Step S4002]

After step S4001, the sequencer 50 performs a charge on the local bit line (selected local bit line) LBL coupled to the selected memory cell MC. The pre-charge of step S4001 and the charge on the selected local bit line LBL bring the voltage applied to the selected memory cell MC to voltage VREAD. Then, the cell current following in the selected memory cell MC is read at the row control circuit 140 (first read). Specifically, the cell current read result is charged into the capacitor 144 of the row control circuit 140 as charge.

[Step S4003]

After step S4002, the sequencer 50 shares the charge charged into the capacitor 144 of the row control circuit 140 with the capacitor 613 of the voltage transfer circuit 610 (first charge share).

[Step S4004]

After step S4003, the sequencer 50 preforms a second pre-charge (second pre-charge) on the selected word line WL while holding the charge charged into the capacitor 613 of the voltage transfer circuit 610.

[Step S4005]

After step S4004, the sequencer 50 stops the second pre-charge to bring the voltage applied to the selected memory cell MC to voltage VREAD. Then, the cell current following in the selected memory cell MC is read at the row control circuit 140 (second read). Specifically, the cell current read result is charged into the capacitor 144 of the row control circuit 140 as the charge.

[Step S4006]

After step S4005, the sequencer 50 shares the charge charged into the capacitor 144 of the row control circuit 140 with the capacitor 613 of the voltage transfer circuit 610 (second charge share). The charge based on the first read and the second read are thereby charged into the capacitor 613 of the voltage transfer circuit 610. By performing two charge shares in one read operation, the charge charged into capacitor 613 can be increased.

[Step S4007]

After step S4006, the sequencer 50 transfers the charge charged into capacitor 613 to the sense amplifier circuit 600. The sense amplifier circuit 600 can thereby determine the resistance state of the memory cell MC. As a result, the sense amplifier circuit 600 can read data stored in the memory cell MC.

Details of the read operation will be described below.

<4-2-2> Details of Read Operation

Details of the read operation of the semiconductor memory device according to the fourth embodiment will be described below.

Hereinafter, details of the read operation will be described for each of the selected memory cell MC, non-selected memory cell MC, and semi-selected memory cell MC.

<4-2-2-1> Details of Read Operation Relating to Selected Memory Cell

Figure 43:
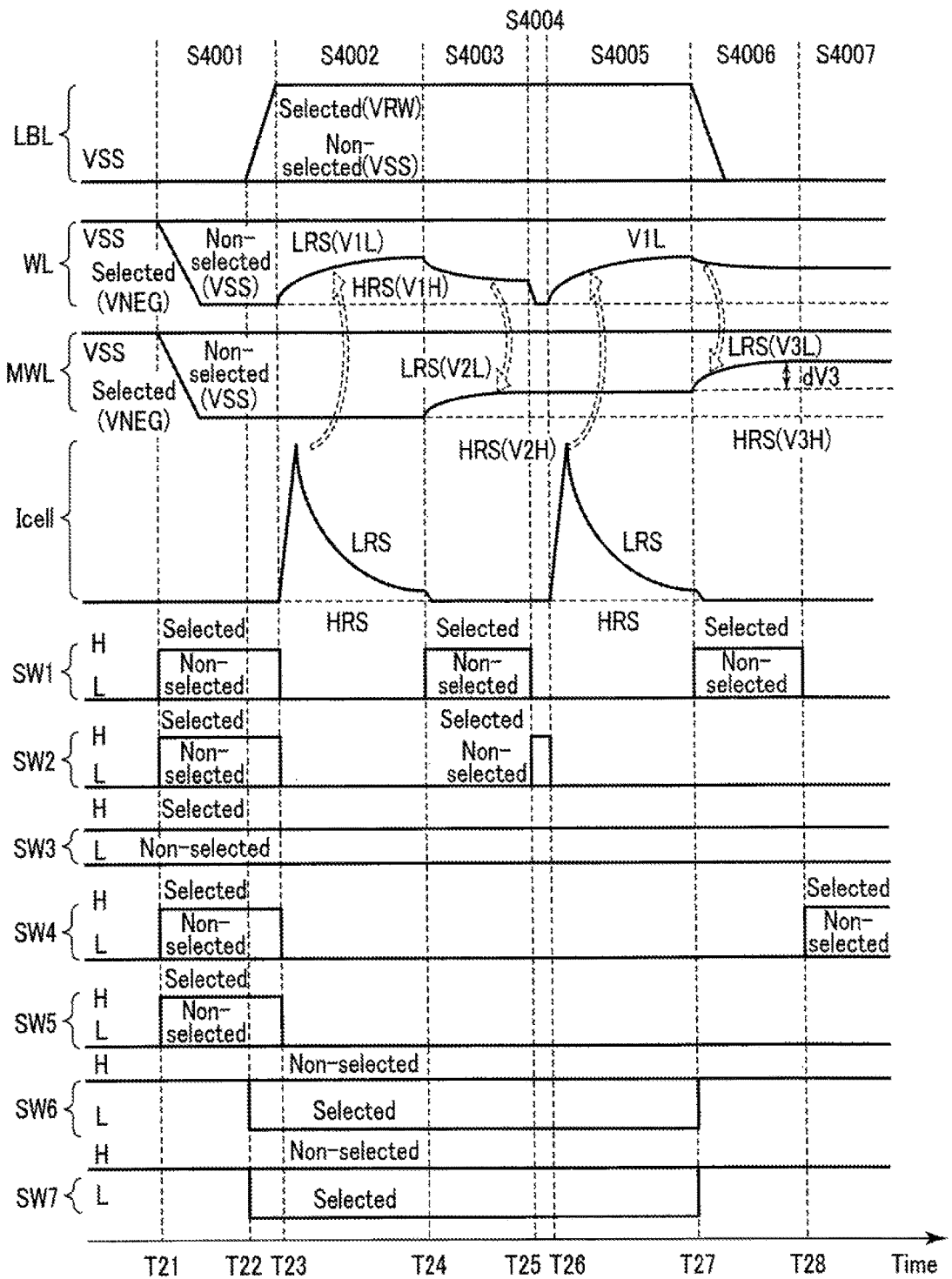
FIG. 43 is a timing chart showing the read operation of the semiconductor memory device according to the fourth embodiment.

Details of the read operation relating to the selected memory cell MC will be described with reference to FIG. 43. FIG. 43 is a timing chart showing the read operation of the semiconductor memory device according to the fourth embodiment. FIG. 43 shows the voltages of the local bit line LBL, word line WL, and main word line MWL, the levels of signals SW1 to SW7, and the cell current Icell.

[Time T21 to Time T22] (Corresponding to Step S4001)

The operation from time T21 to time T22 relating to the selected memory cell MC will be described.

The sequencer 50 pre-charges the word line (selected word line) WL relating to the selected memory cell MC. Specifically, the sequencer 50 brings signals SW1, SW2, and SW3 for the row control circuit (selected row control circuit) 140 coupled to the selected word line WL to the "H" level. The sequencer 50 also brings signals SW4 and SW5 for the voltage transfer circuit (selected voltage transfer circuit) 610 relating to the main word line (selected main word line) MWL coupled to the selected row control circuit 140 to the "H" level. The sequencer 50 also brings signals SW6 and SW7 for the column control circuit (selected column control circuit) 150 coupled to the local bit line (selected local bit line) LBL relating to the selected memory cell MC to the "H" level.

Figure 44:
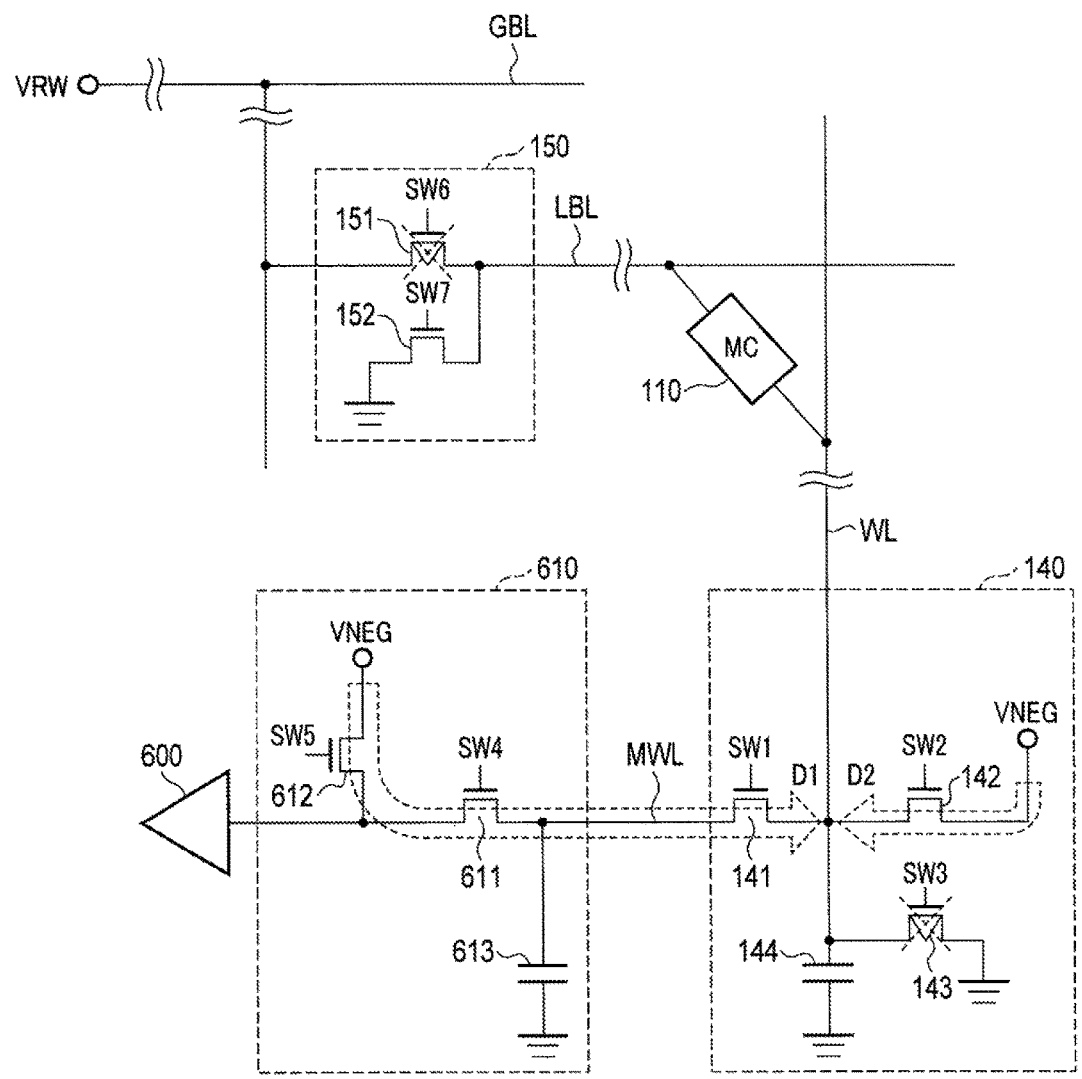
FIG. 44 is a circuit diagram showing the operation from time T21 to time T22 relating to the selected memory cell MC.

The operation from time T21 to time T22 relating to the selected memory cell MC will be described with reference to FIG. 44. FIG. 44 is a circuit diagram showing the operation from time T21 to time T22 relating to the selected memory cell MC. FIG. 44 shows only extracted structures relating to the selected memory cell MC. Specifically, FIG. 44 shows the selected memory cell MC, the selected word line WL, the selected row control circuit 140, the selected main word line MWL, the selected voltage transfer circuit 610, the selected sense amplifier circuit 600, the selected local bit line LBL, the selected column control circuit 150, and the selected global bit line GBL.

As shown in FIG. 44, transistors 611 and 612 of the selected voltage transfer circuit 610 are turned on from time T21 to time T22. Therefore, negative voltage VNEG is transferred to the selected main word line MWL via transistors 611 and 612 (see arrow D1). Transistor 141 of the selected row control circuit 140 is turned on. Therefore, negative voltage VNEG is transferred to the selected word line WL via the selected main word line MWL (see arrow D1). Transistor 142 of the selected row control circuit 140 is turned on. Therefore, negative voltage VNEG is transferred to the selected word line WL (see arrow D2). Transistor 152 of the selected column control circuit 150 is also turned on, and reference voltage VSS is transferred to the local bit line LBL.

As shown in FIG. 44, transistor 143 of the selected row control circuit 140 and transistor 151 of the selected column control circuit 150 are turned off.

[Time T22 to Time T23] (Corresponding to Step S4001)

Referring back to FIG. 43, the operation from time T22 to time T23 relating to the selected memory cell MC will be described.

The sequencer 50 transfers read voltage (positive voltage) VRW to the selected local bit line while pre-charging the selected word line WL. Specifically, the sequencer 50 lowers the level of signal SW6 from the "H" level to the "L" level for the selected column control circuit 150. The sequencer 50 lowers the level of signal SW7 from the "H" level to the "L" level for the selected column control circuit 150. Read voltage VRW is a voltage that brings the voltage applied to the selected memory cell MC (the absolute value of the difference between the selected word line voltage V(WL) and the selected local bit line voltage V(LBL)) to voltage VREAD.

The operation from time T22 to time T23 relating to the selected memory cell MC will be described with reference to FIG. 45. FIG. 45 is a circuit diagram showing the operation from time T22 to time T23 relating to the selected memory cell MC. Like FIG. 44, FIG. 45 shows only extracted structures relating to the selected memory cell MC.

As shown in FIG. 45, transistor 152 of the selected column control circuit 150 is turned off, and transistor 151 thereof is turned on. Therefore, voltage VRW is transferred from the selected global bit line GBL to the selected local bit line LBL via transistor 151. As a result, voltage VRW is applied to one end of the selected memory cell MC (see arrow D3).

The absolute value of the difference between the selected word line voltage V(WL) and the selected local bit line voltage V(LBL) is applied to the selected memory cell MC. A current corresponding to the absolute value of the difference flows in the selected memory cell MC as a cell current (see arrow D4).

The cell current from time T22 to time T23 is the same as that described with reference to FIG. 15.

[Time T23 to Time T24] (Corresponding to Step S4002)

Referring back to FIG. 43, the operation from time T23 to time T24 relating to the selected memory cell MC will be described.

The sequencer 50 stops pre-charging the selected word line WL, and applies the read voltage to the memory cell MC. Specifically, the sequencer 50 lowers signals SW1 and SW2 for the selected row control circuit 140 from the "H" level to the "L" level. The sequencer 50 also lowers signals SW4 and SW5 for the selected voltage transfer circuit 610 from the "H" level to the "L" level. Consequently, voltage supply to the selected word line WL is stopped, and the read voltage is applied to the memory cell MC.

The cell current from time T23 to time T24 is the same as that described with reference to FIG. 16.

The charge (C1×V1) is stored in the capacitor 144 of the selected row control circuit 140 based on the voltage of the selected word line WL which will be the read result.

[Time T24 to Time T25] (Corresponding to Step S4003)

Referring back to FIG. 43, the operation from time T24 to time T25 relating to the selected memory cell MC will be described.

The sequencer 50 shares the charge stored in the capacitor 144 of the selected row control circuit 140 with the capacitor 613 of the selected voltage transfer circuit 610. Specifically, the sequencer 50 brings signal SW1 for the selected row control circuit 140 to the "H" level. The selected word line WL and main word line MWL are thereby electrically coupled to each other. Accordingly, the voltage of the selected word line WL is shared with the selected main word line MWL. When the selected memory cell is in the low resistance state, the voltage of the selected main word line MWL is raised from voltage VNEG to voltage V2L. When the selected memory cell is in the high resistance state, the voltage of the selected main word line MWL is raised from voltage VNEG to voltage V2H.

The operation from time T24 to time T25 relating to the selected memory cell MC will be described with reference to FIG. 46. FIG. 46 is a circuit diagram showing the operation from time T24 to time T25 relating to the selected memory cell MC. Like FIG. 44, FIG. 46 shows only extracted structures relating to the selected memory cell MC.

As shown in FIG. 46, transistor 141 of the selected row control circuit 140 is turned on. Therefore, the charge (C1×V1) charged into capacitor 144 is shared with capacitor 613 via transistor 141 (see arrow D5). As a result, charge (C1×C2/(C1+C2)×V1) is held in capacitor 613.

[Time T25 to Time T26] (Corresponding to Step S4004)

Referring back to FIG. 43, the operation from time T25 to time T26 relating to the selected memory cell MC will be described.

The sequencer 50 pre-charges the selected word line WL. Specifically, the sequencer 50 brings signal SW1 for the selected row control circuit 140 to the "L" level, and brings signals SW2 and SW3 therefor to the "H" level.

The operation from time T25 to time T26 relating to the selected memory cell MC will be described with reference to FIG. 47. FIG. 47 is a circuit diagram showing the operation from time T25 to time T26 relating to the selected memory cell MC. Like FIG. 44, FIG. 47 shows only extracted structures relating to the selected memory cell MC.

As shown in FIG. 47, transistor 141 of the selected row control circuit 140 is turned off. Therefore, the charge held in capacitor 613 does not flow into the selected word line WL. Transistor 142 of the selected row control circuit 140 is turned on. Therefore, negative voltage VNEG is transferred to the selected word line WL (see arrow D6).

[Time T26 to Time T27] (Corresponding to Step S4005)

Referring back to FIG. 43, the operation from time T26 to time T27 relating to the selected memory cell MC will be described.

The sequencer 50 stops pre-charging the selected word line WL, and applies the read voltage to the memory cell MC. Specifically, the sequencer 50 lowers signal SW2 for the selected row control circuit 140 from the "H" level to the "L" level. Consequently, voltage supply to the selected word line WL is stopped, and the read voltage is applied to the memory cell MC.

The operation from time T26 to time T27 relating to the selected memory cell MC will be described with reference to FIG. 48. FIG. 48 is a circuit diagram showing the operation from time T26 to time T27 relating to the selected memory cell MC. Like FIG. 44, FIG. 48 shows only extracted structures relating to the selected memory cell MC.

As shown in FIG. 48, voltage VRW is transferred from the selected global bit line GBL to the selected local bit line LBL via transistor 151. As a result, voltage VRW is applied to one end of the selected memory cell MC (see arrow D7).

The absolute value of the difference between the selected word line voltage V(WL) and the selected local bit line voltage V(LBL) is applied to the selected memory cell MC. A current corresponding to the absolute value of the difference flows in the selected memory cell MC as a cell current (see arrow D8). At this time, the cell current Icell changes in the same manner as the one described with reference to FIG. 16.

The charge (C1×V1) is stored in the capacitor 144 of the selected row control circuit 140 based on the voltage of the selected word line WL which will be the read result.

[Time T27 to Time T28] (Corresponding to Step S4006)

Referring back to FIG. 43, the operation from time T27 to time T28 relating to the selected memory cell MC will be described.

The sequencer 50 shares the charge stored in the capacitor 144 of the selected row control circuit 140 with the capacitor 613 of the selected voltage transfer circuit 610. Specifically, the sequencer 50 brings signal SW1 for the selected row control circuit 140 to the "H" level. The selected word line WL and main word line MWL are thereby electrically coupled to each other. Accordingly, the voltage of the selected word line WL is shared with the selected main word line MWL. When the selected memory cell is in the low resistance state, the voltage of the selected main word line MWL is raised from voltage V2L to voltage V3L (V3L=V2L+dV3). When the selected memory cell is in the high resistance state, the voltage of the selected main word line MWL is raised from voltage V2H to voltage V3H.

The sequencer 50 raises the level of signal SW6 for the selected column control circuit 150 from the "L" level to the "H" level. The sequencer 50 raises the level of signal SW7 from the "L" level to the "H" level for the selected column control circuit 150. Accordingly, transistor 151 of the selected column control circuit 150 is turned off, and transistor 152 thereof is turned on. Therefore, the electric potential of the selected local bit line LBL is brought to reference voltage VSS. As a result, the voltage applied to the selected memory cell MC is significantly lowered, and the characteristic of the selected memory cell MC is changed from the second characteristic to the first characteristic. Therefore, the cell current flowing in the selected memory cell MC significantly decreases.

The operation from time T27 to time T28 relating to the selected memory cell MC will be described with reference to FIG. 49. FIG. 49 is a circuit diagram showing the operation from time T27 to time T28 relating to the selected memory cell MC. Like FIG. 44, FIG. 49 shows only extracted structures relating to the selected memory cell MC.

As shown in FIG. 49, transistor 141 of the selected row control circuit 140 is turned on. Therefore, the charge (C1×V1) charged into capacitor 144 is shared with capacitor 613 via transistor 141 (see arrow D9). As a result, charge (C1×C2/(C1+C2)×V1)×(2−C1/(C1+C2)) is held in capacitor 613.

The charge (C1×C2/(C1+C2)×V1)×(2−C1/(C1+C2)) held in capacitor 613 is larger than the charge (C1×C2/(C1+C2)× V1) held in capacitor 613 from time T24 to time T25.

[After Time T28] (Corresponding to Step S4007)

Referring back to FIG. 43, the operation after time T28 relating to the selected memory cell MC will be described.

The sequencer 50 transfers the charge (C1×C2/(C1+C2)× V1)×(2−C1/(C1+C2)) held in capacitor 613 to the sense amplifier circuit 600. Specifically, the sequencer 50 lowers the level of signal SW1 for the selected row control circuit 140 from the "H" level to the "L" level. The sequencer 50 raises the level of signal SW4 for the selected voltage transfer circuit 610 from the "L" level to the "H" level.

Figure 50:
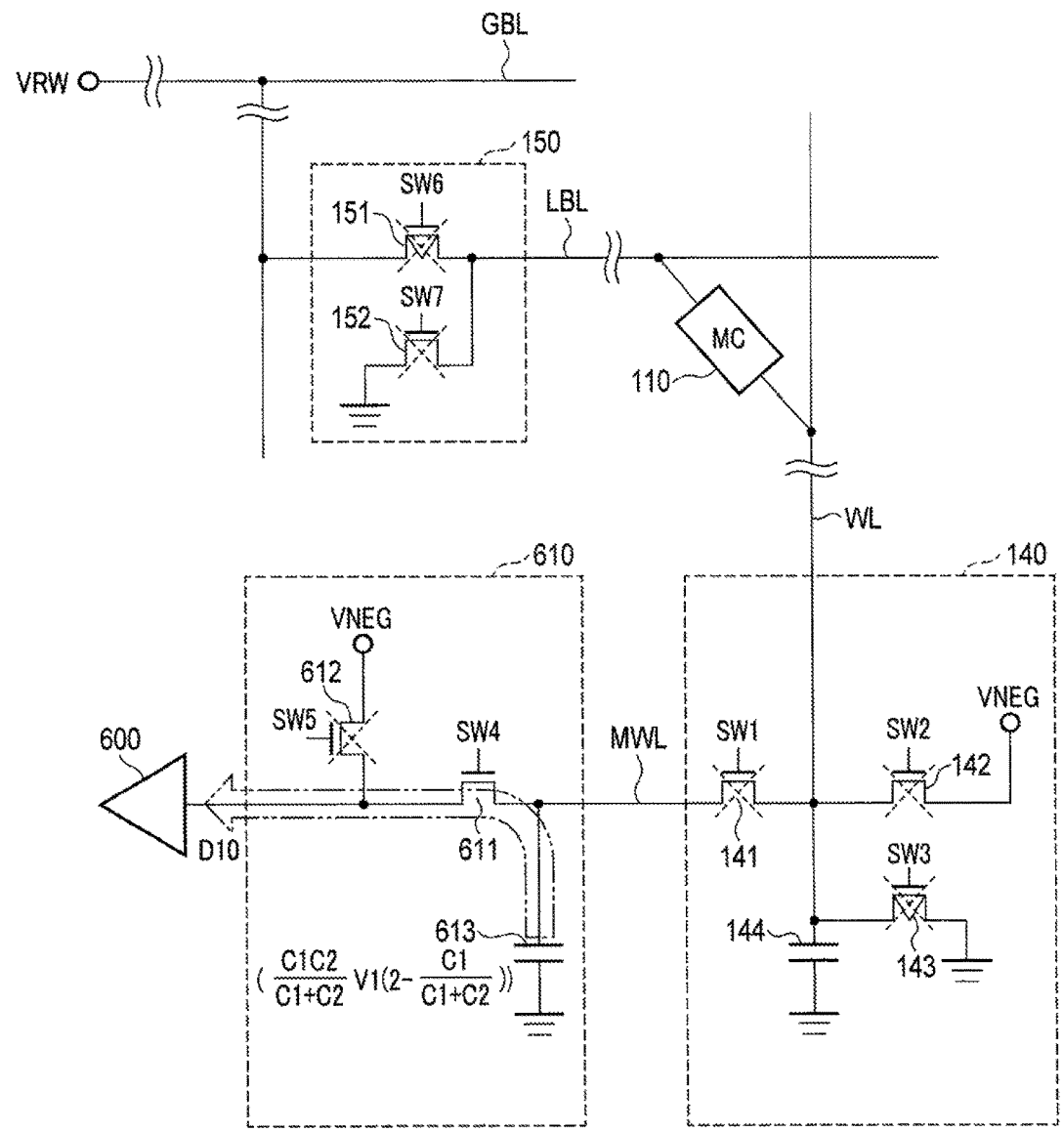
FIG. 50 is a circuit diagram showing the operation at time T28 relating to the selected memory cell MC.

The operation at time T28 relating to the selected memory cell MC will be described with reference to FIG. 50. FIG. 50 is a circuit diagram showing the operation at time T28 relating to the selected memory cell MC. Like FIG. 44, FIG. 50 shows only extracted structures relating to the selected memory cell MC.

As shown in FIG. 50, transistor 611 of the selected voltage transfer circuit 610 is turned on. Therefore, the charge held in capacitor 613 is transferred to the sense amplifier circuit 600 (see arrow D10).

The sense amplifier circuit 600 can thereby determine the resistance state of the memory cell MC based on the charge (C1×C2/(C1+C2)×V1)×(2−C1/(C1+C2)).

<4-2-2-2> Details of Read Operation Relating to Non-Selected Memory Cell

Details of the read operation relating to the non-selected memory cell MC will be described with reference to FIG. 43.

The sequencer 50 maintains the word line (non-selected word line) WL relating to the non-selected memory cell MC at reference voltage VSS. Specifically, the sequencer 50 brings signals SW1, SW2, and SW3 for the row control circuit (non-selected row control circuit) 140 coupled to the non-selected word line WL to the "L" level. The sequencer 50 also brings signals SW4 and SW5 for the voltage transfer circuit (non-selected voltage transfer circuit) 610 relating to the main word line (non-selected main word line) MWL coupled to the non-selected row control circuit 140 to the "L" level. The sequencer 50 also brings signals SW6 and SW7 for the column control circuit (non-selected column control circuit) 150 coupled to the local bit line (non-selected local bit line) LBL relating to the non-selected memory cell MC to the "H" level.

Accordingly, a voltage difference is not created between both ends of the non-selected memory cell MC in the read operation; therefore, the cell current does not flow in the non-selected memory cell MC.

<4-2-2-3> Details of Read Operation Relating to Semi-Selected Memory Cell

As mentioned above, there are two types of semi-selected memory cell MC.

<4-2-2-3-1> First Semi-Selected Memory Cell

Next, details of the read operation relating to the first semi-selected memory cell MC will be described.

As described above, the first semi-selected memory cell MC is a memory cell MC coupled to a selected word line WL and a non-selected local bit line LBL.

Therefore, in the first semi-selected memory cell MC, the voltage of the local bit line LBL is maintained at reference voltage VSS, but the word line WL is supplied with negative voltage VNEG during the read operation. The cell current flowing in the first semi-selected memory cell MC is the same as that described with reference to FIG. 22.

<4-2-2-3-2> Second Semi-Selected Memory Cell

Next, details of the read operation relating to the second semi-selected memory cell MC will be described.

As described above, the second semi-selected memory cell MC is a memory cell MC coupled to a non-selected word line WL and a selected local bit line LBL.

Therefore, in the second semi-selected memory cell MC, the local bit line LBL is supplied with voltage VRW, but the word line WL is maintained at reference voltage VSS during the read operation.

The cell current flowing in the second semi-selected memory cell MC is the same as that described with reference to FIG. 23.

As described above, the semiconductor memory device according to the fourth embodiment can convert the resistance state of the selected memory cell MC into a charge. Based on the charge, the sense amplifier circuit 600 can determine data stored in the selected memory cell MC.

<4-3> Advantage

According to the above-described embodiment, the semiconductor memory device performs two cell current Icell reads in one read operation as in the first embodiment. The third embodiment differs from the first embodiment in that the word line, not the bit line, is coupled to the sense amplifier. Even in such a case, the same advantage as that of the first embodiment can be gained.

<4-4> Modification 1 of Fourth Embodiment

Next, Modification 1 of the fourth embodiment will be described.

<4-4-1> Read Operation

The read operation of the semiconductor memory device according to Modification 1 of the fourth embodiment will be described below.

<4-4-1-1> Outline

The outline of the read operation of the semiconductor memory device according to Modification 1 of the fourth embodiment will be described with reference to FIG. 51. FIG. 51 is a flowchart showing the read operation of the semiconductor memory device according to Modification 1 of the fourth embodiment.

[Step S5001]

In step S5001, the sequencer 50 performs the same operation as that of step S4001.

[Step S5002]

After step S5001, the sequencer 50 charges the local bit line coupled to the selected memory cell MC. The pre-charge of step S5001 and the charge on the selected local bit line bring the voltage applied to the selected memory cell MC to voltage VREAD. Then, the cell current following in the selected memory cell MC is read at the row control circuit 140 (first read). Specifically, the cell current read result is charged into the capacitor 144 of the row control circuit 140 as the charge.

[Step S5003]

After step S5002, the sequencer 50 shares the charge charged into the capacitor 144 of the row control circuit 140 with the capacitor 613 of the voltage transfer circuit 610 before the characteristic of the selected memory cell MC changes from the second characteristic to the first characteristic.

Accordingly, the charge charged into the capacitor 144 of the row control circuit 140 decreases. As a result, the voltage applied to the selected memory cell MC is raised, and the charge based on the cell current is accumulated in the capacitor 613 of the voltage transfer circuit 610. By performing a charge share during the cell current read operation as described above, the charge charged into capacitor 613 can be increased.

[Step S5004]

After step S5003, the sequencer 50 transfers the charge charged into capacitor 613 to the sense amplifier circuit 600. The sense amplifier circuit 600 can thereby determine the resistance state of the memory cell. As a result, the sense amplifier circuit 600 can read data stored in the memory cell.

Details of the read operation will be described below.

<4-4-1-2> Details of Read Operation

Details of the read operation of the semiconductor memory device according to Modification 1 of the fourth embodiment will be described below.

Hereinafter, details of the read operation will be described for each of the selected memory cell, non-selected memory cell, and semi-selected memory cell.

<4-4-1-2-1> Details of Operation Relating to Selected Memory Cell

Figure 52:
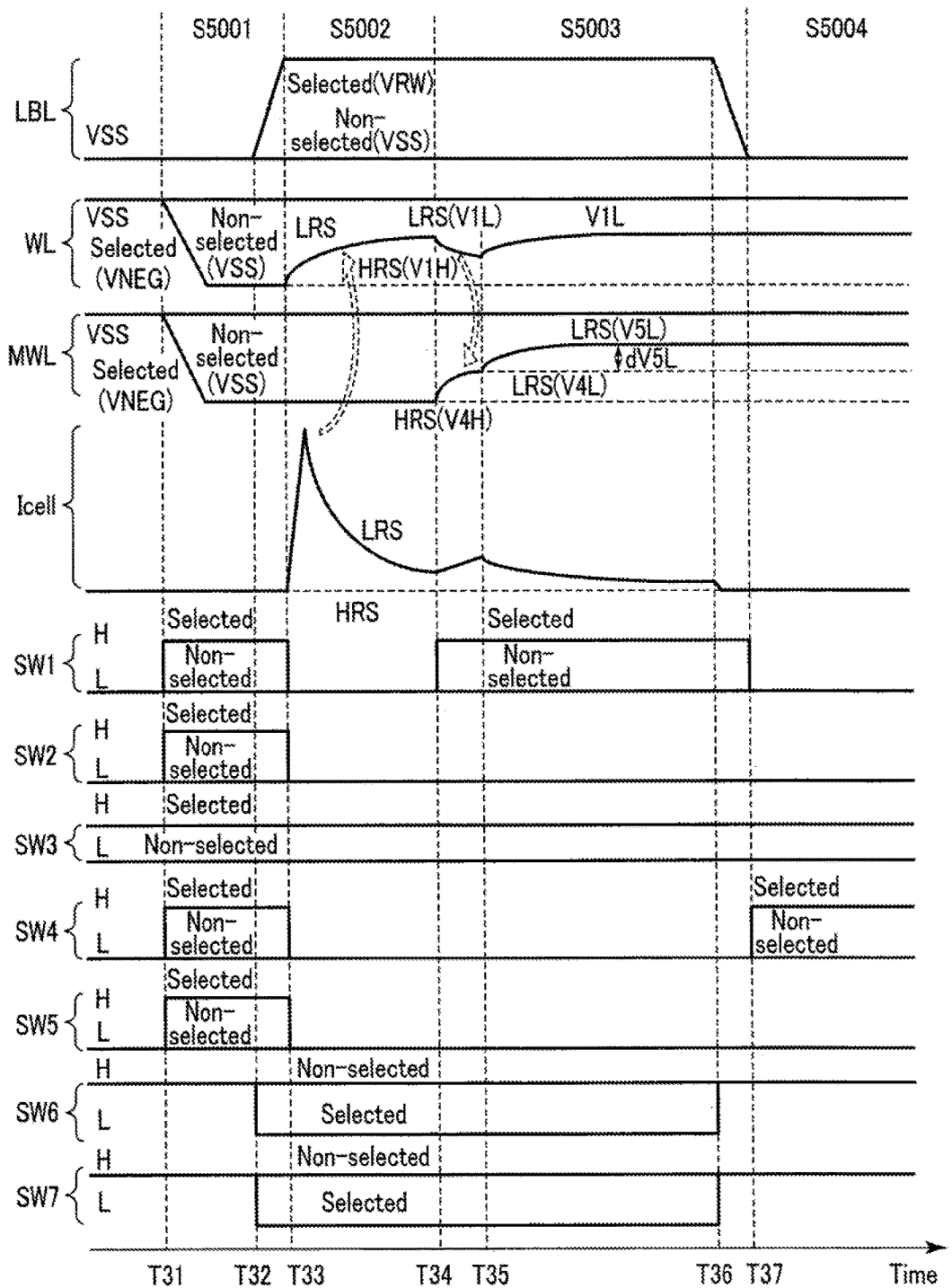
FIG. 52 is a timing chart showing the read operation of the semiconductor memory device according to Modification 1 of the fourth embodiment.

First, details of the operation relating to the selected memory cell MC will be described with reference to FIG. 52. FIG. 52 is a timing chart showing the read operation of the semiconductor memory device according to Modification 1 of the fourth embodiment.

[Time T31 to Time T33] (Corresponding to Step S5001)

The operation from time T31 to time T33 is the same as the operation from time T21 to time T23 described with reference to FIG. 43.

[Time T33 to Time T34] (Corresponding to Step S5002)

The operation from time T33 to time T34 relating to the selected memory cell MC will be described.

The sequencer 50 stops pre-charging the selected word line WL, and applies the read voltage to the memory cell MC. Specifically, the sequencer 50 lowers signals SW1 and SW2 for the selected row control circuit 140 from the "H" level to the "L" level. The sequencer 50 also lowers signals SW4 and SW5 for the selected voltage transfer circuit 610 from the "H" level to the "L" level. Consequently, voltage supply to the selected word line WL is stopped, and the read voltage is applied to the memory cell MC.

The cell current flowing in the selected memory cell MC from time T33 to time T34 is the same as that described with reference to FIGS. 28 to 30.

[Time T34 to Time T37] (Corresponding to Step S5003)

Referring back to FIG. 52, the operation from time T34 to time T37 relating to the selected memory cell MC will be described.

The sequencer 50 shares the charge stored in the capacitor 144 of the selected row control circuit 140 with the capacitor 613 of the selected voltage transfer circuit 610 during the cell current read and before the characteristic of the selected memory cell MC changes from the second characteristic to the first characteristic. Specifically, the sequencer 50 brings signal SW1 for the selected row control circuit 140 to the "H" level. Therefore, transistor 141 of the selected row control circuit 140 is turned on. The selected word line WL and main word line MWL are thereby electrically coupled to each other. As a result, the charge charged into capacitor 144 is shared with capacitor 613 via transistor 141. When the selected memory cell is in the low resistance state, the voltage of the selected main word line MWL is raised from voltage VNEG to voltage V4L. When the selected memory cell is in the high resistance state, the voltage of the selected main word line MWL is raised from voltage VNEG to voltage V4H.

The sequencer 50 according to the present embodiment shares the charge charged into capacitor 144 with capacitor

613 before the characteristic of the selected memory cell MC changes from the second characteristic to the first characteristic. As the charge charged into capacitor 144 is shared with capacitor 613, the voltage of the selected word line WL is lowered. Consequently, the difference between the voltage of the selected word line WL and the voltage of the selected local bit line LBL increases, and the voltage applied to the selected memory cell MC is raised. The cell current flowing in the selected memory cell MC in the low resistance state changes in accordance with the second characteristic as indicated by arrow C6 in FIG. 31, and the cell current flowing in the selected memory cell MC in the high resistance state changes in accordance with the third characteristic as indicated by arrow C7 in FIG. 31.

When the voltages of the selected word line WL and main word line MWL of the selected memory cell MC in the low resistance state are raised respectively to voltage V1L and voltage V5L (V5L=V4L+dV5L) from time T35 to time T36 in FIG. 52, the cell current of the selected memory cell MC in the low resistance state decreases in accordance with the second characteristic as shown in FIG. 30 (see arrow C4). The voltages of the selected word line WL and main word line MWL of the selected memory cell MC in the high resistance state are also raised respectively to voltage V1H and voltage V5H.

At time T36 in FIG. 52, the sequencer 50 raises the level of signal SW6 for the selected column control circuit 150 from the "L" level to the "H" level. The sequencer 50 raises the level of signal SW7 for the selected column control circuit 150 from the "L" level to the "H" level. Accordingly, transistor 151 of the selected column control circuit 150 is turned off, and transistor 152 thereof is turned on. Therefore, the electric potential of the selected local bit line LBL is brought to reference voltage VSS. As a result, the voltage applied to the selected memory cell MC is significantly lowered. Consequently, as shown in FIG. 32, the characteristic of the selected memory cell MC in the low resistance state changes from the second characteristic to the first characteristic (see arrow C8). Therefore, the cell current flowing in the selected memory cell MC significantly decreases.

[After Time T37] (Corresponding to Step S5004)

The operation after time T37 relating to the selected memory cell MC will be described.

The sequencer 50 transfers the charge held in capacitor 613 to the sense amplifier circuit 600. Specifically, the sequencer 50 lowers the level of signal SW1 for the selected row control circuit 140 from the "H" level to the "L" level. The sequencer 50 raises the level of signal SW4 for the selected voltage transfer circuit 610 from the "L" level to the "H" level. Transistor 611 of the selected voltage transfer circuit 610 is thereby turned on. Therefore, the charge held in capacitor 613 is transferred to the sense amplifier circuit 600.

The sense amplifier circuit 600 can thereby determine the resistance state of the selected memory cell MC based on the charge.

<4-4-1-2-2> Operations Relating to Non-Selected Memory Cell and Semi-Selected Memory Cell The cell current does not flow in the non-selected memory cell MC as a voltage difference is not created between both ends of the non-selected memory cell MC in the read operation for the same reason as the principle described in the first embodiment.

The cell current flowing in the semi-selected memory cell MC is very small and does not influence the read operation as the voltage applied to the semi-selected memory cell MC is set not to exceed voltage VLRS in the read operation for the same reason as the principle described in the first embodiment.

As described above, the semiconductor memory device according to Modification 1 of the fourth embodiment can convert the resistance state of the selected memory cell MC into a charge. Based on the charge, the sense amplifier circuit 600 can determine data stored in the selected memory cell MC.

<4-4-2> Advantage

According to the above-described embodiment, the semiconductor memory device couples the selected local bit line LBL to the selected global bit line GBL during the cell current Icell read and before the characteristic of the selected memory cell MC changes from the second characteristic to the first characteristic. Modification 1 of the fourth embodiment differs from the second embodiment in that the word line, not the bit line, is coupled to the sense amplifier. Even in such a case, the same advantage as that of the second embodiment can be gained.

<4-5> Modification 2 of Fourth Embodiment

Next, Modification 2 of the fourth embodiment will be described. In Modification 2 of the fourth embodiment, the case where a negative voltage is applied to the word line and a positive voltage is applied to the local bit line in the read operation will be described.

<4-5-1> Configuration

In the read operation of Modification 2 of the fourth embodiment, the sequencer 50 applies a negative voltage to the local bit line LBL. In addition, the sequencer 50 applies a positive voltage to the word line WL in the read operation. Hereinafter, a column switch circuit, a voltage transfer circuit, and a row switch circuit which enable the sequencer 50 to realize such operations will be described.

<4-5-1-1> Row Switch Circuit and Voltage Transfer Circuit

The row switch circuit and voltage transfer circuit of the semiconductor memory device according to Modification 2 of the fourth embodiment will be described with reference to FIG. 53. FIG. 53 is a circuit diagram showing the row switch circuit and voltage transfer circuit of the semiconductor memory device according to Modification 2 of the fourth embodiment.

As shown in FIG. 53, the row switch circuit 14 includes a row control circuit 140 for each word line WL.

The row control circuit 140 includes a PMOS transistor 147 that controls coupling between a main word line MWL and a word line WL, a PMOS transistor 145 that transfers positive voltage VPOS to the word line WL, an NMOS transistor 146 that transfers reference voltage VSS (VSS<VPOS) to the word line WL, and a capacitor 144 that accumulates the charge of the word line WL.

Transistor 147 is turned on based on "L"-level signal SW1 to control coupling between the main word line MWL and the word line WL.

Transistor 145 is turned on based on "L"-level signal SW2 to transfer positive voltage VPOS to the word line WL.

Transistor 146 is turned on based on "H"-level signal SW3 to transfer reference voltage VSS to the word line WL.

As shown in FIG. 53, the voltage transfer circuit 610 includes a PMOS transistor 615 that controls coupling between the main word line MWL and the sense amplifier circuit 600, a PMOS transistor 614 that transfers positive voltage VPOS to the main word line MWL, and a capacitor 613 that accumulates the charge of the main word line MWL.

Transistor 615 is turned on based on "L"-level signal SW4 to control coupling between the main word line MWL and the sense amplifier circuit 600.

Transistor 614 is turned on based on "L"-level signal SW5 to transfer voltage VPOS to the main word line MWL.

<4-5-1-2> Column Switch Circuit

The column switch circuit of the semiconductor memory device according to Modification 2 of the fourth embodiment will be described with reference to FIG. 54. FIG. 54 is a circuit diagram showing the column switch circuit of the semiconductor memory device according to Modification 2 of the fourth embodiment.

As shown in FIG. 54, the column switch circuit 15 includes a column control circuit 150 for each local bit line LBL.

The column control circuit 150 includes an NMOS transistor 151 that controls coupling between a global bit line GBL and a local bit line LBL, and a PMOS transistor 153 that transfers reference voltage VSS to the local bit line LBL.

Transistor 153 is turned on based on "L"-level signal SW7 to transfer reference voltage VSS to the local bit line LBL.

<4-5-2> Read Operation

Figure 55:
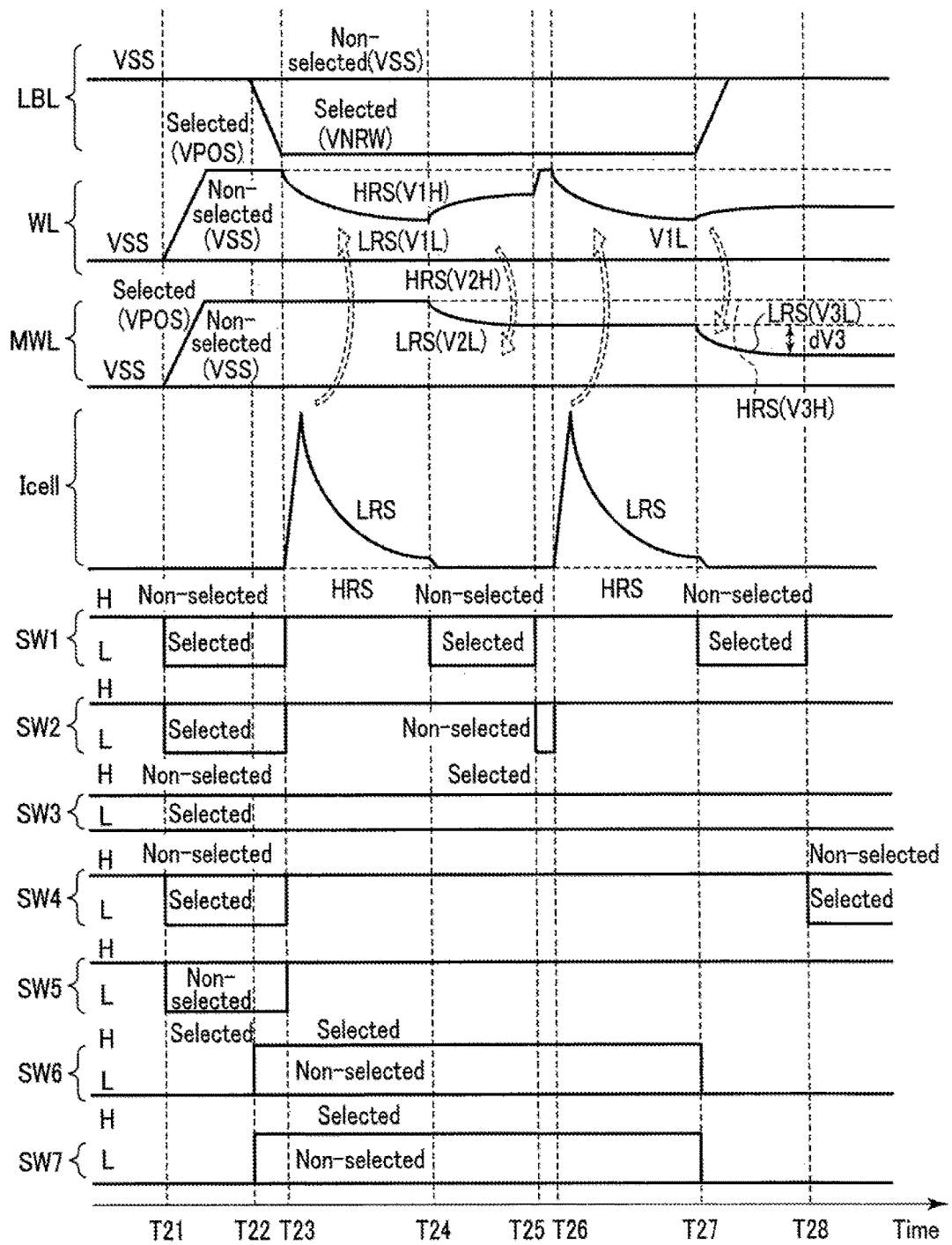
FIG. 55 is a timing chart showing the read operation of the semiconductor memory device according to Modification 2 of the fourth embodiment.

The read operation of the semiconductor memory device according to Modification 2 of the fourth embodiment will be described with reference to FIG. 55. FIG. 55 is a timing chart showing the read operation of the semiconductor memory device according to Modification 2 of the fourth embodiment.

The outline of the read operation of the semiconductor memory device according to Modification 2 of the fourth embodiment is the same as the one described with reference to FIG. 42. The read operation of the semiconductor memory device according to Modification 2 of the fourth embodiment differs from that according to the fourth embodiment in that the voltages of the selected main word line MWL, selected word line WL, and selected local bit line, and the levels of signals SW1 to SW7 are inverted.

Specifically, the sequencer 50 can supply positive voltage VPOS (such as a voltage obtained by inverting the sign of negative voltage VNEG) to the selected word line WL and selected main word line MWL by inverting the levels of signals SW2, SW3, and SW5 of the fourth embodiment, as shown in FIG. 55. The sequencer 50 can also supply negative voltage VNRW (such as a voltage obtained by inverting the sign of positive voltage VRW) to the selected local bit line LBL by inverting the level of signal SW7 of the fourth embodiment.

<4-5-3> Advantage

According to the above-described embodiment, the semiconductor memory device performs two cell current Icell reads in one read operation as in the fourth embodiment. Modification 2 of the fourth embodiment differs from the fourth embodiment in that a negative voltage is applied to the local bit line, and a positive voltage is applied to the word line in the read operation. Even in such a case, the same advantage as that of the fourth embodiment can be gained.

<4-6> Modification 3 of Fourth Embodiment

Next, Modification 3 of the fourth embodiment will be described.

<4-6-1> Read Operation

Figure 56:
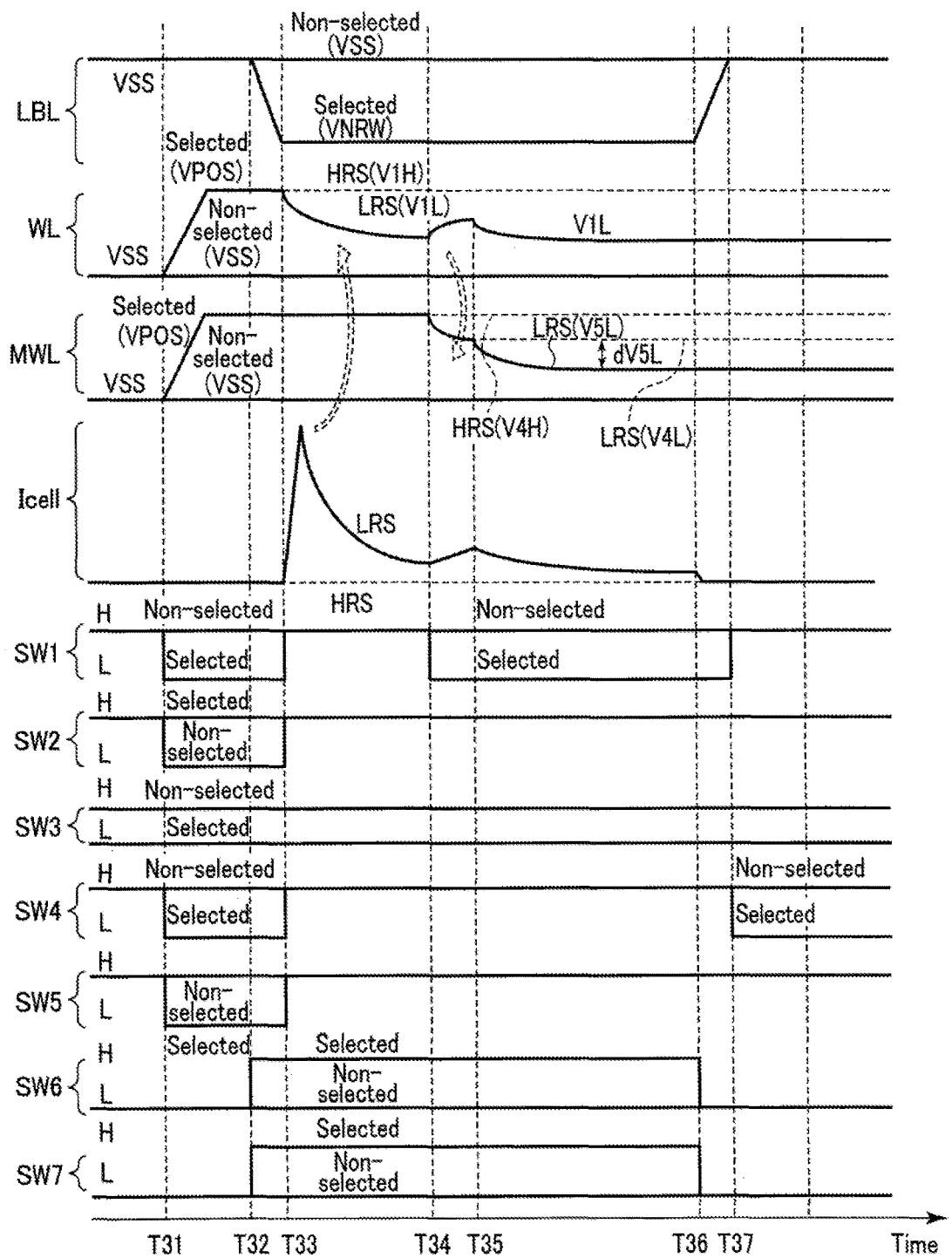
FIG. 56 is a timing chart showing the read operation of the semiconductor memory device according to Modification 3 of the fourth embodiment.

The read operation of the semiconductor memory device according to Modification 3 of the fourth embodiment will be described with reference to FIG. 56. FIG. 56 is a timing chart showing the read operation of the semiconductor memory device according to Modification 3 of the fourth embodiment.

The outline of the read operation of the semiconductor memory device according to Modification 3 of the fourth embodiment is the same as the one described with reference to FIG. 52. The read operation of the semiconductor memory device according to Modification 3 of the fourth embodiment differs from that according to Modification 1 of the fourth embodiment in that the voltages of the selected main word line MWL, selected word line WL, and selected local bit line LBL, and the levels of signals SW2, SW3, SW5, and SW7 are inverted.

Specifically, the sequencer 50 can supply positive voltage VPOS (such as a voltage obtained by inverting the sign of negative voltage VNEG) to the selected word line WL and selected main word line MWL by inverting the levels of signals SW2, SW3, and SW5, as shown in FIG. 56. The sequencer 50 can also supply negative voltage VNRW (such as a voltage obtained by inverting the sign of positive voltage VRW) to the selected local bit line LBL by inverting the level of signal SW7.

<4-6-2> Advantage

According to the above-described embodiment, the semiconductor memory device couples the selected main word line MWL to the selected word line WL during the cell current Icell read and before the characteristic of the selected memory cell MC changes from the second characteristic to the first characteristic. Modification 3 of the fourth embodiment differs from Modification 1 of the fourth embodiment in that a negative voltage is applied to the local bit line LBL, and a positive voltage is applied to the word line WL in the read operation. Even in such a case, the same advantage as that of Modification 1 of the fourth embodiment can be gained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a resistance change type memory cell;
   a first charge section into which a charge based on a current flowing in the memory cell is charged;
   a second charge section coupled to the first charge section via a switch element;
   a sense amplifier configured to determine data stored in the memory cell based on the charge charged into the second charge section; and
   a control circuit configured to control the first charge section, the second charge section, and the sense amplifier, wherein
   in a read operation, the control circuit
   charges a first charge based on a current flowing in the memory cell into the first charge section,
   turns on the switch element to share a second charge based on the first charge with the second charge section,
   charges a third charge based on a current flowing in the memory cell into the first charge section, turns on the switch element to share a fourth charge based on the second charge and the third charge with the second charge section, and supplies the fourth charge to the sense amplifier to determine data stored in the memory cell.

2. The semiconductor memory device according to claim 1, further comprising:
a first line coupled to a first end of the memory cell and the first charge section; and
a second line coupled to a second end of the memory cell, wherein
in the read operation, the control circuit
charges the first line, and
charges the second line after charging the first line, so as to supply a current to the memory cell.

3. The semiconductor memory device according to claim 2, wherein
in the read operation, the control circuit
charges the first line to a first voltage,
charges the second line to a second voltage higher than the first voltage after charging the first line, so as to supply a current to the memory cell.

4. The semiconductor memory device according to claim 3, wherein the fourth charge is larger than the second charge.

5. The semiconductor memory device according to claim 2, wherein
in the read operation, the control circuit
charges the first line to a third voltage, and
charges the second line to a fourth voltage higher than the third voltage after charging the first line, so as to supply a current to the memory cell.

6. The semiconductor memory device according to claim 5, wherein the fourth charge is smaller than the second charge.

7. The semiconductor memory device according to claim 2, wherein
in the read operation, the control circuit
charges the first line before charging the third charge based on a current flowing in the memory cell into the first charge section, and
stops charging the first line to supply a current to the memory cell and charge the third charge.

8. The semiconductor memory device according to claim 7, wherein
in the read operation, the control circuit
charges the first line to the first voltage before charging the third charge based on a current flowing in the memory cell into the first charge section.

9. The semiconductor memory device according to claim 7, wherein
in the read operation, the control circuit
charges the first line to the third voltage before charging the third charge based on a current flowing in the memory cell into the first charge section.

10. The semiconductor memory device according to claim 1, wherein the first line is a bit line, and the second line is a word line.

11. The semiconductor memory device according to claim 1, wherein the first line is a word line, and the second line is a bit line.

12. A semiconductor memory device, comprising:
a resistance change type memory cell;
a first charge section into which a charge based on a current flowing in the memory cell is charged;
a second charge section coupled to the first charge section via a switch element;
a sense amplifier configured to determine data stored in the memory cell based on a charge charged into the second charge section; and
a control circuit configured to control the first charge section, the second charge section, and the sense amplifier, wherein
in a read operation, the control circuit
charges a charge into the first charge section based on a current flowing in the memory cell,
turns on the switch element before completion of charging of a first charge based on a current flowing in the memory cell into the first charge section, so as to share a second charge with the second charge section, and
after the second charge is shared with the second charge section,
supplies the shared second charge to the sense amplifier to determine data stored in the memory cell.

13. The semiconductor memory device according to claim 12, further comprising:
a first line coupled to a first end of the memory cell and the first charge section; and
a second line coupled to a second end of the memory cell, wherein
in the read operation, the control circuit
charges the first line, and
charges the second line after charging the first line, so as to supply a current to the memory cell.

14. The semiconductor memory device according to claim 13, wherein
in the read operation, the control circuit
charges the first line to a fifth voltage,
charges the second line to a sixth voltage higher than the fifth voltage after charging the first line, so as to supply a current to the memory cell.

15. The semiconductor memory device according to claim 13, wherein
in the read operation, the control circuit
charges the first line to a seventh voltage, and
charges the second line to an eighth voltage higher than the fifth voltage after charging the first line, so as to supply a current to the memory cell.

16. The semiconductor memory device according to claim 12, wherein the first line is a bit line, and the second line is a word line.

17. The semiconductor memory device according to claim 12, wherein the first line is a word line, and the second line is a bit line.

* * * * *